US008633487B2

(12) United States Patent
Yamamoto

(10) Patent No.: US 8,633,487 B2
(45) Date of Patent: Jan. 21, 2014

(54) TRANSISTOR STRUCTURE, MANUFACTURING METHOD OF TRANSISTOR STRUCTURE, AND LIGHT EMITTING APPARATUS

(75) Inventor: Kazuto Yamamoto, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 13/232,119

(22) Filed: Sep. 14, 2011

(65) Prior Publication Data
US 2012/0061675 A1    Mar. 15, 2012

(30) Foreign Application Priority Data

Sep. 14, 2010  (JP) .................................. 2010-205016
Sep. 14, 2010  (JP) .................................. 2010-205024

(51) Int. Cl.
H01L 29/04  (2006.01)

(52) U.S. Cl.
USPC ..................................... 257/59; 257/E21.412

(58) Field of Classification Search
USPC ....................... 257/59–74, E21.412
See application file for complete search history.

(56) References Cited

U.S. PATENT DOCUMENTS

| 7,352,005 B2* | 4/2008 | Yamasaki ........................ 257/59 |
| 7,824,952 B2 | 11/2010 | Choi et al. |
| 2004/0115857 A1* | 6/2004 | Possin et al. .................... 438/57 |
| 2007/0120143 A1 | 5/2007 | Huh et al. |
| 2008/0116457 A1* | 5/2008 | Park et al. ........................ 257/59 |
| 2009/0002590 A1 | 1/2009 | Kimura |
| 2009/0039351 A1* | 2/2009 | Kobayashi et al. ............. 257/59 |
| 2010/0019996 A1 | 1/2010 | You et al. |
| 2010/0133541 A1 | 6/2010 | Uchida et al. |
| 2010/0193785 A1 | 8/2010 | Kimura |
| 2012/0007093 A1 | 1/2012 | Yamamoto |

FOREIGN PATENT DOCUMENTS

| JP | 09-90403 A | 4/1997 |
| JP | 2005-301286 A | 10/2005 |
| JP | 2007-256926 A | 10/2007 |
| JP | 2009-033145 A | 2/2009 |
| JP | 2009-212219 A | 9/2009 |
| JP | 2010-135384 A | 6/2010 |

OTHER PUBLICATIONS

Japanese Office Action dated Jul. 24, 2012 (and English translation thereof) in counterpart Japanese Application No. 2010-205016.
Japanese Office Action dated Jul. 24, 2012 (and English translation thereof) in counterpart Japanese Application No. 2010-205024.
Related U.S. Appl. No. 13/179,015, filed Jul. 8, 2011.

* cited by examiner

*Primary Examiner* — Matthew W Such
*Assistant Examiner* — Ali Naraghi
(74) *Attorney, Agent, or Firm* — Holtz, Holtz, Goodman & Chick, PC

(57) ABSTRACT

Disclosed is a transistor structure including: a first thin film transistor including, a first gate electrode; a first insulating film; a first semiconductor film; and a first light blocking film, and a second thin film transistor including, a second semiconductor film; the second insulating film; a second gate electrode; and a second light blocking film, wherein the first semiconductor film and the second semiconductor film include a first region and a second region along a thickness direction from the first insulating film side; and degree of crystallization of silicon of one of the first region or the second region is higher than the degree of crystallization of silicon of the other of the first region or the second region.

15 Claims, 62 Drawing Sheets

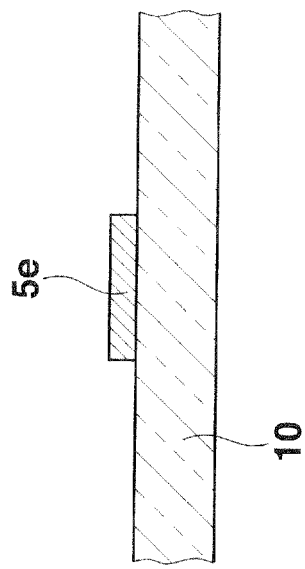
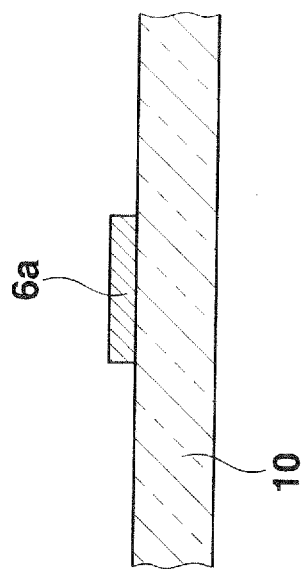

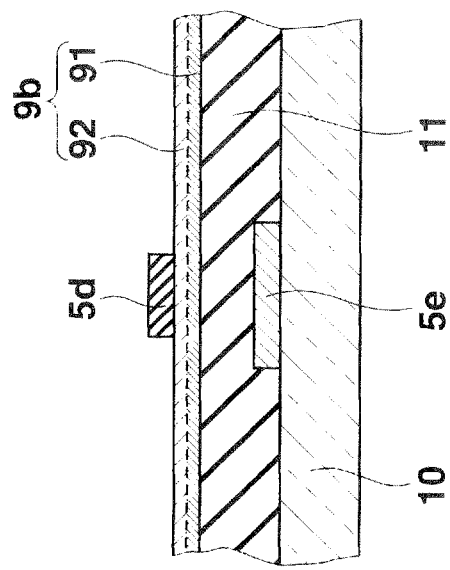
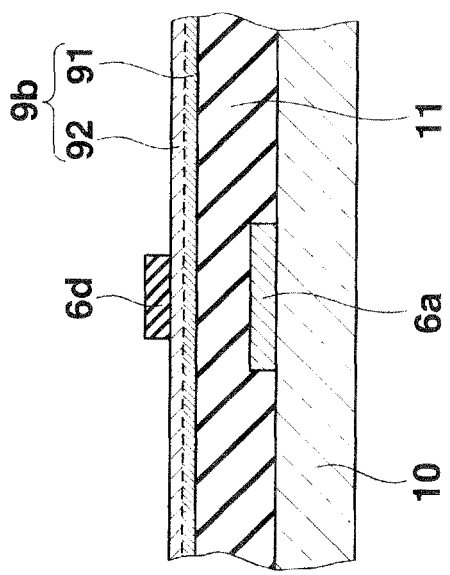

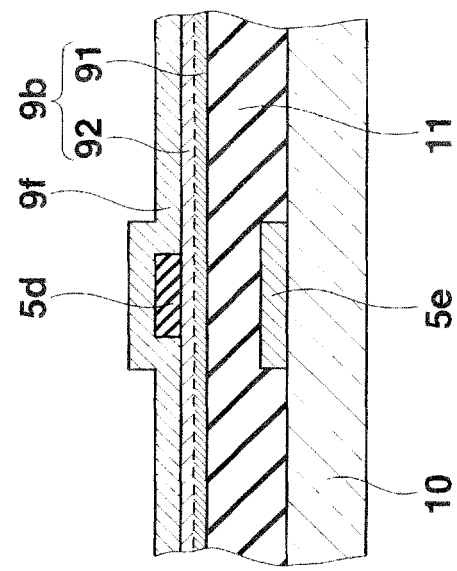
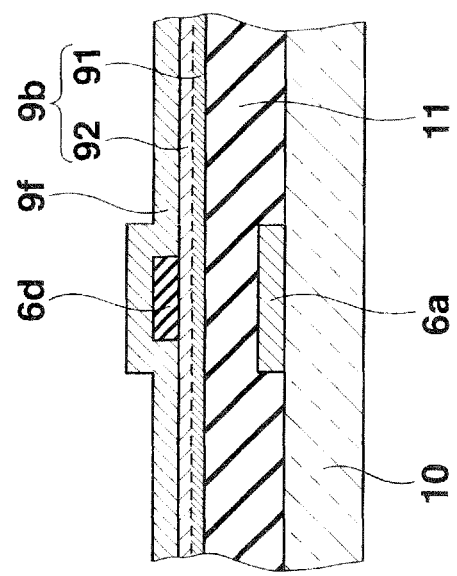
FIG.10A
FIG.10B

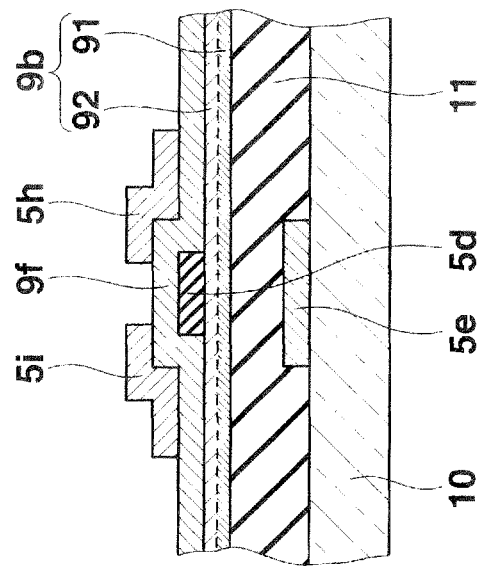
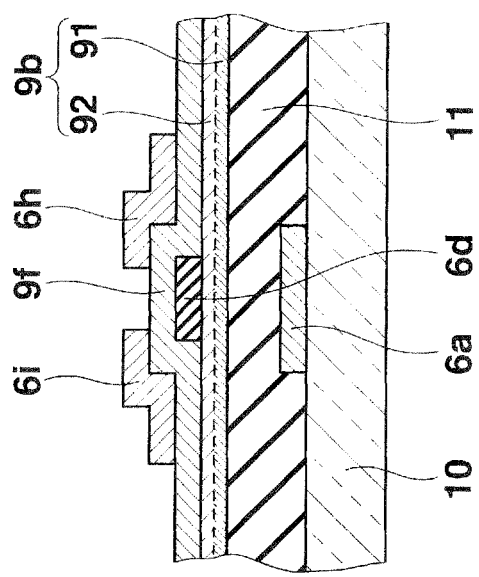
FIG. 12B
FIG. 12A

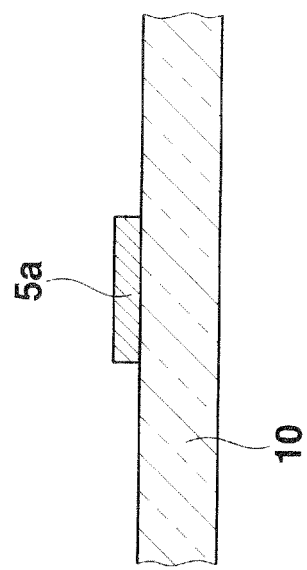
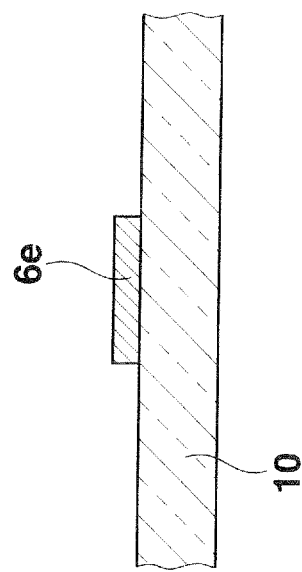
FIG. 21A
FIG. 21B

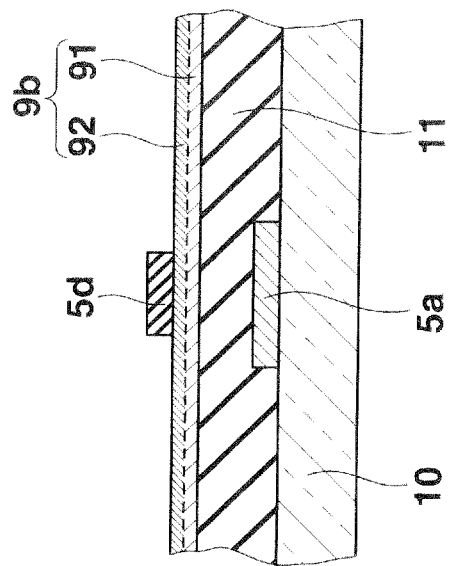
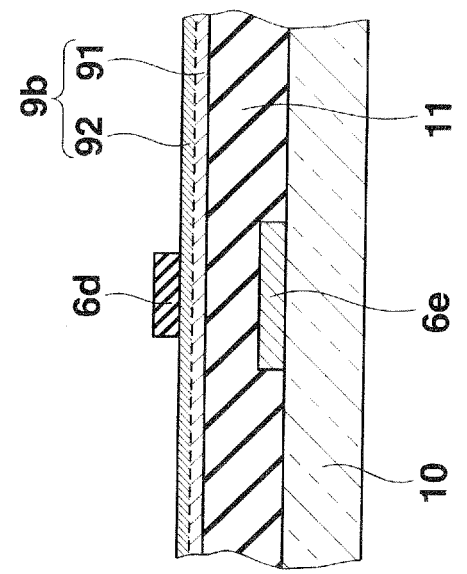

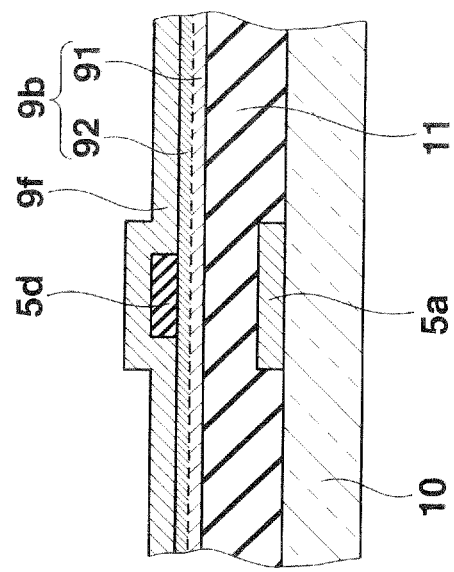
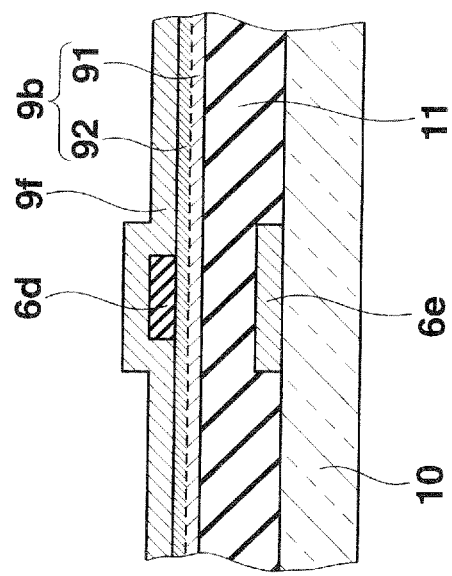

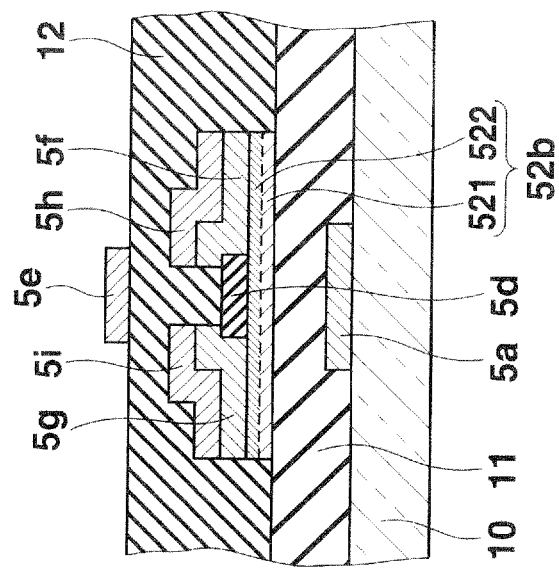
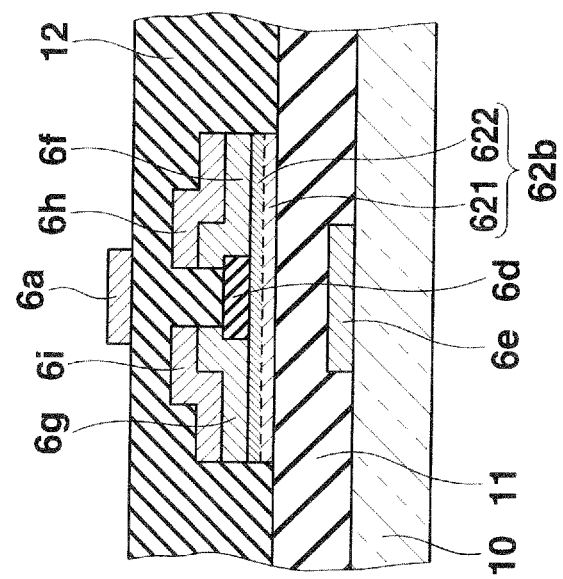
FIG.30B
FIG.30A

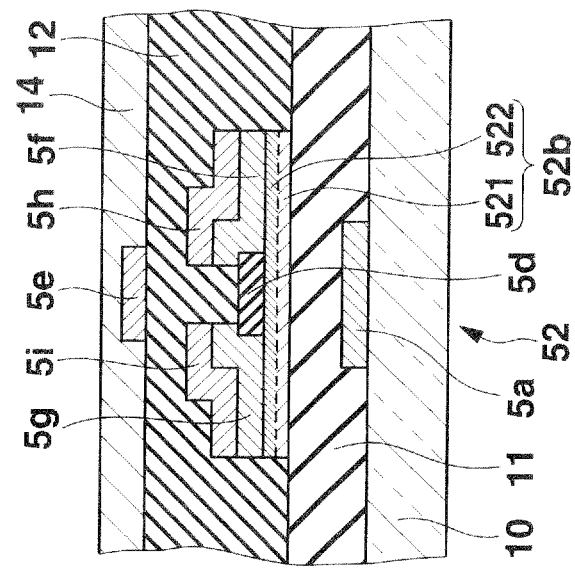
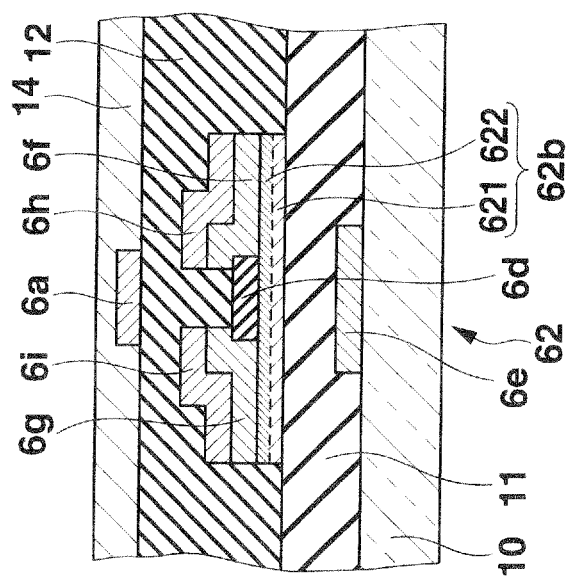
FIG.31B
FIG.31A

TRANSISTOR STRUCTURE, MANUFACTURING METHOD OF TRANSISTOR STRUCTURE, AND LIGHT EMITTING APPARATUS

CROSS-REFERENCE TO RELATED APPLICATIONS

This application is based upon and claims the benefit of priority from the prior Japanese Patent Application No. 2010-205016, filed Sep. 14, 2010, No. 2010-205024, filed Sep. 14, 2010, the entire contents of all of which are incorporated herein by reference.

BACKGROUND OF THE INVENTION

1. Field of the Invention

The present invention relates to a transistor structure, a manufacturing method of a transistor structure and a light emitting apparatus. Specifically, the present invention relates to a transistor structure, a manufacturing method of a transistor structure and a light emitting apparatus regarding a plurality of thin film transistors which control emission of light of light emitting elements which emit light according to a supplied electric current 2. Description of the Related Art Conventionally, there is known an Electro Luminescent (EL) light emitting display apparatus using an EL element. In the EL light emitting display apparatus, each pixel includes an EL element, and since the EL light emitting display apparatus is driven by an active matrix circuit, a thin film transistor to control the electric current supplied to each EL element is provided in each pixel.

The EL light emitting display apparatus of the active matrix format includes, for example, a switch transistor connected to a signal line (data line) which controls a data signal and a driving transistor which flows electric current to the EL element according to the data signal transmitted from the switch transistor.

It is required that the switch transistor and the driving transistor each have different characteristics so that the EL light emitting display apparatus realizes better light emitting display characteristics.

For example, Japanese Patent Application Laid-Open Publication No. 2007-256926 discloses a technique of a light emitting display apparatus in which a thin film transistor provided with a semiconductor film including crystalline silicon functions as a driving transistor and a thin film transistor provided with a semiconductor film including amorphous silicon functions as a switch transistor.

However, according to the above conventional technique, since either one thin film transistor between the driving transistor and the switch transistor is formed and then the other thin film transistor is formed, film forming of an insulating film, semiconductor film and metallic film and patterning of the formed film is repeated for each thin film transistor in order to form each thin file transistor. Therefore, since each step for each thin film transistor is repeated, about twice as many steps than the normal process is necessary, and there is a problem that the increase in the number of steps results in an increase of manufacturing cost.

Moreover, when light emitted from the EL element, light from outside or the like transmit the insulating film or the bank or reflect on the metallic film and reach the semiconductor film of the thin film transistor, a leak electric current, etc. occurs in the thin film transistor, and with this, for example the characteristic of the thin film transistor composing the switch transistor or the driving transistor may change. Therefore, it is preferable, that such light does not reach the semiconductor film of the thin film transistor.

BRIEF SUMMARY OF THE INVENTION

The present invention has been made in consideration of the above situation, and one of the main objects is to provide a transistor structure, a manufacturing method of a transistor structure and a light emitting apparatus in which a plurality of thin film transistors can be efficiently formed in a different configuration thin film transistors in different forms can be efficiently made and in which change of characteristic of each transistor by light emitted from a light emitting element and light from outside can be suppressed.

In order to achieve any one of the above advantages, according to an aspect of the present invention, there is provided a transistor structure including:

a first thin film transistor including,
a first gate electrode;
a first insulating film which covers the first gate electrode;
a first semiconductor film which is provided in a position on the first insulating film corresponding to the first gate electrode;
a second insulating film which covers the first semiconductor film; and
a first light blocking film which is provided in a position on the second insulating film corresponding to the first semiconductor film, and
a second thin film transistor including,
a second semiconductor film which is provided on the first insulating film;
the second insulating film which covers the second semiconductor film;
a second gate electrode which is provided in a position on the second insulating film corresponding to the second semiconductor film; and
a second light blocking film which is provided in a position below the first insulating film corresponding to the second semiconductor film,
wherein the first semiconductor film and the second semiconductor film include a first region and a second region along a thickness direction from the first insulating film side, and degree of crystallization of silicon of one of the first region or the second region is higher than the degree of crystallization of silicon of the other of the first region or the second region.

According to another aspect of the present invention, there is provided a manufacturing method of a transistor structure including a first thin film transistor and a second thin film transistor, the method including:

forming a first gate electrode of the first thin film transistor;
forming a first insulating film on the first gate electrode;
forming semiconductor films by forming a first semiconductor film in a position on the first insulating film corresponding to the first gate electrode and forming a second semiconductor film in a position on the first insulating film which is to be the second thin film transistor;
forming a second insulating film above the first semiconductor film and the second semiconductor film; and
forming a second gate electrode of the second thin film transistor in a position on the second insulating film corresponding to the second semiconductor film,
wherein the forming of the second gate electrode includes forming a first light blocking film simultaneously with the second gate electrode in a position on the second insulating film corresponding to the first semiconductor film;

the forming of the first gate electrode includes forming a second light blocking film simultaneously with the first gate electrode in a position below the first insulating film corresponding to the second semiconductor film; and the forming of the semiconductor film includes forming the first semiconductor film and the second semiconductor film by layering a first region and a second region along a thickness direction from the first insulating film side, and making a degree of crystallization of silicon of one of the first region or the second region higher than a degree of crystallization of silicon of the other of the first region or the second region.

According to another aspect of the present invention, there is provided a light emitting apparatus comprising:
a light emitting element; and
a transistor structure including:
a first thin film transistor including,
    a first gate electrode;
    a first insulating film which covers the first gate electrode;
    a first semiconductor film which is provided in a position on the first insulating film corresponding to the first gate electrode;
    a second insulating film which covers the first semiconductor film; and
    a first light blocking film which is provided in a position on the second insulating film corresponding to the first semiconductor film, and
a second thin film transistor including,
    a second semiconductor film which is provided on the first insulating film;
    the second insulating film which covers the second semiconductor film;
    a second gate electrode which is provided in a position on the second insulating film corresponding to the second semiconductor film; and
    a second light blocking film which is provided in a position below the first insulating film corresponding to the second semiconductor film,
wherein the emission of light of the light emitting element is controlled by the first thin film transistor and the second thin film transistor;
the first semiconductor film and the second semiconductor film include a first region and a second region along a thickness direction from the first insulating film side, and degree of crystallization of silicon of one of the first region or the second region is higher than the degree of crystallization of silicon of the other of the first region or the second region.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention;

FIG. 7A is an explanatory diagram showing a manufacturing step of a thin film transistor of the first embodiment;

FIG. 7B is an explanatory diagram showing a manufacturing step of a thin film transistor of the first embodiment;

FIG. 9A is an explanatory diagram showing a manufacturing step of a thin film transistor of the first embodiment;

FIG. 9B is an explanatory diagram showing a manufacturing step of a thin film transistor of the first embodiment;

FIG. 10A is an explanatory diagram showing a manufacturing step of a thin film transistor of the first embodiment;

FIG. 10B is an explanatory diagram showing a manufacturing step of a thin film transistor of the first embodiment;

FIG. 12A is an explanatory diagram showing a manufacturing step of a thin film transistor of the first embodiment;

FIG. 12B is an explanatory diagram showing a manufacturing step of a thin film transistor of the first embodiment;

FIG. 21A is an explanatory diagram showing a manufacturing step of a thin film transistor of the second embodiment;

FIG. 21B is an explanatory diagram showing a manufacturing step of a thin film transistor of the second embodiment;

FIG. 23A is an explanatory diagram showing a manufacturing step of a thin film transistor of the second embodiment;
FIG. 23B is an explanatory diagram showing a manufacturing step of a thin film transistor of the second embodiment;
FIG. 24A is an explanatory diagram showing a manufacturing step of a thin film transistor of the second embodiment;
FIG. 24B is an explanatory diagram showing a manufacturing step of a thin film transistor of the second embodiment;
FIG. 30A is an explanatory diagram showing a manufacturing step of a thin film transistor of the second embodiment;
FIG. 30B is an explanatory diagram showing a manufacturing step of a thin film transistor of the second embodiment;
FIG. 31A is an explanatory diagram showing a manufacturing step of a thin film transistor of the second embodiment;
FIG. 31B is an explanatory diagram showing a manufacturing step of a thin film transistor of the second embodiment.

DETAILED DESCRIPTION OF THE INVENTION

Preferred embodiments for carrying out the present embodiment are described in detail with reference to the attached drawings. The embodiments described below include various technically preferable limitations. However, the scope of the invention is not limited to the embodiments and the illustrated examples.

First Embodiment

First, an EL panel and transistor structure of the first embodiment of the present invention is described.

Figure 1:
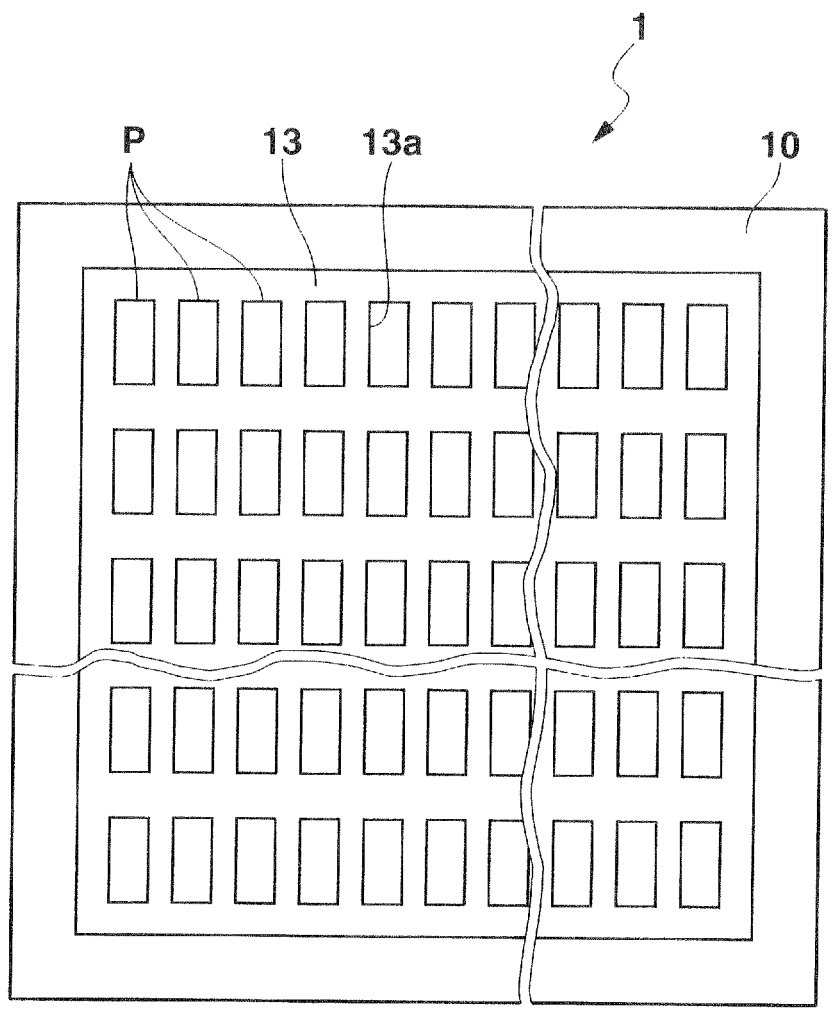
FIG. 1 is a planar view showing an arrangement structure of pixels of an EL panel.

FIG. 1 is a planar view showing an arrangement structure of a plurality of pixels P in an EL panel 1 which is a light emitting apparatus.

Figure 2:
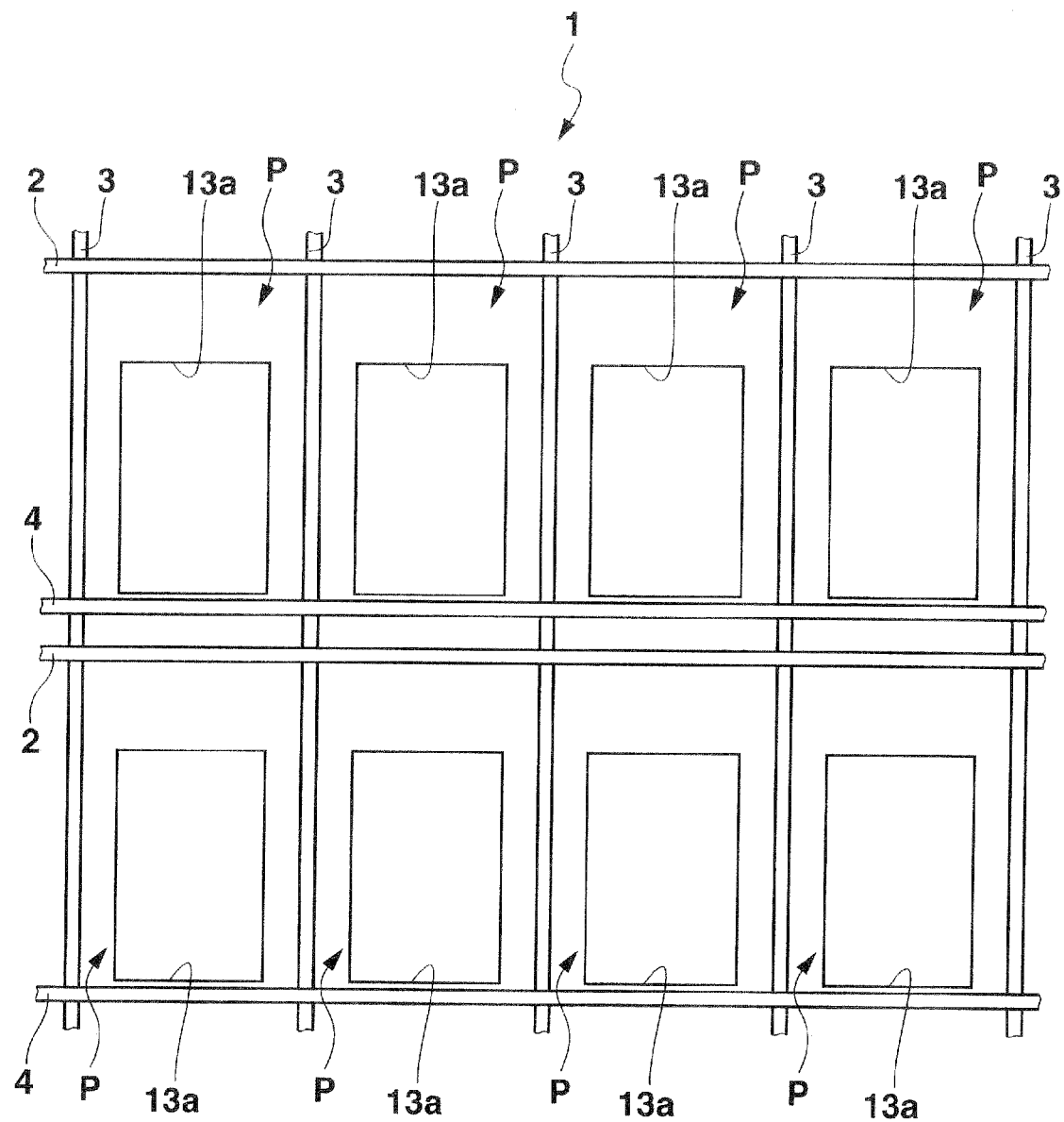
FIG. 2 is a planar view showing a schematic structure of the EL panel.

FIG. 2 is a planar view showing a schematic structure of the EL panel 1.

As shown in FIG. 1 and FIG. 2, a plurality of pixels P are arranged in a predetermined pattern in a matrix form on the EL panel 1. The plurality of pixels P include a red pixel P which emits light of R (red), green pixel P which emits light of G (green) and blue pixel P which emits light of B (blue).

On the EL panel 1, a plurality of scanning lines 2 are arranged along a row direction so as to be substantially parallel to each other, and a plurality of signal lines 3 are arranged along a column direction so as to be substantially parallel to each other and to be substantially orthogonal to the scanning lines 2 from a planar view.

Voltage supplying lines 4 are provided along the scanning lines 2 in between adjacent scanning lines 2.

The area surrounded by two scanning lines 2 adjacent to each other and two signal lines 3 adjacent to each other correspond to pixel P.

Bank 13, which is a partition wall, is provided so as to cover above scanning lines 2, signal lines 3 and voltage supplying lines 4 on the EL panel 1. Bank 13 is provided in, for example, a grid like shape, and a plurality of opening sections 13a surrounded by the bank 13 in a substantial rectangular shape are formed for each pixel P.

A predetermined carrier transporting layer (later described hole injecting layer 8b and light emitting layer 8c) is provided in the opening section 13a of the bank 13 and this is to be a light emitting area of the pixel P. The carrier transporting layer is a layer which transports a hole or an electron by applying voltage.

The bank 13 is not limited to the above configuration of providing an opening section 13a for each pixel P. The bank 13 can cover the signal line 3 and extend along a column direction and include an opening section in a stripe shape which collectively exposes a center section of each later described pixel electrode 8a of the plurality of pixels P aligned in a column direction.

Figure 3:
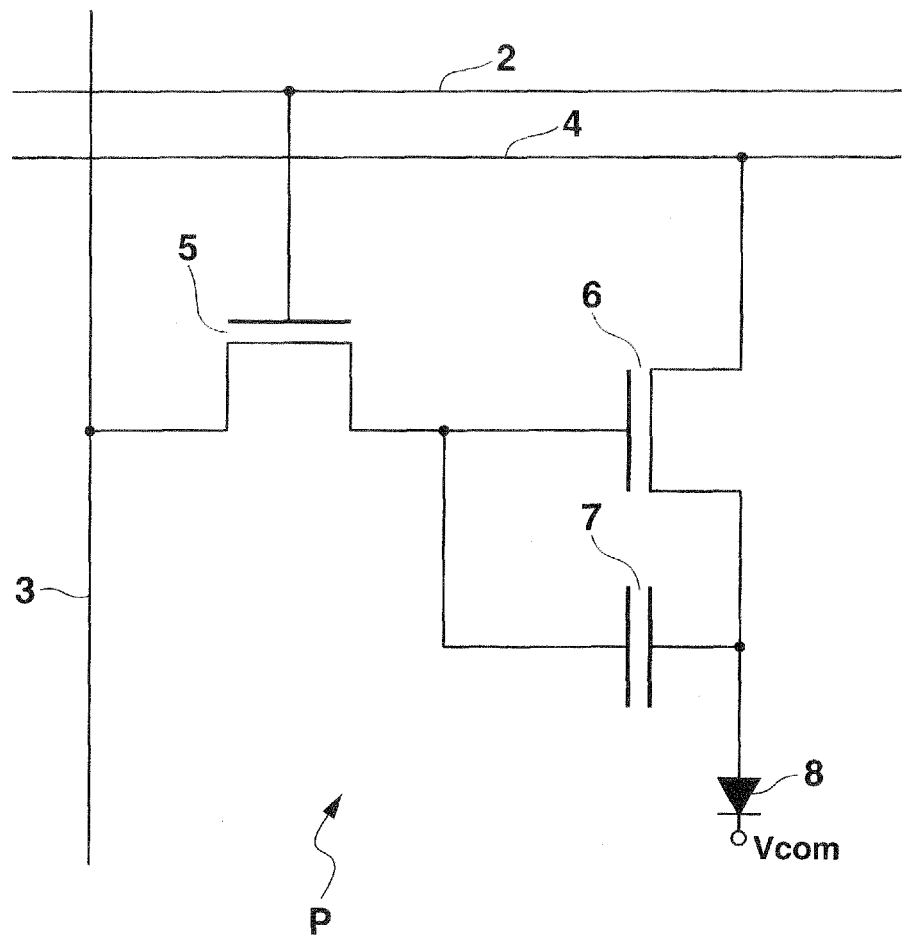
FIG. 3 is a circuit diagram showing a circuit corresponding to one pixel of the EL panel.

FIG. 3 is a circuit diagram showing an example of a circuit corresponding to one pixel of the EL panel 1 which is driven by an active matrix driving method.

As shown in FIG. 3, the EL panel 1 is provided with the scanning line 2, the signal line 3 which intersects with scanning line 2 and voltage supplying line 4 along the scanning line 2.

Each pixel P of the EL panel 1 is provided with a switch transistor 5 which is a second thin film transistor, a driving transistor 6 which is a first thin film transistor, a capacitor 7, and an EL element 8 which is a light emitting element.

The switch transistor 5 and the driving transistor 6 function as driving elements which allow the EL element 8 to emit light.

In each pixel P, the switch transistor 5 is a transistor which functions as a switch so that the signal line 3 and a gate of the driving transistor 6 are conducted or cutoff, and when a drain and a source of the switch transistor 5 are conducted, the signal line 3 and the gate of the driving transistor 6 are conducted. The gate of the switch transistor 5 is connected to the scanning line 2, either one of a drain or a source of the switch transistor 5 is connected to the signal line 3, the other of either of the drain or the source of the switch transistor 5 is connected to one of an electrode of the capacitor 7 and a gate of the driving transistor 6.

The driving transistor 6 is a transistor including a function to supply electric current based on a signal supplied from the signal line 3 to the EL element 8. Either one of a drain or a source of the driving transistor 6 is connected to the voltage supplying line 4 and the other of either of the drain or the source of the driving transistor 6 is connected to the other electrode of the capacitor 7 and an anode of the EL element 8.

All cathodes of the EL element 8 of the pixel P are connected to a voltage Vcom and maintained at a constant potential. Vcom is set to, for example, ground potential.

Each scanning line 2 is connected to a scanning driver in a periphery of the EL panel 1, each voltage supplying line 4 is connected to a voltage source which outputs a constant voltage or a voltage driver which suitably outputs a voltage signal and each signal line 3 is connected to a data driver, and the EL panel 1 is driven by an active matrix driving method using these drivers. The constant voltage from the voltage source or the voltage signal from the voltage driver is supplied to the voltage supplying line 4.

Figure 4:
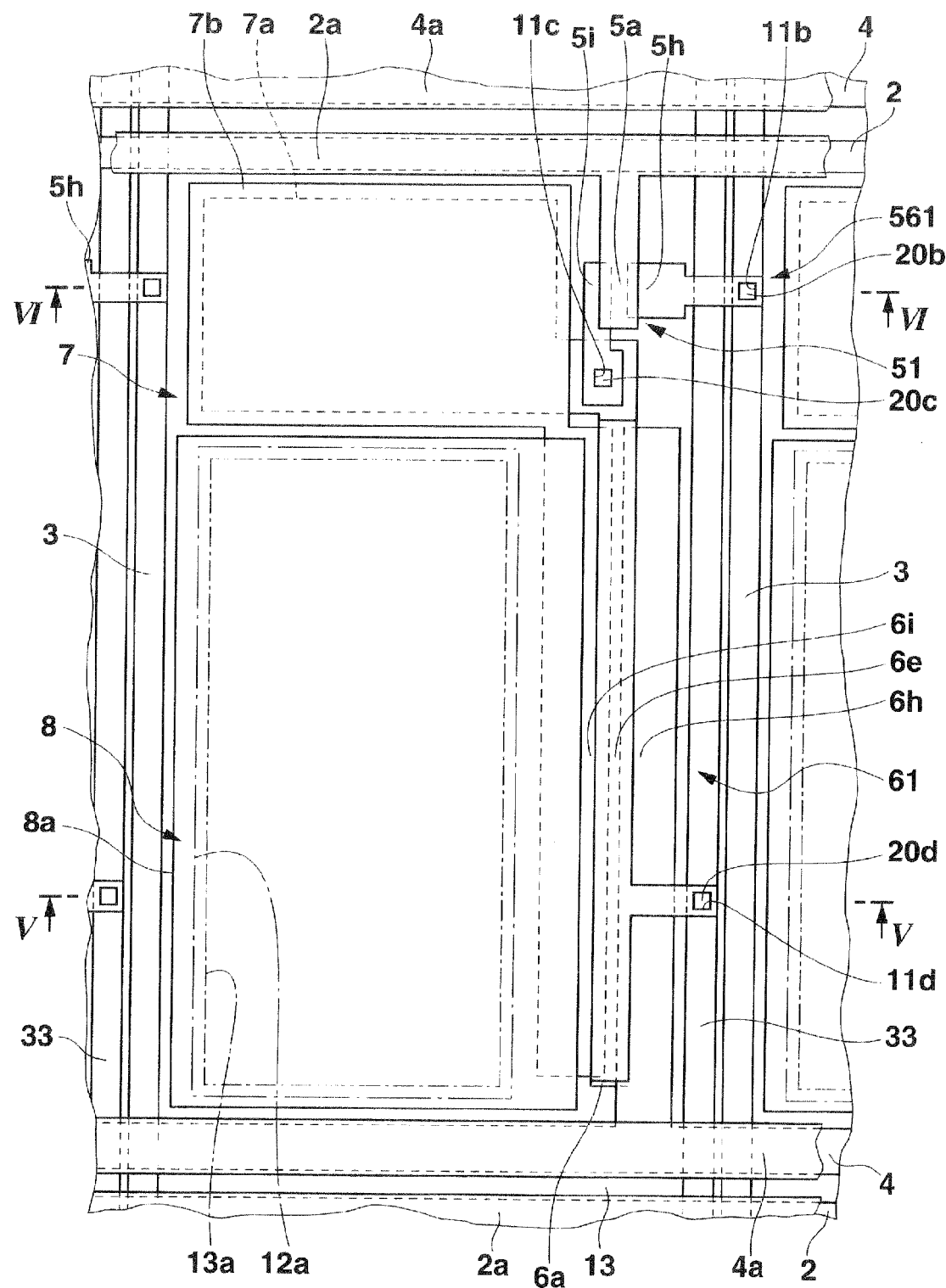
FIG. 4 is a planar view showing one pixel of the EL panel of the first embodiment.
Figure 5:
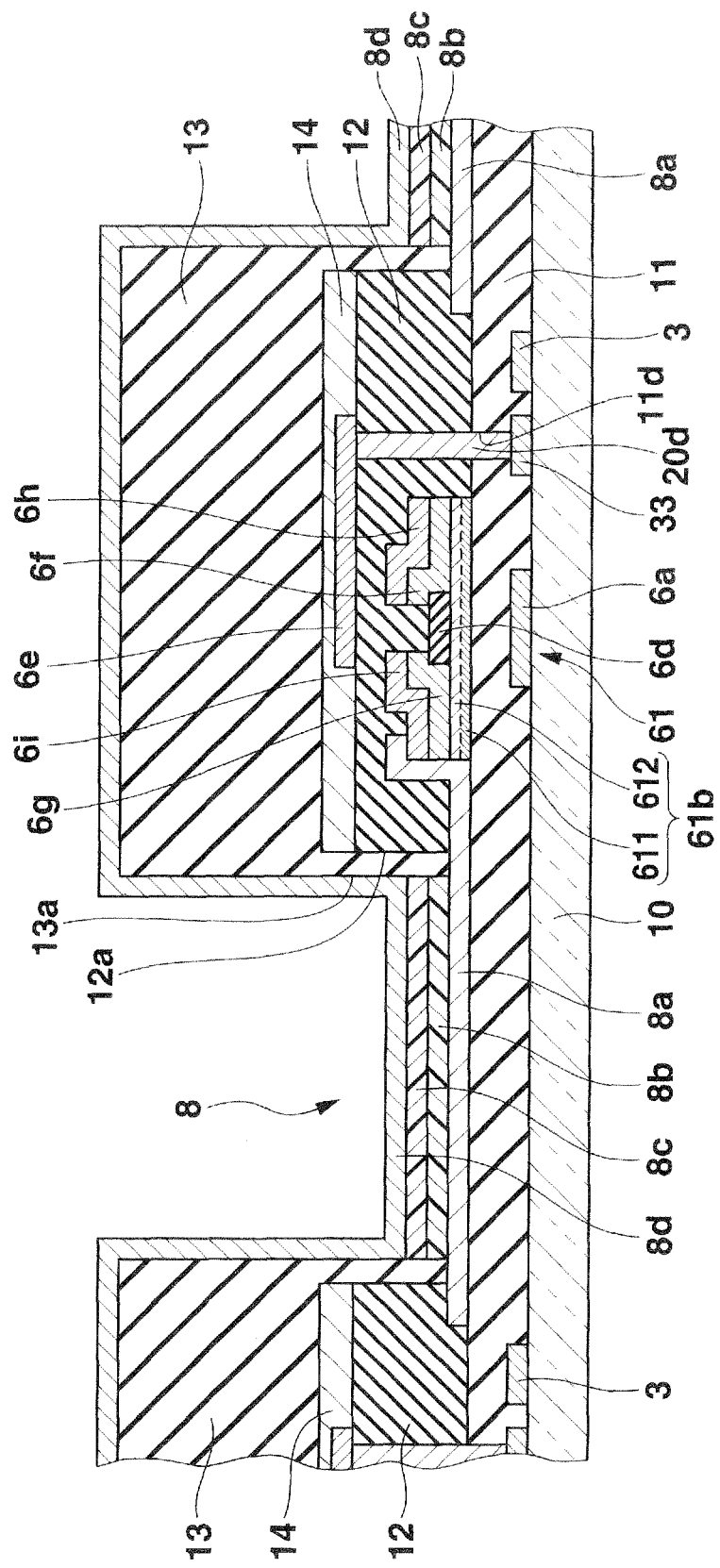
FIG. 5 is a cross sectional view of a plane along arrows V-V shown in FIG. 4.
Figure 6:
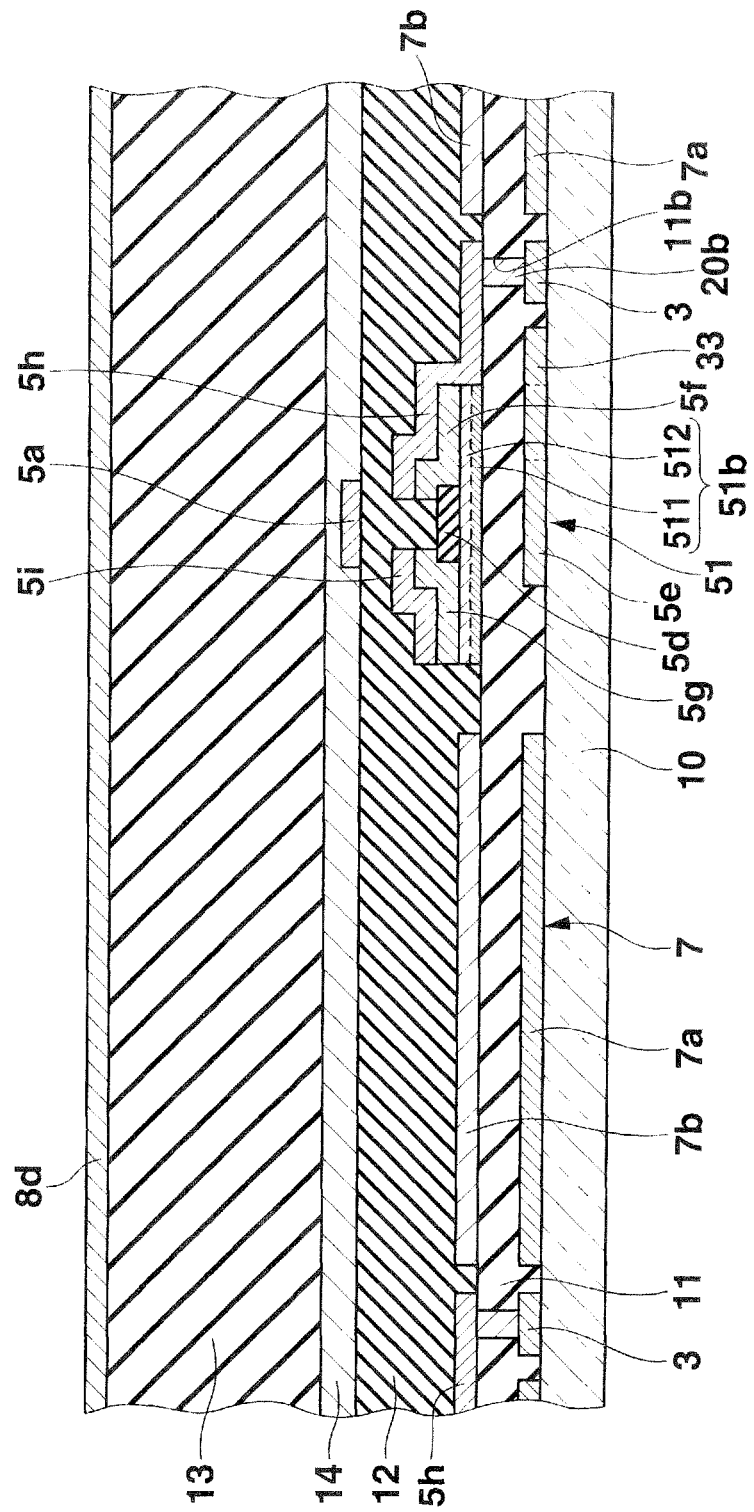
FIG. 6 is a cross sectional view of a plane along arrows VI-VI shown in FIG. 4.

Next, the configuration of the EL panel 1 of the first embodiment and the pixel P is described using FIG. 4 to FIG. 6.

FIG. 4 is a planar view corresponding to one pixel P of the EL panel 1 of the first embodiment.

FIG. 5 is a cross sectional view of a plane along arrows V-V shown in FIG. 4.

FIG. 6 is a cross sectional view of a plane along arrows VI-VI shown in FIG. 4.

FIG. 4 mainly shows electrodes and lines.

As shown in FIG. 4, each pixel P includes a transistor structure 561 including a switch transistor 51 and a driving transistor 61.

The switch transistor 51 and the driving transistor 61 each correspond to the switch transistor 5 and the driving transistor 6 shown in FIG. 3.

The switch transistor 51 and the driving transistor 61 are arranged along the signal line 3, the capacitor 7 is positioned near the switch transistor 51 and the EL element 8 is positioned near the driving transistor 61.

In each pixel P, the switch transistor 51, the driving transistor 61, the capacitor 7 and the EL element 8 are positioned between the scanning line 2 and the voltage supplying line 4.

As shown in FIG. 4 to FIG. 6, a first gate electrode 6a is provided on the substrate 10, and a first insulating film 11 is formed on an upper surface of the substrate 10 so as to cover the first gate electrode 6a.

On the first insulating film 11, a second semiconductor film 51b and a first semiconductor film 61b, a pair of impurity semiconductor films 5f and 5g, a pair of impurity semiconductor films 6f and 6g, and drain electrodes 5h and 6h and source electrodes 5i and 6i are each formed on a predetermined position.

A second insulating film 12 is formed so as to cover the drain electrodes 5h and 6h and the source electrodes 5i and 6i.

A second gate electrode 5a is provided on the second insulating film 12 and a passivation film 14 is formed on the upper surface of the second insulating film 12 so as to cover the second gate electrode 5a.

Regarding the first semiconductor film 61b, a first gate electrode 6a is positioned on one face side (bottom side in the figure) facing the first semiconductor film 61b with the first insulating film 11 in between, and a first light blocking film 6e is positioned on the other face side (top side in the figure) facing the first semiconductor film 61b with the second insulating film 12 in between.

Regarding the second semiconductor film 51b, a second light blocking film 5e is positioned on one face side (bottom side in the figure) facing the second semiconductor film 51b with the first insulating film 11 in between, and a second gate electrode 5a is positioned on the other face side (top side in the figure) facing the second semiconductor film 51b with the second insulating film 12 in between.

The signal line 3 is formed between the substrate 10 and the first insulating film 11.

A ground line 33 set at ground potential is formed along the signal line 3 between the substrate 10 and the first insulating film 11.

The scanning line 2 is formed on the first insulating film 11. On the second insulating film 12 covering above the scanning line 2, a groove is formed along the scanning line 2. In the groove, a conducting layer 2a is provided overlapped with the scanning line 2 so as to be in contact with the scanning line 2 and the scanning line 2 and the conducting layer 2a are conducted to aim for low resistance of the scanning line 2. The groove and the conducting layer 2a do not have to be included.

The voltage supplying line 4 is formed on the first insulating film 11. On the second insulating film 12 covering above the voltage supplying line 4, a groove is formed along the voltage supplying line 4. In the groove, a conducting layer 4a is provided covering the voltage supplying line 4 so as to be in contact with the voltage supplying line 4 and the voltage supplying line 4 and the conducting layer 4a are conducted. With this, there is an aim for low resistance of the voltage supplying line 4 and to stabilize the amount of electric current supplied to the EL element 8 through the driving transistor 61. The groove and the conducting layer 4a do not have to be included.

As shown in FIG. 4 and FIG. 6, the switch transistor 51 is a second thin film transistor with a top gate structure. The switch transistor 51 includes a second gate electrode 5a, a second semiconductor film 51b, a protective insulating film 5d, impurity semiconductor films 5f and 5g, a drain electrode 5h, a source electrode 5i, a second light blocking film 5e and the like.

The second light blocking film 5e is formed in a position between the substrate 10 and the first insulating film 11 corresponding to a channel region of the second semiconductor film 51b between the drain electrode 5h and the source electrode 5i. The second light blocking film 5e is formed in the same process as the first gate electrode 6a by patterning the conducting layer which is to be the first gate electrode 6a when the first gate electrode 6a of the driving transistor 61 is formed. The first gate electrode 6a and the second light blocking film 5e are formed from a material selected from a Cr film, an Al film, a Cr/Al laminated film, an AlTi alloy film, and an AlTiNd alloy film. A portion of the second light blocking film 5e is connected to the ground line 33.

The first insulating film 11 formed on the upper surface of the substrate 10 includes, for example, light permeability and includes silicon nitride or silicon oxide.

An intrinsic second semiconductor film 51b is formed in a position on the first insulating film 11 which corresponds with the second gate electrode 5a.

The second semiconductor film 51b includes, for example, crystalline silicon, specifically microcrystalline silicon and includes a first region 511 positioned on the first insulating film 11 side and a second region 512 positioned on the opposite surface side (second gate electrode 5a side). Here, degree of crystallization of silicon of the first region 511 is formed higher than the second region 512. In other words, in the first region 511 of the second semiconductor film 51b, the degree of crystallization of silicon is relatively higher compared to the second region 512, and the rate of the crystalline silicon region is higher compared to the second region 512. In the second region 512 of the second semiconductor film 51b, the rate of the amorphous silicon region is high compared to the first region 511, and preferably, the second region 512 of the second semiconductor film 51b is a region with substantially only amorphous silicon. The second semiconductor film 51b is a channel region where a channel is formed. A protective insulating film 5d is formed on a center section of the second semiconductor film 51b.

It is preferable that the protective insulating film 5d includes, for example, silicon nitride or silicon oxide.

On one edge section of the second semiconductor film 51b, an impurity semiconductor film 5f is formed so as to overlap with a portion of the protective insulating film 5d. On the other edge section of the second semiconductor film 51b, an impurity semiconductor film 5g is formed so as to overlap with a portion of the protective insulating film 5d. As described here, the impurity semiconductor films 5f and 5g are formed apart from each other on each edge side of the second semiconductor film 51b. The impurity semiconductor films 5f and 5g are n-type semiconductors including n-type impurity, however, it is not limited to the above, and when the switch transistor 51 is a p-type transistor, a p-type semiconductor can be used.

The drain electrode 5h is formed on the impurity semiconductor film 5f. The source electrode 5i is formed on the impurity semiconductor film 5g.

It is preferable that the drain electrode 5h and the source electrode 5i are formed from material selected from, for example, a Cr film, an Al film, a Cr/Al laminated film, an AlTi alloy film, and an AlTiNd alloy film.

On the protective insulating film 5d, the drain electrode 5h and the source electrode 5i, a second insulating film 12 is formed, and the protective insulating film 5d, the drain electrode 5h, the source electrode 5i, etc. are covered by the second insulating film 12. The second insulating film 12 includes, for example, silicon nitride or silicon oxide.

The second gate electrode 5a is formed on the second insulating film 12 between the drain electrode 5h and the source electrode 5i below the protective insulating film 5d, in other words a position corresponding to a channel region of the second semiconductor film 51b. It is preferable that this second gate electrode 5a is formed from material selected from, for example, a Cr film, an Al film, a Cr/Al laminated film, an AlTi alloy film or an AlTiNd alloy film.

The second gate electrode 5a on the second insulating film 12 is covered by the passivation film 14. The passivation film 14 includes, for example, silicon nitride or silicon oxide.

With this, the switch transistor 51 is covered by the passivation film 14.

In the switch transistor 51, the second insulating film 12 and the protective insulating film 5d function as a gate insulating film, and a channel (channel region) is formed in the area of the second semiconductor film 51b covered by the protective insulating film 5d and acted on by the electric field of the second gate electrode 5a. The channel is formed in a second region 512 of the second semiconductor film 51b which is the second gate electrode 5a side of the second semiconductor film 51b, and the second region 512 constitutes the electric current path between the source electrode 5i and the drain electrode 5h.

The second region 512 of the second semiconductor film 51b is a semiconductor layer including more amorphous silicon than the first region 511 and the switch transistor 51 which uses the second region 52 as the electric current path of the channel corresponds to a thin film transistor including a semiconductor film made from amorphous silicon (or a semiconductor film including amorphous silicon as a main component). In other words, the leak current is smaller in the amorphous silicon of the second region 512 of the switch transistor 51 compared to the crystalline silicon such as microcrystalline silicon and (electric current which flows in the semiconductor layer when on)/(electric current which flows in the semiconductor layer when off) is high. Therefore, the switch transistor 51 suitably functions as the switch transistor which controls the on/off of the driving transistor 61.

In the switch transistor 51, with respect to the channel region of the second semiconductor film 51b, a second light blocking film 5e is provided below facing the channel region of the second semiconductor film 51b and a second gate electrode 5a is provided above facing the channel region of the second semiconductor film 51b. With this, the second light blocking film 5e and the second gate electrode 5a can block propagating light such as light which enters from outside of the EL panel 1 and light emitted from the EL element 8 from reaching the channel region of the second semiconductor film 51b. As a result, a leak current hardly occurs in the switch transistor 51 and the transistor characteristic becomes stable. Therefore, the switch transistor 51 can function preferably.

Moreover, the second light blocking film 5e is connected to the ground line 33 and set to the ground potential and the second light blocking film 5e and the second gate electrode 5a can block an unnecessary electric field which occurs toward the channel region of the second semiconductor film 51b by an element outside the switch transistor 51. Therefore, the switch transistor 51 can operate normally with a suitable voltage between the second gate electrode 5a and the source electrode 5i and a voltage between the drain electrode 5h and the source electrode 5i.

As shown in FIG. 4 and FIG. 5, the driving transistor 61 is a first thin film transistor with a bottom gate structure. The driving transistor 61 includes a first gate electrode 6a, a first semiconductor film 61b, a protective insulating film 6d, impurity semiconductor films 6f and 6g, a drain electrode 6h, a source electrode 6i, a first light blocking film 6e and the like.

The first gate electrode 6a is formed between the substrate 10 and the first insulating film 11. It is preferable that the first gate electrode 6a is formed from material selected from, for example, a Cr film, an Al film, a Cr/Al laminated film, an AlTi alloy film and an AlTiNd alloy film. The first insulating film 11 is formed on the first gate electrode 6a and the first gate electrode 6a is covered by the first insulating film 11. The intrinsic first semiconductor film 61b is formed in a position on the first insulating film 11 corresponding to the first gate electrode 6a. The first semiconductor film 61b faces the first gate electrode 6a with the first insulating film 11 in between.

The first semiconductor film 61b includes, for example, crystalline silicon, specifically, microcrystalline silicon and includes a first region 611 positioned on the first insulating film 11 side (first gate electrode 6a side) and a second region 612 positioned on the opposite surface side. Here, degree of crystallization of silicon of the first region 611 is formed higher compared to the second region 612. In other words, in the first region 611 of the first semiconductor film 61b, degree of crystallization of silicon is relatively higher compared to the second region 612, and the rate of the crystalline silicon region is higher compared to the second region 612. In the second region 612 of the first semiconductor film 61b, the rate of the amorphous silicon region is higher compared to the first region 611, and preferably the second region 612 of the first semiconductor film 61b is a region with substantially only amorphous silicon.

The first region 611 of the first semiconductor film 61b and the first region 511 of the second semiconductor film 51b have the same composition and have the same thickness. The second region 612 of the first semiconductor film 61b and the second region 512 of the second semiconductor film 51b have the same composition and have the same thickness. Therefore, as described later, the first semiconductor film 61b and the second semiconductor film 51b can be manufactured collectively with the same process using the semiconductor layer 9 which is a layer with the same material. The first semiconductor film 61b is a channel region where the channel is formed. Moreover, on a center section of the first semiconductor film 61b, the protective insulating film 6d is formed.

The protective insulating film 6d and the protective insulating film 5d are composed of the same material and have the same thickness, and preferably include, for example, silicon nitride or silicon oxide. Therefore, as described later, the protective insulating film 6d and the protective insulating film 5d can be manufactured collectively with the same process using the protective insulating layer 9d which is a layer with the same material.

On one edge section of the first semiconductor film 61b, the impurity semiconductor film 6f is formed so as to overlap with a portion of the protective insulating film 6d, and on the other edge section of the first semiconductor film 61b, the impurity semiconductor film 6g is formed so as to overlap with a portion of the protective insulating film 6d. As described here, the impurity semiconductor films 6f and 6g are formed apart from each other on each edge side of the first semiconductor film 61b. The impurity semiconductor films 6f and 6g are n-type semiconductors including n-type impurity, however it is not limited to the above, and when the switch transistor 51 and the driving transistor 61 are p-type transistors, a p-type semiconductor can be used.

The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 6h, the source electrode 6i, the drain electrode 5h and the source electrode 5i are composed of the same material and have the same thickness. As described later, the drain electrode 6h, the source electrode 6i, the drain electrode 5h and the source electrode 5i can be manufactured collectively with the same process using the conducting film 9h which is a layer with the same material.

A second insulating film 12 is formed on the protective insulating film 6d, the drain electrode 6h and the source electrode 6i, and the protective insulating film 6d, the drain electrode 6h, the source electrode 6i, etc. are covered by the second insulating film 12.

The first light blocking film 6e is formed in a position on the second insulating film 12 between the drain electrode 6h and the source electrode 6i below the protective insulating film 6d, in other words corresponding to a channel region of the first semiconductor film 61b. The first light blocking film 6e is formed in the same process as the second gate electrode 5a by patterning the gate metal layer 9a which is to be the second gate electrode 5a when the second gate electrode 5a of the switch transistor 51 is formed. The first light blocking film 6e and the second gate electrode 5a are formed from a material selected from a Cr film, an Al film, a Cr/Al laminated film, an AlTi alloy film, or an AlTiNd alloy film. A portion of the first light blocking film 6e is connected to the ground line 33 through the contact plug 20d. The first light blocking film 6e on the second insulating film 12 is covered by the passivation film 14.

The driving transistor 61 is covered by the passivation film 14. Therefore, the passivation film 14 covers both the switch transistor 51 and the driving transistor 61. The passivation film 14 enhances adhesion with the bank 13 formed above the passivation film 14 and protects the first light blocking film 6e and the second gate electrode 5a.

In the driving transistor 61, the first insulating film 11 functions as a gate insulating film, and a channel (channel region) is formed in the region of the first semiconductor film 61b covered by the protective insulating film 6d and acted on by the electric field of the first gate electrode 6a. The channel is formed in a first region 611 of the first semiconductor film 61b which is the first gate electrode 6a side of the first semiconductor film 61b, and the first region 611 constitutes the electric current path between the source electrode 6i and the drain electrode 6h.

The first region 611 of the first semiconductor film 61b is a semiconductor layer including more crystalline silicon than the second region 612. Therefore, the driving transistor 61 which uses the first region 611 as the electric current path of the channel corresponds to a thin film transistor including a semiconductor film made from crystalline silicon (or a semiconductor film including crystalline silicon as the main component). In other words, the microcrystalline silicon in the first region 611 of the driving transistor 61 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore the driving transistor 61 suitably functions as a driving transistor which flows electric current in the EL element 8 by control of the switch transistor 51.

In the driving transistor 61, with respect to the channel region of the first semiconductor film 61b, a first light blocking film 6e is provided above facing the channel region of the first semiconductor film 61b and a first gate electrode 6a is provided below facing the channel region of the first semiconductor film 61b. With this, the first light blocking film 6e and the first gate electrode 6a can block propagating light such as light which enters from outside of the EL panel 1 and light emitted from the EL element 8 from reaching the channel region of the first semiconductor film 61b. As a result, a leak current hardly occurs in the driving transistor 61 and the transistor characteristic becomes stable. Therefore, the driving transistor 61 can function preferably.

Moreover, the first light blocking film 6e is connected to the ground line 33 and set to the ground potential and the first light blocking film 6e and the first gate electrode 6a can block an unnecessary electric field which occurs toward the channel region of the first semiconductor film 61b by an element outside the driving transistor 61. Therefore, the driving transistor 61 can operate normally with a suitable voltage between the first gate electrode 6a and the source electrode 6i and a voltage between the drain electrode 6h and the source electrode 6i.

The capacitor 7 is connected between the first gate electrode 6a and the source electrode 6i of the driving transistor 61.

Specifically, the electrode 7a of the capacitor 7 is connected to the first gate electrode 6a of the driving transistor 61, and the electrode 7b of the capacitor 7 is connected to the source electrode 6i of the driving transistor 61.

Then, as shown in FIG. 4 and FIG. 6, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the ground line 33, the electrode 7a of the capacitor 7, the first gate electrode 6a of the driving transistor 61, and the second light blocking film 5e of the switch transistor 51 are collectively formed by processing the shape of a conducting film formed from conductive material on an entire surface of the substrate 10 by photolithography, etching, etc.

The scanning line 2, the voltage supplying line 4, the electrode 7b of the capacitor 7, the drain electrode 5h and the source electrode 5i of the switch transistor 51, and the drain electrode 6h and the source electrode 6i of the driving transistor 61 are collectively formed by processing the shape of a conducting film formed on an entire surface of the first insulating film 11 by photolithography, etching, etc.

The first light blocking film 6e of the driving transistor 61, the second gate electrode 5a of the switch transistor 51, and the conducting layer 2a and the conducting layer 4a are collectively formed by processing the shape of a conducting film formed on an entire surface of the second insulating film 12 by photolithography, etching, etc.

On the first insulating film 11, a contact hole 11b is formed on a region where the drain electrode 5h and the signal line 3 overlaps, a contact hole 11c is formed on a region where the first gate electrode 6a and the source electrode 5i overlaps, and contact plugs 20b and 20c are each implanted in the contact holes 11b and 11c.

The drain electrode 5h of the switch transistor 51 and the signal line 3 are electrically conducted by the contact plug 20b. The source electrode 5i of the switch transistor 51 and the electrode 7a of the capacitor 7 as well as the source electrode 5i of the switch transistor 51 and the first gate electrode 6a of the driving transistor 61 are electrically conducted by the contact plug 20c.

The drain electrode 5h can be conducted with the signal line 3 by direct contact and the source electrode 5i can be conducted with the first gate electrode 6a by direct contact without using the contact plugs 20b and 20c.

In the first insulating film 11 and the second insulating film 12, a contact hole 11d is formed in a region where the first light blocking film 6e overlaps with the ground line 33, and a contact plug 20d is implanted in the contact hole 11d. The first light blocking film 6e and the ground line 33 are conducted by the contact plug 20d and the first light blocking film 6e is grounded.

The first gate electrode 6a of the driving transistor 61 is connected as one with the electrode 7a of the capacitor 7, the drain electrode 6h of the driving transistor 61 is connected as one with the voltage supplying line 4, and the source electrode 6i of the driving transistor 61 is connected as one with the electrode 7b of the capacitor 7.

The pixel electrode 8a is provided on the substrate 10 with the first insulating film 11 in between, and a separate pixel electrode 8a is formed for each pixel P.

According to a bottom emission structure which emits light of the EL element 8 from the pixel electrode 8a side, the pixel electrode 8a is a transparent electrode, and it is preferable that the pixel electrode 8a is formed from material selected from for example, tin doped indium oxide (ITO), zinc doped indium oxide, indium oxide ($In_2O_3$), tin oxide ($SnO_2$), zinc oxide (ZnO) and cadmium-tin oxide (CTO).

According to a top emission structure which emits light of the EL element 8 from a counter electrode 8d side, it is preferable that the pixel electrode 8a is a laminated structure including a light reflecting layer as a lower layer which is a single or alloy layer of aluminum, etc. with high light reflecting properties, and the above described transparent electrode as the upper layer.

A portion of the pixel electrode 8a overlaps with the source electrode 6i of the driving transistor 61, and the pixel electrode 8a and the source electrode 6i are connected to each other.

Then, as shown in FIG. 4 and FIG. 5, the second insulating film 12 and the passivation film 14 are formed so as to cover the scanning line 2, the signal line 3, the voltage supplying line 4, the switch transistor 51, the driving transistor 61, the periphery of the pixel electrode 8a, the electrode 7b of the capacitor 7 and the first insulating film 11. In other words, an opening section 12a is formed in the second insulating film 12 and the passivation film 14 so as to expose the center section of each pixel electrode 8a. Therefore, the second insulating film 12 and the passivation film 14 are formed in a grid like shape from a planar view.

As shown in FIG. 4 and FIG. 5, the EL element 8 includes the pixel electrode 8a as the first electrode which is to be the anode, the hole injecting layer 8b which is a compound film formed on the pixel electrode 8a, the light emitting layer 8c which is a compound film formed on the hole injecting layer 8b, and the counter electrode 8d as the second electrode formed on the light emitting layer 8c.

The counter electrode 8d is a single electrode common to all pixels P and is formed continuously on all pixels P.

The hole injecting layer 8b is a carrier injecting layer to inject a hole from the pixel electrode 8a to the light emitting layer 8c. The hole injecting layer 8b is a layer including, for example PEDOT (polyethylenedioxythiophene) which is a conductive polymer and PSS (polystyrene sulfonate) which is a dopant.

The light emitting layer 8c includes material which emits light of either R (red), G (green) or B (blue) in each pixel P, and is a layer formed from, for example, light emitting material of polyfluorene series or polyphenylene vinylene series and emits light by recombination between an electron supplied from the counter electrode 8d and a hole injected from the hole injecting layer 8b. Therefore, among the pixel P which emits light of R (red), the pixel P which emits light of G (green) and the pixel P which emits light of B (blue), the light emitting material of the light emitting layer 8c are different from each other.

The pixels P which are R (red), G (green) and B (blue) are aligned in a stripe pattern in which, for example, the same color pixel is aligned in the vertical direction.

This alignment pattern is not limited to a stripe pattern and can be a delta sequence. In a stripe pattern, the opening section 13a of the bank 13 is provided in a grid like shape along the alignment pattern of each pixel P or in a stripe shape along a column direction so that a plurality of the center sections of the pixel electrode 8a of the pixel P are collectively exposed.

The counter electrode 8d is formed from material with a lower work function than the pixel electrode 8a, and when the counter electrode 8d is employed as the cathode, the counter electrode 8d is formed, for example, as a laminated body including a lower layer of a single body or alloy including at least one type of indium, magnesium, calcium, lithium, barium, or rare earth metal and an upper layer in order to reduce sheet resistance.

According to a top emission structure which emits light of the EL element 8 from the counter electrode 8d side, the upper layer is a transparent electrode and it is preferable that the upper layer is formed from material selected from, for example, tin doped indium oxide (ITO), zinc doped indium oxide, indium oxide ($In_2O_3$), tin oxide ($SnO_2$), zinc oxide (ZnO), and cadmium-tin oxide (CTO). According to a bottom emission structure which emits light of the EL element 8 from the pixel electrode 8a side, it is preferable that the upper layer is a single or alloy layer of aluminum, etc. with high light reflecting properties.

The counter electrode 8d is an electrode common to all pixels P and covers the later described bank 13 with a compound film such as the light emitting layer 8c.

The light emitting layer 8c which is to be the light emitting portion is divided with respect to each pixel P by the bank 13. In the opening section 13a, the hole injecting layer 8b and the light emitting layer 8c as the carrier transporting layers are layered on the pixel electrode 8a.

The hole injecting layer 8b can be formed continuously to spread on a plurality of pixels P. In this case, it is preferable to use germanium oxide with hole injecting properties.

Specifically, when the hole injecting layer 8b or the light emitting layer 8c is formed in a predetermined area surrounded by the bank 13 of the pixel P by a wet type method, the bank 13 functions as a partition wall to prevent the liquid body in which material which is to be the hole injecting layer 8b or the light emitting layer 8c is dissolved or dispersed in a solvent from flowing into the adjacent pixel P through the bank 13.

For example, as shown in FIG. 5, since the opening edge of the opening section 13a of the bank 13 provided on the second insulating film 12 and the passivation film 14 is positioned on the inner side of the opening edge of the opening section 12a of the second insulating film 12, the bank 13 covers the entire second insulating film 12.

With the configuration of the second insulating film 12 being wider than the bank 13, the opening section 13a is wider than the opening section 12a, and the side face of the opening edge of the opening section 12a of the second insulating film 12 can be exposed from the opening section 13a of the bank 13.

The liquid body including the material which is to be the hole injecting layer 8b is applied on each pixel electrode 8a surrounded by each opening section 13a, and the substrate 10 is heated as a whole, to dry the liquid body to form the compound film. This compound film is to be the hole injecting layer 8b which is the first carrier transporting layer.

The liquid body including the material which is to be the light emitting layer 8c is applied on each hole injecting layer 8b surrounded by each opening section 13a, and the substrate 10 is heated as a whole, to dry the liquid body to form the compound film. This compound film is to be the light emitting layer 8c which is the second carrier transporting layer.

The counter electrode 8d is provided so as to cover the light emitting layer 8c and the bank 13.

In the EL panel 1, according to a bottom emission structure, the pixel electrode 8a, the substrate 10 and the first insulating film 11 are transparent, and the light emitted from the light emitting layer 8c transmits the pixel electrode 8a, the first insulating film 11 and the substrate 10 and exits. Therefore, the rear surface of the substrate 10 is to be the display surface.

The structure can be a top emission structure in which instead of the substrate 10 side, the opposite side is to be the display surface. In this case, as described above, the counter electrode 8d is to be the transparent electrode, the pixel electrode 8a is to be the reflecting electrode and the light emitted from the light emitting layer 8c transmits the counter electrode 8d and exits.

Next, this EL panel 1 is driven and emits light as described in the following.

In a state where a predetermined level of voltage is applied to all voltage supplying lines 4, voltage is sequentially applied to the scanning line 2 by the scanning driver, and such scanning lines 2 are sequentially selected. The switch transistor 51 of each pixel P corresponding to the selected scanning line 2 is turned on.

When the data driver applies a voltage of a level according to the tone to all signal lines 3 when each scanning line 2 is selected, since the switch transistor 51 of each pixel P corresponding to the selected scanning line 2 is turned on, the voltage of the signal line 3 is applied to the gate electrode 6a of the driving transistor 61.

According to the voltage of the level corresponding to the predetermined tone applied on the gate electrode 6a of the driving transistor 6, the potential difference between the gate electrode 6a and the source electrode 6i of the driving transistor 61 is determined, the amount of the drain-source electric current in the driving transistor 61 is determined, and the EL element 8 emits light of a brightness according to the drain-source electric current of the EL element 8.

Then, when the selection of the scanning line 2 is released, the switch transistor 51 is turned off, the electronic charge based on the voltage applied to the gate electrode 6a of the driving transistor 61 is stored in the capacitor 7 and the potential difference between the gate electrode 6a and the source electrode 6i of the driving transistor 61 is maintained. Therefore, the driving transistor 61 flows the drain-source electric current with the same electric current value as the time of selection, and the light emission of the EL element 8 is maintained.

In other words, the switch transistor 51 switches the voltage applied to the gate electrode 6a of the driving transistor 61 to the voltage of the predetermined tone level applied to the signal line 3, the driving transistor 61 flows the drain-source electric current (driving electric current) of the electric current value according to the level of the voltage applied to the gate electrode 6a from the voltage supplying line 4 to the EL element 8, and the EL element 8 emits light at a predetermined tone according to the electric current value (electric current density).

As described above, the emission of light of the EL element 8 is controlled by driving and control of the transistor structure 561 including the switch transistor 51 and the driving transistor 61, and the emission of light of the EL panel 1 including the transistor structure 561 is controlled.

Next, the manufacturing method of the switch transistor 51 and the driving transistor 61 composing the transistor structure 561 in the EL panel 1 of the first embodiment of the present invention is described using FIG. 7A and FIG. 7B to FIG. 17A and FIG. 17B showing each process.

Regarding the switch transistor 51 and the driving transistor 61 shown in the diagram explaining each step, a portion of the shape and the like is different from the actual embodiment, such as in FIG. 4, however, to simplify explanation, each thin film transistor is shown to be the same size and the main section of each thin film transistor is schematically illustrated and explained. FIG. A of each figure shows the driving transistor 61 and FIG. B of each figure shows the switch transistor 51.

First, as shown in FIG. 7A and FIG. 7B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 6a of the driving transistor 61, the second light blocking film 5e of the switch transistor 51, the signal line 3, the ground line 33 and the electrode 7a of the capacitor 7 (see FIG. 5 and FIG. 6).

Figure 8A:
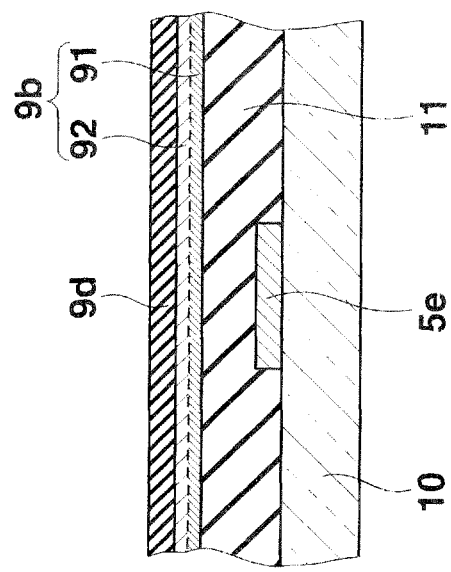
FIG. 8A is an explanatory diagram showing a manufacturing step of a thin film transistor of the first embodiment.
Figure 8B:
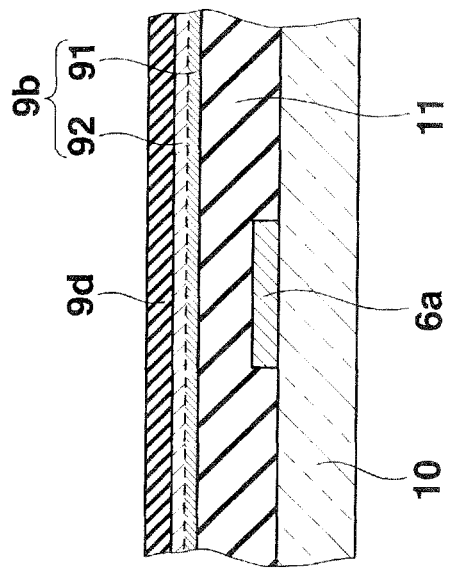
FIG. 8B is an explanatory diagram showing a manufacturing step of a thin film transistor of the first embodiment.

Next, as shown in FIG. 8A and FIG. 8B, the first insulating film 11 such as silicon nitride, etc. is formed by plasma CVD (PE-CVD).

Moreover, as shown in FIG. 8A and FIG. 8B, the semiconductor layer 9b including crystalline silicon is formed on the first insulating film 11 by plasma CVD. Here, when the semiconductor layer 9b which is to be the semiconductor film (51b, 61b) is formed, the first silicon layer 91 with a relatively high degree of crystallization of silicon is formed first, and then a second silicon layer 92 with a relatively low degree of crystallization of silicon is formed. Preferably, the second silicon layer 92 is substantially only amorphous silicon.

Specifically, the first silicon layer 91 is formed after plasma degradation of $SiH_4$ gas and $H_2$ gas, and by setting the ratio of the $H_2$ gas overwhelmingly larger compared to the $SiH_4$ gas and by making the plasma power and the pressure large to raise the degree of crystallization, the first silicon layer 91 which is a microcrystalline silicon thin film can be formed.

In the present embodiment, the first silicon layer 91 is formed under conditions of using argon as a carrier gas, setting the gas flow rate to $SiH_4/H_2$=50/10500 [SCCM], setting power density at 0.134 [$W/cm^2$] and setting the pressure at 300 [Pa].

Then, the ratio of the $H_2$ gas compared to $SiH_4$ gas is decreased, and the plasma power and the pressure is decreased to form the second silicon layer 92 which is an amorphous silicon thin film.

The surface of the first silicon layer 91 which is the microcrystalline silicon thin film tends to be uneven. However, since the second silicon layer 92 which is the amorphous silicon thin film is layered on the first silicon layer 91, the unevenness of the surface of the first silicon layer 91 is covered and moderated by the second silicon layer 92.

Instead of forming the first silicon layer 91 by plasma CVD, the first silicon layer 91 can be formed by a method of emitting laser light to the amorphous silicon thin film to be reformed to the microcrystalline silicon thin film. In this case, after forming the amorphous silicon thin film on the first insulating film 11, the substrate is taken out of the chamber of the CVD apparatus and laser light emitting processing is performed to form the first silicon layer 91, and then the substrate is put in the chamber of the CVD apparatus again to layer the second silicon layer 92 on the first silicon layer 91.

The degree of crystallization of silicon of the first silicon layer 91 and the second silicon layer 92 in the semiconductor layer 9b (the first region and the second region in the semiconductor film) can be determined based on the degree of crystallization calculated by, for example, raman spectrophotometry.

In this case, for example, amorphous silicon provides a spectrum including a broad peak at around 480 cm$^{-1}$. The very minute crystalline silicon of the grain boundary or with a crystal diameter of 5 nm or less provides a spectrum including a broad peak at around 500 cm$^{-1}$.

The crystallized silicon provides a spectrum including a relatively sharp peak at around 520 cm$^{-1}$.

Figure 61:
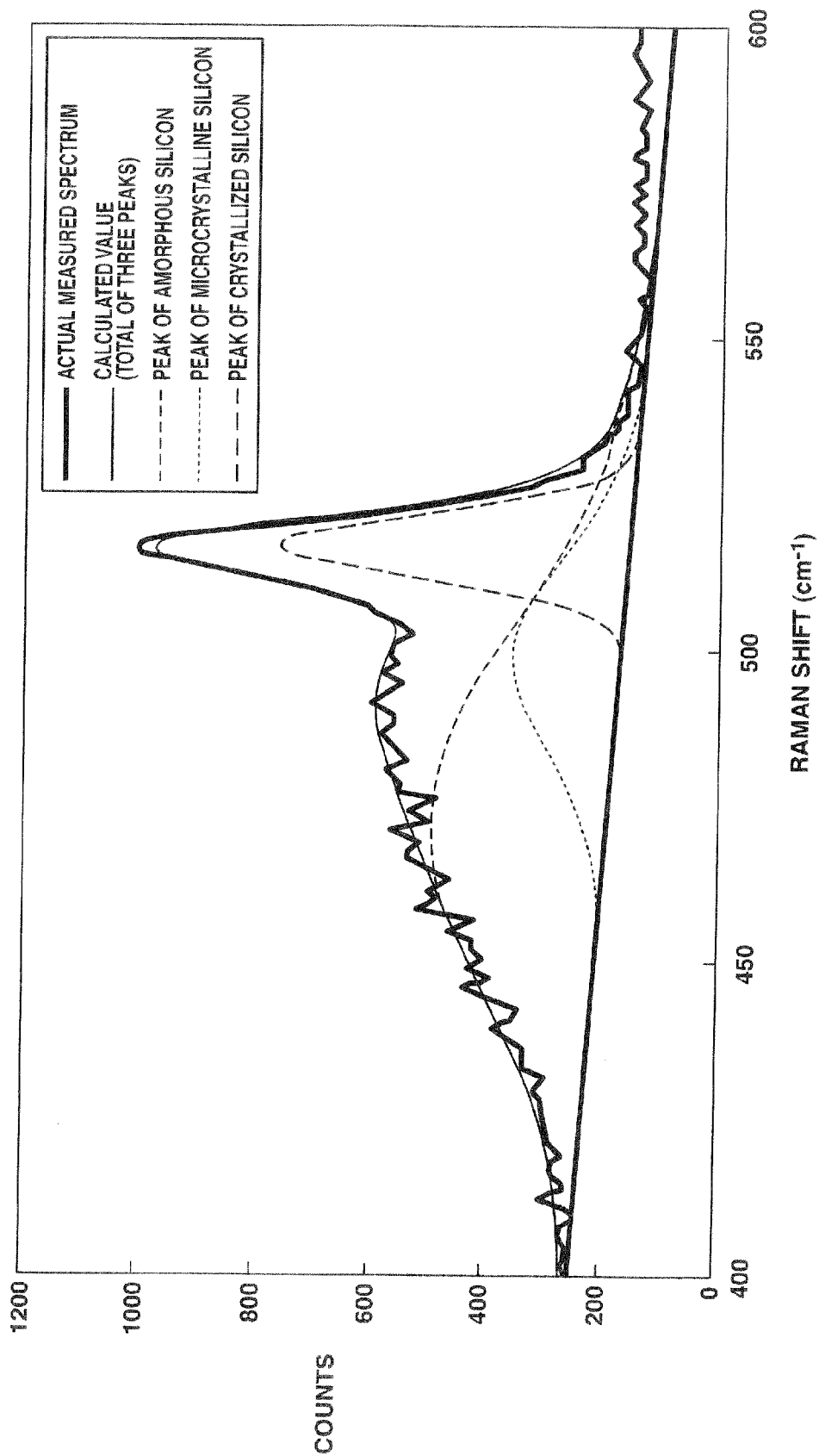
FIG. 61 is a diagram for explaining a method of measuring degree of crystallization of a semiconductor by Raman spectrometric method.

The spectrum of the silicon thin film of the first silicon layer 91 and the second silicon layer 92 which is the object of measurement can be represented by combining, for example, as shown in FIG. 61, each component spectrum, in other words, each spectrum of amorphous silicon, very minute crystalline silicon of the grain boundary or with a crystal diameter of 5 nm or less, and crystallized silicon, at a certain ratio. By obtaining the certain ratio by well known methods of analysis, the degree of crystallization d (%) can be obtained. The degree of crystallization d (%) can be calculated by the following formula I when the intensity of the component spectrum of the amorphous silicon is the intensity of the component spectrum of the very minute crystalline silicon of the grain boundary or with a crystal diameter of 5 nm or less is $I_{uc\text{-}Si}$ and the intensity of the component spectrum of the crystallized silicon is $I_{c\text{-}Si}$, included in a spectrum of a silicon thin film.

$$d(\%)=(I_{c\text{-}Si}+I_{uc\text{-}Si})/(I_{c\text{-}Si}+I_{uc\text{-}Si}+I_{a\text{-}Si})\times 100 \qquad (1)$$

The higher the degree of crystallization d (%) is, the more crystallized silicon is included in the silicon thin film. Here, for example, when the degree of crystallization is 20% or more, it is defined to be a microcrystalline silicon thin film, and when the degree of crystallization is less than 20%, it is defined to be an amorphous silicon thin film.

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using $N_2O$ gas, setting the gas flow rate to 2000 [SCCM], setting the power density to 0.356 [W/cm$^2$] and setting the pressure to 80 [Pa]. In the plasma processing, $N_2O$ gas is used, however, instead of $N_2O$ gas, oxygen gas or hydrogen gas can be used under suitable conditions.

Moreover, as shown in FIG. 8A and FIG. 8B, the protective insulating layer 9d such as silicon nitride is formed on the semiconductor layer 9b (second silicon layer 92) by the CVD method, etc.

Next, as shown in FIG. 9A and FIG. 9B, the protective insulating layer 9d is patterned by photolithography, etching, etc. and the protective insulating film 6d of the driving transistor 61 and the protective insulating film 5d of the switch transistor 51, which cover the region which is to be the channel on the semiconductor layer 9b, are formed.

Here, since the first silicon layer 91 is covered by the second silicon layer 92, when the protective insulating layer 9d is patterned by etching, the first silicon layer 91 is not subjected to the etching environment, and therefore, the first silicon layer 91 of the semiconductor layer 9b does not receive damage such as reduction of film.

For example, conventionally, in a structure where the semiconductor layer is a single layer of a crystalline silicon (specifically microcrystalline silicon), since there are many uneven portions on the surface of the semiconductor layer, when dry etching is performed to form the channel protective film on the channel forming region of the semiconductor layer, the etching gas may pass the sunken portion of the crystalline silicon and reach the first insulating film under the semiconductor layer, and a portion of the first insulating film may be scraped. When a portion of the first insulating film is scraped and the impurity semiconductor film and the source-drain electrode are layered on the semiconductor layer with crystalline silicon with many uneven portions, a thin film transistor with a normal structure cannot be formed, a defect may occur in the electric current path between the source electrode and the drain electrode and a problem such as conduction trouble may occur.

According to the semiconductor layer 9b of the present embodiment, the second silicon layer 92 of the amorphous silicon thin film is layered on the first silicon layer 91 of the microcrystalline silicon thin film, and the unevenness of the first silicon layer 91 is covered. Therefore, the semiconductor layer 9b and the first insulating film 11 are not damaged by etching and the protective insulating film 6d of the driving transistor 61 and the protective insulating film 5d of the switch transistor 51 can be favorably formed.

Next, as shown in FIG. 10A and FIG. 10B, the impurity semiconductor layer 9f which is to be the impurity semiconductor film is formed by sputtering or CVD method on the semiconductor layer 9b on which the protective insulating films 6d and 5d are formed.

The material used as the impurity semiconductor layer 9f is different according to whether the switch transistor 51 and the driving transistor 61 are p-type or n-type.

In a p-type transistor (p(Si), the layer is formed by forming a film of plasma mixing an acceptor type impurity such as diborane, etc. in SiH4 gas.

In an n-type transistor (n(Si), the layer is formed by forming a film of plasma by mixing a donor type impurity such as arsine, phosphine, etc. in the SiH4 gas.

Figure 11A:
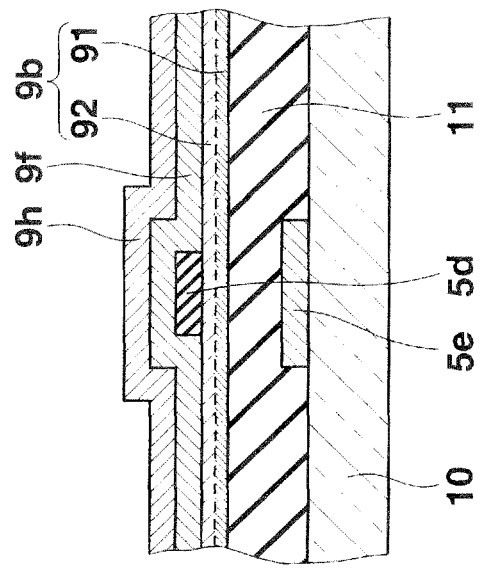
FIG. 11A is an explanatory diagram showing a manufacturing step of a thin film transistor of the first embodiment.
Figure 11B:
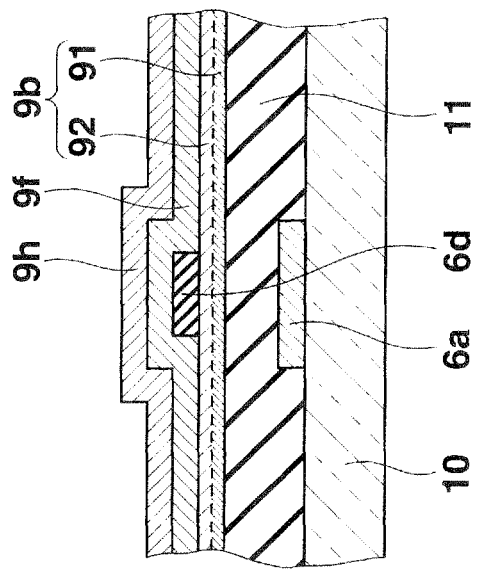
FIG. 11B is an explanatory diagram showing a manufacturing step of a thin film transistor of the first embodiment.

Next, as shown in FIG. 11A and FIG. 11B, the conducting film 9h which is to be the source electrode and the drain electrode is formed by, for example, sputtering on the impurity semiconductor layer 9f.

Next, as shown in FIG. 12A and FIG. 12B, the conducting film 9h is patterned by photolithography, etching, etc. and the source electrode 6i and the drain electrode 6h of the driving transistor 61, the source electrode 5i and the drain electrode 5h of the switch transistor 51 are formed, and moreover, the scanning line 2, the voltage supplying line 4, and the electrode 7b of the capacitor 7 are also formed. (see FIG. 4 to FIG. 6).

Figure 13A:
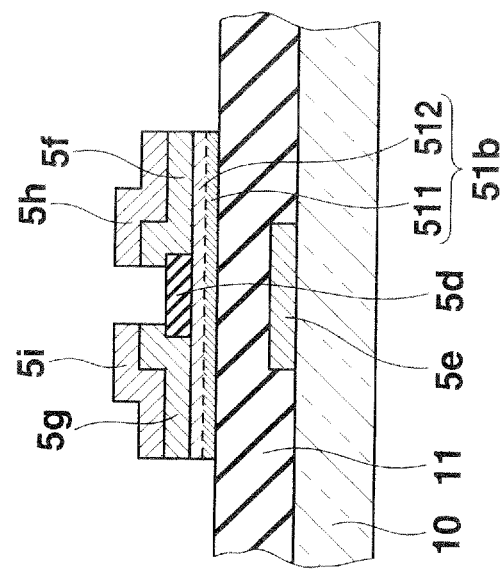
FIG. 13A is an explanatory diagram showing a manufacturing step of a thin film transistor of the first embodiment.
Figure 13B:
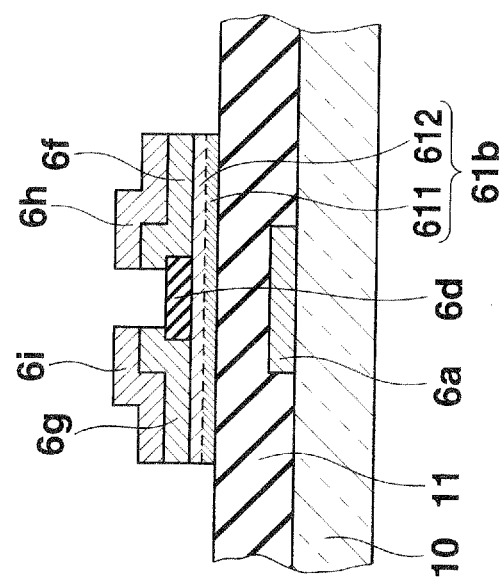
FIG. 13B is an explanatory diagram showing a manufacturing step of a thin film transistor of the first embodiment.

Next, as shown in FIG. 13A and FIG. 13B, the source electrode 6i and the drain electrode 6h and the source electrode 5i and the drain electrode 5h are used as a mask and the impurity semiconductor layer 9f and the semiconductor layer 9b are patterned by dry etching and the impurity semiconductor films 6f and 6g and the first semiconductor film 61b, and the impurity semiconductor films 5f and 5g and the second semiconductor film 51b are formed.

The first semiconductor film 61b includes the first region 611 and the second region 612 and the second semiconductor film 51b includes the first region 511 and the second region 512.

Figure 14B:
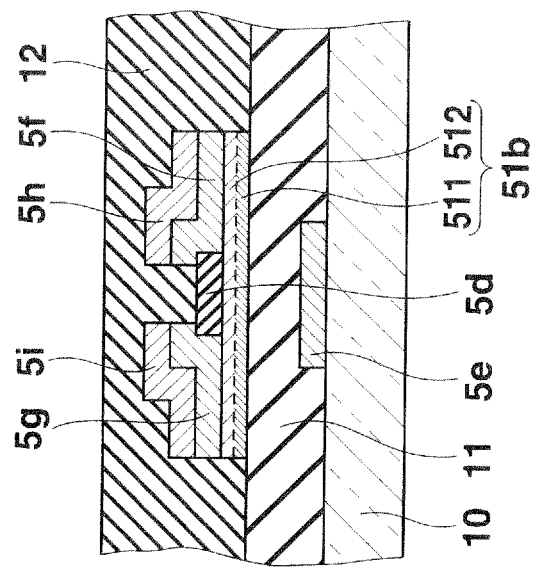
FIG. 14B is an explanatory diagram showing a manufacturing step of a thin film transistor of the first embodiment.
Figure 14A:
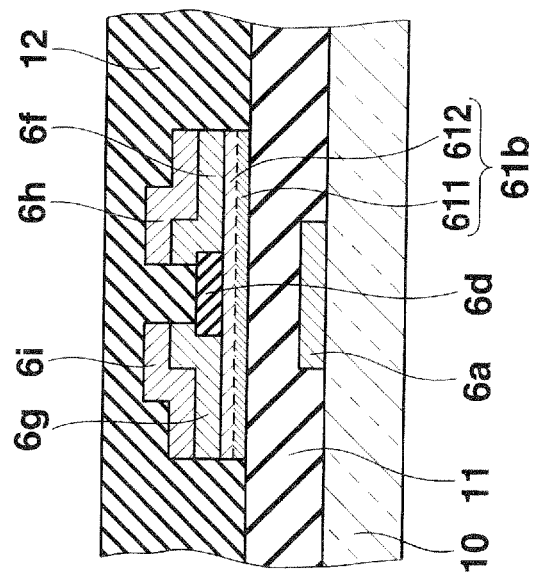
FIG. 14A is an explanatory diagram showing a manufacturing step of a thin film transistor of the first embodiment.

Next, as shown in FIG. 14A and FIG. 14B, the second insulating film 12 which covers the source electrode 6i and the drain electrode 6h of the driving transistor 61 and the source electrode 5i and the drain electrode 5h of the switch transistor 51 is formed. On the second insulating film 12, a groove to expose the scanning line 2 and the voltage supplying line 4 is formed.

Before forming the second insulating film 12, the pixel electrode 8a conducted with the source electrode 6i of the driving transistor 61 is formed (see FIG. 5). Alternatively, a contact hole can be formed in the second insulating film 12 after the second insulating film 12 is formed, and the pixel electrode 8a can be formed on the second insulating film 12 and in the contact hole so that the pixel electrode 8a is conducted with the source electrode 6i of the driving transistor 61 through the contact hole.

Figure 15B:
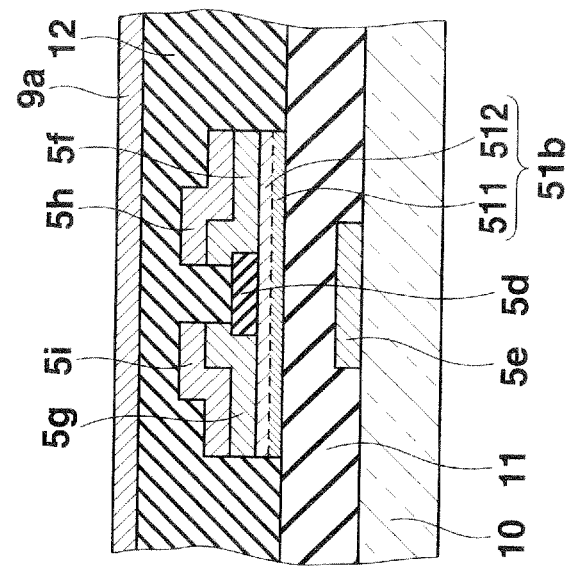
FIG. 15B is an explanatory diagram showing a manufacturing step of a thin film transistor of the first embodiment.
Figure 15A:
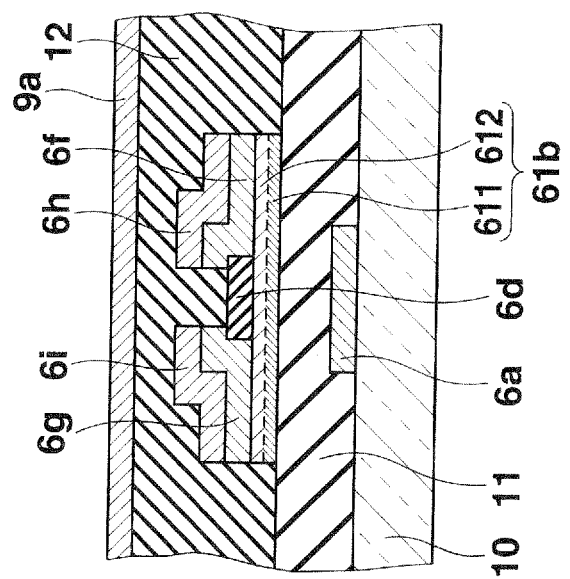
FIG. 15A is an explanatory diagram showing a manufacturing step of a thin film transistor of the first embodiment.

Next, as shown in FIG. 15A and FIG. 15B, a gate metal layer 9a of, for example, a Cr film, an Al film, a Cr/Al laminated film, an AlTi alloy film or an AlTiNd alloy film, etc. is formed by sputtering, etc. on the second insulating film 12 and in the groove where the scanning line 2 and the voltage supplying line 4 are exposed.

Figure 16B:
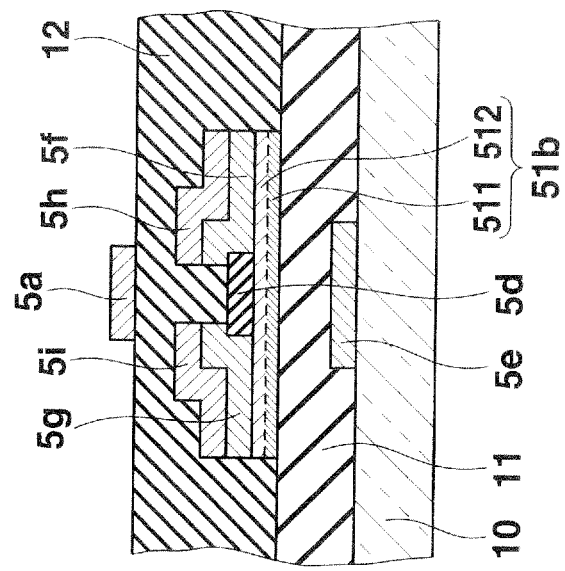
FIG. 16B is an explanatory diagram showing a manufacturing step of a thin film transistor of the first embodiment.
Figure 16A:
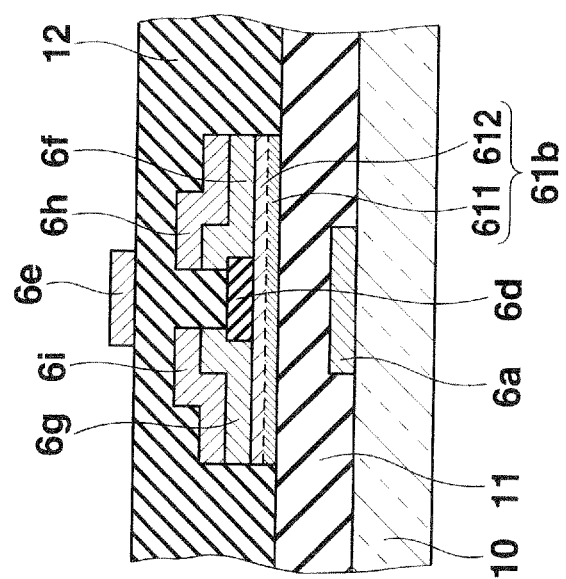
FIG. 16A is an explanatory diagram showing a manufacturing step of a thin film transistor of the first embodiment.

Next, as shown in FIG. 16A and FIG. 16B, the gate metal layer 9a is patterned using photolithography, etching, etc. and the second gate electrode 5a of the switch transistor 51 and the first light blocking film 6e of the driving transistor 61 are formed. The conducting layer 2a and the conducting layer 4a are formed with the second gate electrode 5a and the first light blocking film 6e (see FIG. 4).

Figure 17B:
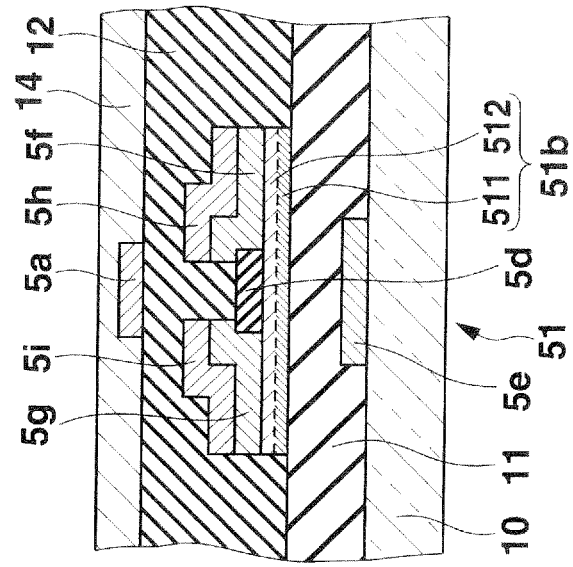
FIG. 17B is an explanatory diagram showing a manufacturing step of a thin film transistor of the first embodiment.
Figure 17A:
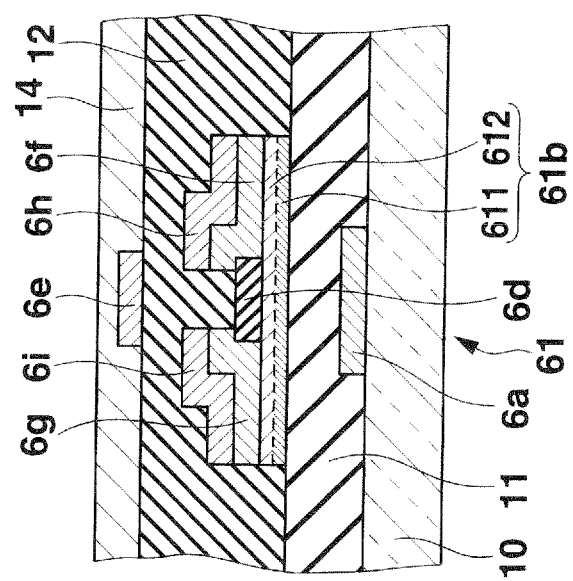
FIG. 17A is an explanatory diagram showing a manufacturing step of a thin film transistor of the first embodiment.

Next, as shown in FIG. 17A and FIG. 17B, the passivation film 14 such as silicon nitride covering the second gate electrode 5a and the first light blocking film 6e is formed on the second insulating film 12.

With this, the driving transistor 61 and the switch transistor 51 are manufactured.

Moreover, an opening section 12a which exposes the center section of the pixel electrode 8a is formed by patterning the passivation film 14 and the second insulating film 12 using photolithography (see FIG. 5).

Next, after accumulating photosensitive resin such as polyimide, a bank 13 in a shape such as a grid like shape, which includes an opening section 13a to expose the pixel electrode 8a, is formed by exposing light (see FIG. 5).

Next, a liquid body in which material which is to be the hole injecting layer 8b is dissolved or dispersed in a solvent is applied in the opening section 13a of the bank 13, and the liquid body is dried to form the hole injecting layer 8b which is a carrier transport layer. Then, a liquid body in which material which is to be the light emitting layer 8c is dissolved or dispersed in a solvent is applied in the opening section 13a of the bank 13 on the hole injecting layer 8b, and the liquid body is dried to form the light emitting layer 8c (see FIG. 5).

Next, the counter electrode 8d is formed on an entire surface of the bank 13 and the light emitting layer 8c to manufacture the EL element 8 (see FIG. 5) and the EL panel 1 is manufactured.

As described above, when the driving transistor 61 which is the first thin film transistor of the bottom gate structure, and the switch transistor 51 which is the second thin film transistor of the top gate structure are formed, the step to form the first gate electrode 6a of the driving transistor 61 and the second light blocking film 5e of the switch transistor 51 between the substrate 10 and the first insulating film 11 is a different step from the step to form the second gate electrode 5a of the switch transistor 51 and the first light blocking film 6e of the driving transistor 61 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 6a and the first light blocking film 6e of the driving transistor 61 and the step to form the second gate electrode 5a and the second light blocking film 5e of the switch transistor 51, the driving transistor 61 and the switch transistor 51 can be formed differently.

According to the manufacturing method of the transistor structure 561 which forms the transistor structure 561 with common manufacturing steps other than the first gate electrode 6a of the driving transistor 61 and the second gate electrode 5a of the switch transistor 51, the driving transistor 61 and the switch transistor 51 can be formed differently reducing the number of steps for manufacturing and blocking light which may cause improper operation.

The first light blocking film 6e of the driving transistor 61 is formed with the second gate electrode 5a of the switch transistor 51 and the second light blocking film 5e of the switch transistor 51 is formed with the first gate electrode 6a of the driving transistor 61. Therefore, the driving transistor 61 including the first light blocking film 6e and the switch transistor 51 including the second light blocking film 5e can be formed differently without increasing the number of steps for manufacturing.

In the second semiconductor film 51b of the switch transistor 51, since the second region 512 is positioned on the second gate electrode 5a side, the second region 512 which is the region in the second semiconductor film 51b including more amorphous silicon is to be the electric current path of the channel, and the switch transistor 51 includes the function corresponding to the thin film transistor including the semiconductor film including amorphous silicon. The switch transistor 51 suitably functions as the thin film transistor which controls the on/off of the driving transistor 61.

In the first semiconductor film 61b of the driving transistor 61, since the first region 611 is positioned on the first gate electrode 6a side, the first region 611 which is the region in the first semiconductor film 61b including more crystalline silicon is to be the electric current path of the channel, and the driving transistor 61 includes the function corresponding to the thin film transistor including the semiconductor film including crystalline silicon. The driving transistor 61 suitably functions as the thin film transistor to flow electric current in the EL element 8 by control of the switch transistor 51.

As described above, the driving transistor 61 and the switch transistor 51 include different transistor characteristics, and each transistor exhibit each function so that the EL panel 1 can emit light favorably.

The second light blocking film 5e provided in the switch transistor 51 is positioned so that the channel region of the second semiconductor film 51b is between the second light blocking film 5e and the second gate electrode 5a. Therefore, the second light blocking film 5e and the second gate electrode 5a can block light propagating from outside the switch transistor 51, and it is difficult for the light to reach the channel region of the second semiconductor film 51b.

Similarly, the first light blocking film 6e provided in the driving transistor 61 is positioned so that the channel region of the first semiconductor film 61b is positioned between the first light blocking film 6e and the first gate electrode 6a. Therefore, the first light blocking film 6e and the first gate electrode 6a can block light propagating from outside the driving transistor 61, and it is difficult for the light to reach the channel region of the first semiconductor film 61b.

As a result, a leak current hardly occurs in the switch transistor 51 and the driving transistor 61 and the transistor characteristic becomes stable. Therefore, the switch transistor 51 and the driving transistor 61 can function preferably.

Moreover, the second light blocking film 5e is connected to the ground line 33 and set to the ground potential and the second light blocking film 5e and the second gate electrode 5a can block an unnecessary electric field which occurs toward the channel region of the second semiconductor film 51b by an element outside the switch transistor 51. Therefore, the switch transistor 51 can operate normally with a suitable voltage between the second gate electrode 5a and the source electrode 5i and a voltage between the drain electrode 5h and the source electrode 5i.

Moreover, the first light blocking film 6e is connected to the ground line 33 and is grounded and the first light blocking film 6e and the first gate electrode 6a can block an unnecessary electric field which occurs toward the channel region of the first semiconductor film 61b by an element outside the driving transistor 61. Therefore, the driving transistor 61 can operate normally with a suitable voltage between the first gate electrode 6a and the source electrode 6i and a voltage between the drain electrode 6h and the source electrode 6i. Specifically, by suppressing the reduction of driving current of the driving transistor 61, the function of the driving transistor 61 can be preferably maintained and the EL element 8 can emit light preferably.

In the above configuration, the configuration includes a ground line 33 set at ground potential and the second light blocking film 5e and the first light blocking film 6e are connected to the ground line 33 and set at ground potential, however, the configuration is not limited to the above.

The configuration can be without the ground line 33 and the second light blocking film 5e and the first light blocking film 6e do not have to be connected to any component. In this case, the above function of shielding the electric field cannot be obtained, however, the above light blocking effect can be similarly obtained.

When the protective insulating film 6d of the driving transistor 61 and the protective insulating film 5d of the switch transistor 51 is formed, the second silicon layer 92 (second region 612) including more amorphous silicon than the first silicon layer 91 covers the first silicon layer 91 (first region 611) including more crystalline silicon than the second silicon layer 92, and therefore the semiconductor layer 9b is not damaged.

The first semiconductor film 61b of the driving transistor 61 and the second semiconductor film 51b of the switch transistor 51 can be suitably formed without damage and the driving transistor 61 and the switch transistor 51 can function favorably.

Second Embodiment

Next, the EL panel and the transistor structure of the second embodiment of the present invention are described. The same reference numerals are applied to the components which are similar to the above embodiment and the description is omitted.

Figure 18:
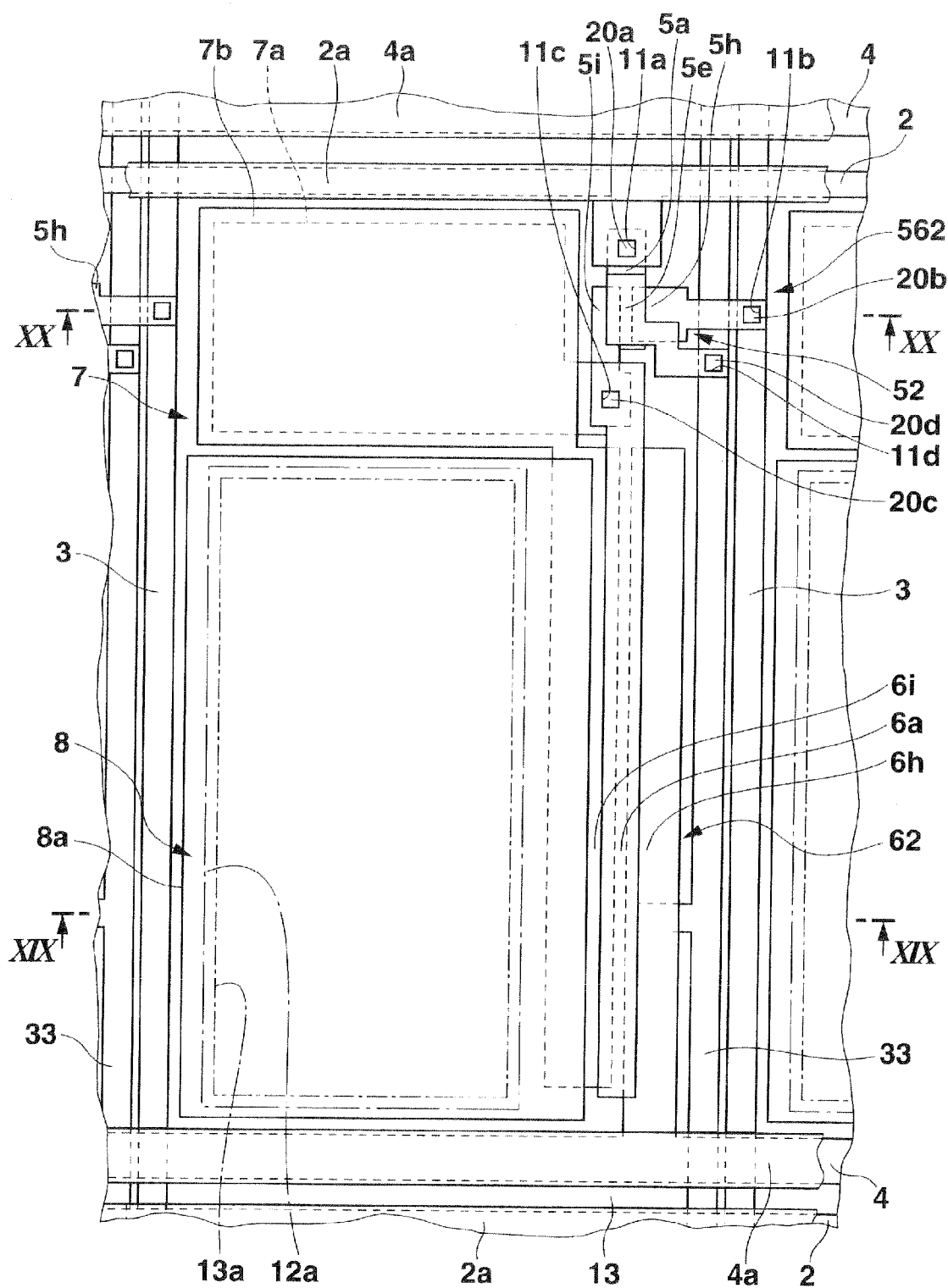
FIG. 18 is a planar view showing one pixel of an EL panel of the second embodiment.
Figure 19:
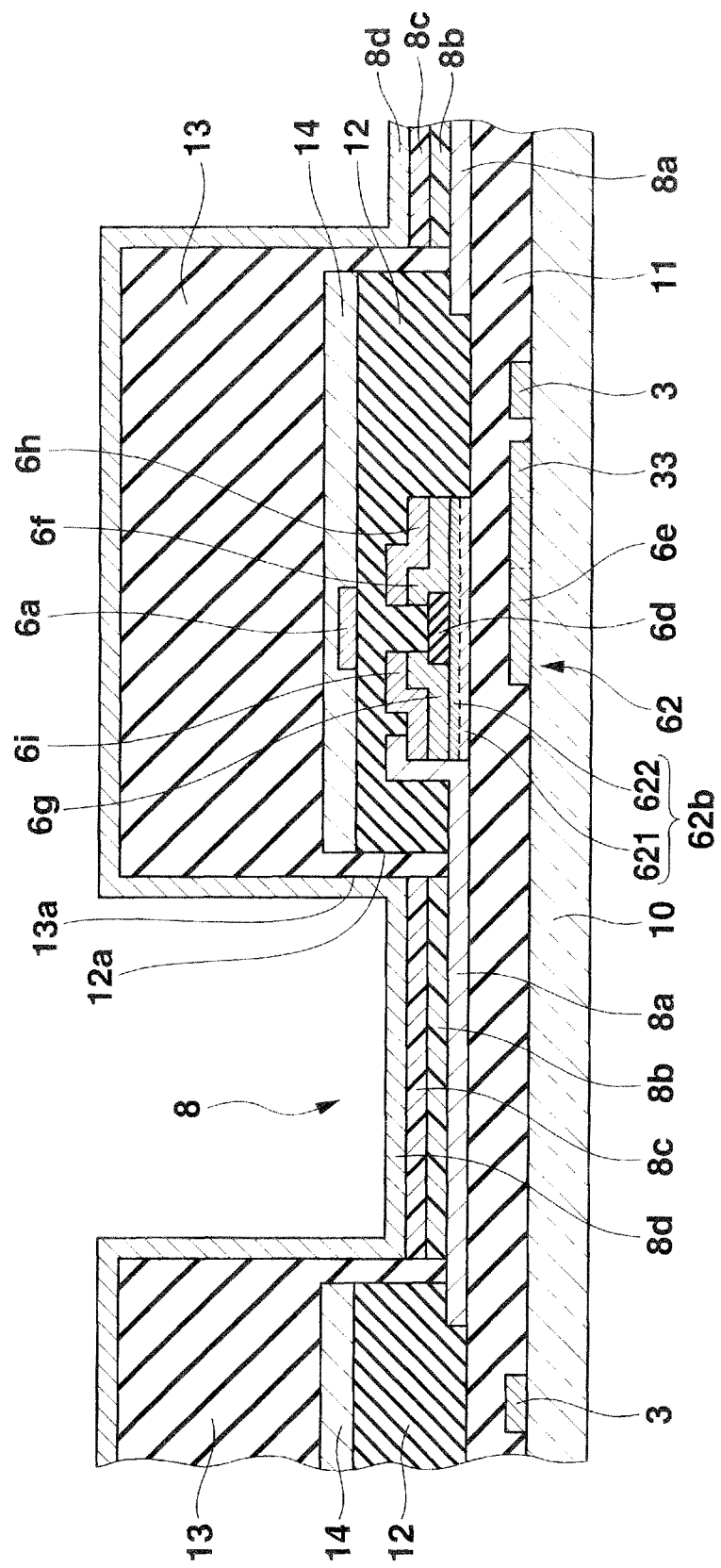
FIG. 19 is a cross sectional view of a plane along arrows XIX-XIX shown in FIG. 18.
Figure 20:
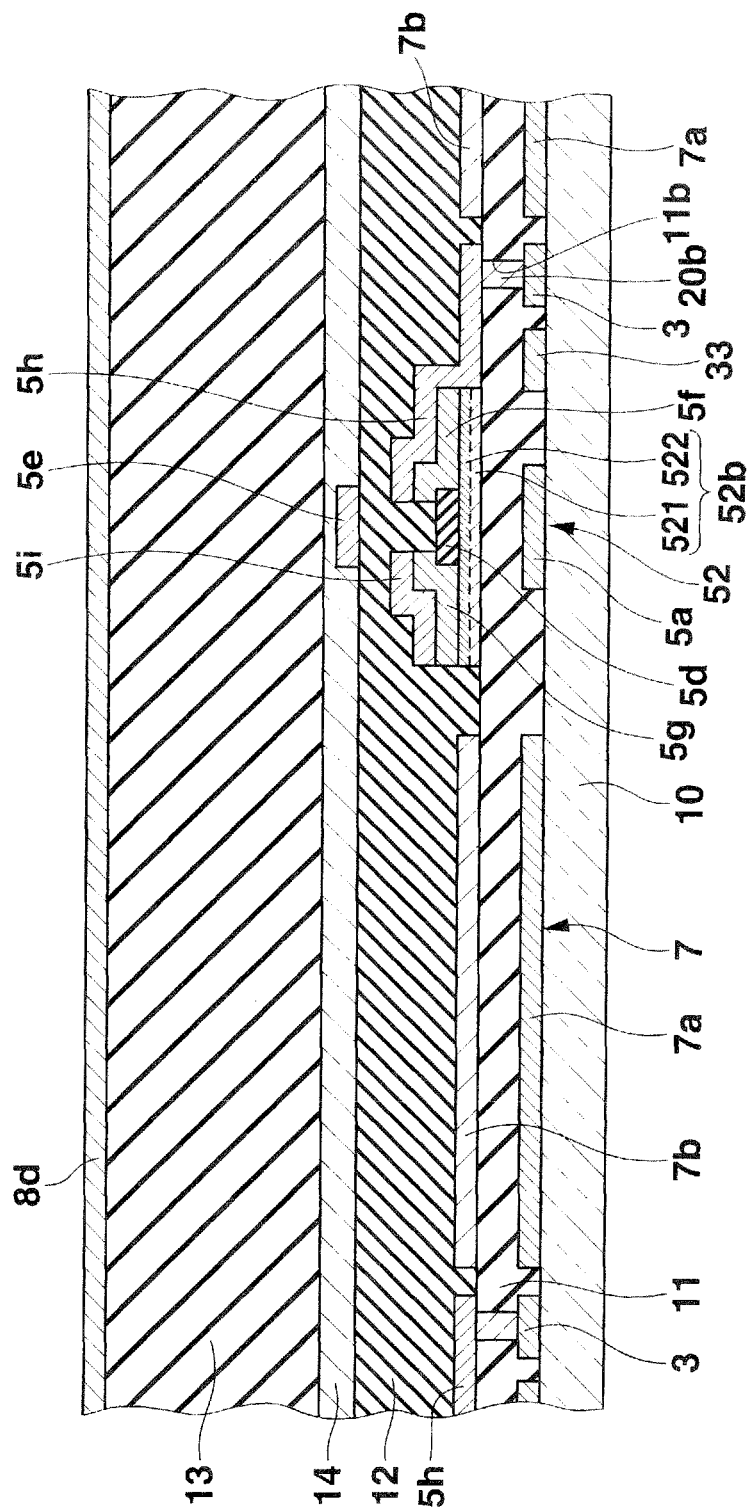
FIG. 20 is a cross sectional view of a plane along arrows XX-XX shown in FIG. 18.

Next, the configuration of the EL panel 1 of the second embodiment and the pixel P is described using FIG. 18 to FIG. 20.

FIG. 18 is a planar view corresponding to one pixel P of the EL panel 1 of the second embodiment.

FIG. 19 is a cross sectional view of a plane along arrows XIX-XIX shown in FIG. 18.

FIG. 20 is a cross sectional view of a plane along arrows XX-XX shown in FIG. 18.

FIG. 18 mainly shows electrodes and lines.

As shown in FIG. 18, each pixel P includes a transistor structure 562 including a switch transistor 52 and a driving transistor 62.

The switch transistor 52 and the driving transistor 62 each correspond to the switch transistor 5 and the driving transistor 6 shown in FIG. 3.

The switch transistor 52 and the driving transistor 62 are arranged along the signal line 3, the capacitor 7 is positioned near the switch transistor 52 and the EL element 8 is positioned near the driving transistor 62.

In each pixel P, the switch transistor 52, the driving transistor 62, the capacitor 7 and the EL element 8 are positioned between the scanning line 2 and the voltage supplying line 4.

As shown in FIG. 18 to FIG. 20, a first gate electrode 5a is provided on the substrate 10, and a first insulating film 11 is formed on an upper surface of the substrate 10 so as to cover the first gate electrode 5a.

On the first insulating film 11, a first semiconductor film 52b and a second semiconductor film 62b, a pair of impurity semiconductor films 5f and 5g, a pair of impurity semiconductor films 6f and 6g, and drain electrodes 5h and 6h and source electrodes 5i and 6i are each formed on a predetermined position.

A second insulating film 12 is formed so as to cover the drain electrodes 5h and 6h and the source electrodes 5i and 6i.

A second gate electrode 6a is provided on the second insulating film 12 and a passivation film 14 is formed on the upper surface of the second insulating film 12 so as to cover the second gate electrode 6a.

Regarding the first semiconductor film 52b, a first gate electrode 5a is positioned on one face side (bottom side in the figure) facing the first semiconductor film 52b with the first insulating film 11 in between, and a first light blocking film 5e is positioned on the other face side (top side in the figure) facing the first semiconductor film 52b with the second insulating film 12 in between.

Regarding the second semiconductor film 62b, a second light blocking film 6e is positioned on one face side (bottom side in the figure) facing the second semiconductor film 62b with the first insulating film 11 in between, and a second gate electrode 6a is positioned on the other face side (top side in the figure) facing the second semiconductor film 62b with the second insulating film 12 in between.

The signal line 3 is formed between the substrate 10 and the first insulating film 11.

A ground line 33 set at ground potential is formed along the signal line 3 between the substrate 10 and the first insulating film 11.

The scanning line 2 is formed on the first insulating film 11. On the second insulating film 12 covering above the scanning line 2, a groove is formed along the scanning line 2. In the groove, a conducting layer 2a is provided covering the scanning line 2 so as to be in contact with the scanning line 2 and the scanning line 2 and the conducting layer 2a are conducted to aim for low resistance of the scanning line 2. The groove and the conducting layer 2a do not have to be included.

The voltage supplying line 4 is formed on the first insulating film 11. On the second insulating film 12 covering above the voltage supplying line 4, a groove is formed along the voltage supplying line 4. In the groove, a conducting layer 4a is provided covering the voltage supplying line 4 so as to be in contact with the voltage supplying line 4 and the voltage supplying line 4 and the conducting layer 4a are conducted. With this, there is an aim for low resistance of the voltage supplying line 4 and to stabilize the amount of electric current supplied to the EL element 8 through the driving transistor 62. The groove and the conducting layer 4a do not have to be included.

As shown in FIG. 18 and FIG. 20, the switch transistor 52 is a first thin film transistor with a bottom gate structure including an inversely staggered structure. The switch transistor 52 includes a first gate electrode 5a, a first semiconductor film 52b, a protective insulating film 5d, impurity semiconductor films 5f and 5g, a drain electrode 5h, a source electrode 5i, a first light blocking film 5e and the like.

The first gate electrode 5a is formed between the substrate 10 and the first insulating film 11. It is preferable that this first gate electrode 5a is formed from material selected from, for example, a Cr film, an Al film, a Cr/Al laminated film, an AlTi alloy film or an AlTiNd alloy film.

The first insulating film 11 is formed on the first gate electrode 5a and the first gate electrode 5a is covered by the first insulating film 11. The first insulating film 11 includes, for example, light permeability and includes silicon nitride or silicon oxide.

An intrinsic first semiconductor film 52b is formed in a position on the first insulating film 11 which corresponds with the first gate electrode 5a and the first semiconductor film 52b faces the first gate electrode 5a with the first insulating film 11 in between.

The first semiconductor film 52b includes, for example, crystalline silicon, specifically microcrystalline silicon and includes a first region 521 positioned on the first insulating film 11 side (first gate electrode 5a side) and a second region 522 positioned on the opposite surface side. Here, degree of crystallization of silicon of the second region 522 is formed higher than the first region 521. In other words, in the second region 522 of the first semiconductor film 52b, the degree of crystallization of silicon is relatively higher compared to the first region 521, and the rate of the crystalline silicon region is higher compared to the first region 521. In the first region 521 of the first semiconductor film 52b, the rate of the amorphous silicon region is high compared to the second region 522, and preferably, the first region 521 of the second semiconductor film 52b is a region with substantially only amorphous silicon. The channel is formed in the first semiconductor film 52b. A protective insulating film 5d is formed on a center section of the first semiconductor film 52b.

It is preferable that the protective insulating film 5d includes, for example, silicon nitride or silicon oxide.

On one edge section of the first semiconductor film 52b, an impurity semiconductor film 5f is formed so as to overlap with a portion of the protective insulating film 5d. On the other edge section of the first semiconductor film 52b, an impurity semiconductor film 5g is formed so as to overlap with a portion of the protective insulating film 5d. As described here, the impurity semiconductor films 5f and 5g are formed apart from each other on each edge side of the first semiconductor film 52b. The impurity semiconductor films 5f and 5g are n-type semiconductors including n-type impurity, however, it is not limited to the above, and when the switch transistor 52 is a p-type transistor, a p-type semiconductor can be used.

The drain electrode 5h is formed on the impurity semiconductor film 5f.

The source electrode 5i is formed on the impurity semiconductor film 5g.

It is preferable that the drain electrode 5h and the source electrode 5i are formed from material selected from, for example, a Cr film, an Al film, a Cr/Al laminated film, an AlTi alloy film, and an AlTiNd alloy film.

On the protective insulating film 5d, the drain electrode 5h and the source electrode 5i, a second insulating film 12 is formed, and the protective insulating film 5d, the drain electrode 5h, the source electrode 5i, etc. are covered by the second insulating film 12. The second insulating film 12 includes, for example, silicon nitride or silicon oxide.

The first light blocking film 5e is formed on the second insulating film 12 between the drain electrode 5h and the source electrode 5i below the protective insulating film 5d, in other words a position corresponding to a channel region of the first semiconductor film 52b. The first light blocking film 5e is formed in the same process as the second gate electrode 6a when the second gate electrode 6a of the driving transistor 62 is formed, and is formed from a material selected from a Cr film, an Al film, a Cr/Al laminated film, an AlTi alloy film, or an AlTiNd alloy film. A portion of the first light blocking film 5e is connected to the ground line 33 through a contact plug 20d. The first light blocking film 5e on the second insulating film 12 is covered by the passivation film 14.

With this, the switch transistor 52 is covered by the passivation film 14.

In the switch transistor 52, the first insulating film 11 functions as a gate insulating film, and a channel (channel region) is formed in the region of the first semiconductor film 52b covered by the protective insulating film 5d and acted on by the electric field of the first gate electrode 5a. The channel is formed in a first region 521 of the first semiconductor film 52b which is the first gate electrode 5a side of the first semiconductor film 52b, and the first region 521 constitutes the electric current path between the source electrode 5i and the drain electrode 5h.

The first region 521 of the first semiconductor film 52b is a semiconductor layer including more amorphous silicon and the switch transistor 52 which uses the first region 521 as the electric current path of the channel corresponds to a thin film transistor including a semiconductor film made from amorphous silicon (or a semiconductor film including amorphous silicon as a main component). In other words, the leak current is smaller in the amorphous silicon of the first region 521 of the switch transistor 52 compared to the crystalline silicon such as microcrystalline silicon and (electric current which flows in the semiconductor layer when on)/(electric current which flows in the semiconductor layer when off) is high. Therefore, the switch transistor 52 suitably functions as the switch transistor which controls the on/off of the driving transistor 62.

In the switch transistor 52, with respect to the channel region of the first semiconductor film 52b, a first gate electrode 5a is provided below facing the channel region of the first semiconductor film 52b and a first light blocking film 5e is provided above facing the channel region of the first semiconductor film 52b. With this, the first gate electrode 5a and the first light blocking film 5e can block propagating light such as light which enters from outside of the EL panel 1 and light emitted from the EL element 8 from reaching the channel region of the first semiconductor film 52b. As a result, a leak current hardly occurs in the switch transistor 52 and the transistor characteristic becomes stable. Therefore, the switch transistor 52 can function preferably.

Moreover, the first light blocking film 5e is connected to the ground line 33 and grounded and the first light blocking film 5e and the first gate electrode 5a can block an unnecessary electric field which occurs toward the channel region of the first semiconductor film 52b by an element outside the switch transistor 52. Therefore, the switch transistor 52 can operate normally with a suitable voltage between the first gate electrode 5a and the source electrode 5i and a voltage between the drain electrode 5h and the source electrode 5i.

As shown in FIG. 18 and FIG. 19, the driving transistor 62 is a second thin film transistor with a top gate structure including an inversely staggered structure. The driving transistor 62 includes a second gate electrode 6a, a second semiconductor film 62b, a protective insulating film 6d, impurity semiconductor films 6f and 6g, a drain electrode 6h, a source electrode 6i, a second light blocking film 6e and the like.

The second light blocking film 6e is formed in a position between the substrate 10 and the first insulating film 11 and a position corresponding to the channel region of the second semiconductor film 62b between the drain electrode 6h and the source electrode 6i. The second light blocking film 6e is formed in the same process as the first gate electrode 5a by patterning the conducting layer which is to be the first gate electrode 5a when the first gate electrode 5a of the switch transistor 52 is formed. The first gate electrode 5a and the second light blocking film 6e are formed from a material selected from a Cr film, an Al film, a Cr/Al laminated film, an AlTi alloy film, or an AlTiNd alloy film. A portion of the second light blocking film 6e is connected to the ground line 33.

The first insulating film 11 formed on the upper surface of the substrate 10 includes, for example, light permeability and includes silicon nitride or silicon oxide. The intrinsic second semiconductor film 62b is formed in a position on the first insulating film 11 corresponding to the second gate electrode 6a.

The second semiconductor film 62b includes, for example, crystalline silicon, specifically, microcrystalline silicon and includes a first region 621 positioned on the first insulating film 11 side and a second region 622 positioned on the opposite surface side (second gate electrode 6a side). Here, degree of crystallization of silicon of the second region 622 is formed higher compared to the first region 621. In other words, in the second region 622 of the second semiconductor film 62b, degree of crystallization of silicon is relatively higher compared to the first region 621, and the rate of the crystalline silicon region is higher compared to the first region 621. In the first region 621 of the second semiconductor film 62b, the rate of the amorphous silicon region is higher compared to the second region 622, and preferably the first region 621 of the first semiconductor film 62b is a region with substantially only amorphous silicon.

The first region 621 of the second semiconductor film 62b and the first region 521 of the first semiconductor film 52b have the same composition and have the same thickness. The second region 622 of the second semiconductor film 62b and the second region 522 of the first semiconductor film 52b have the same composition and have the same thickness. Therefore, as described later, the second semiconductor film 62b and the first semiconductor film 52b can be manufactured collectively with the same process using the semiconductor layer 9 which is a layer with the same material. The second semiconductor film 62b is a channel region where the channel is formed.

On a center section of the second semiconductor film 62b, the protective insulating film 6d is formed.

The protective insulating film 6d and the protective insulating film 5d are composed of the same material and have the same thickness, and preferably include, for example, silicon nitride or silicon oxide. Therefore, as described later, the protective insulating film 6d and the protective insulating film 5d can be manufactured collectively with the same process using the protective insulating layer 9d which is a layer with the same material.

On one edge section of the second semiconductor film 62b, the impurity semiconductor film 6f is formed so as to overlap with a portion of the protective insulating film 6d, and on the other edge section of the second semiconductor film 62b, the impurity semiconductor film 6g is formed so as to overlap with a portion of the protective insulating film 6d. As described here, the impurity semiconductor films 6f and 6g are formed apart from each other on each edge side of the second semiconductor film 62b. The impurity semiconductor films 6f and 6g are n-type semiconductors including n-type impurity, however it is not limited to the above, and when the switch transistor 52 and the driving transistor 62 are p-type transistors, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 6h and the source electrode 6i, and the drain electrode 5h and the source electrode 5i are composed of the same material and have the same thickness. As described later, the drain electrode 6h and the source electrode 6i, and the drain electrode 5h and the source electrode 5i can be manufactured collectively with the same process using the conducting film 9h which is a layer with the same material.

A second insulating film 12 is formed on the protective insulating film 6d, the drain electrode 6h and the source electrode 6i, and the protective insulating film 6d, the drain electrode 6h, the source electrode 6i, etc. are covered by the second insulating film 12.

The second gate electrode 6a is formed in a position on the second insulating film 12 corresponding to the protective insulating film 6d. It is preferable that the second gate electrode 6a is formed from material selected from, for example, a Cr film, an Al film, a Cr/Al laminated film, an AlTi alloy film and an AlTiNd alloy film. The second gate electrode 6a on the second insulating film 12 is covered by the passivation film 14.

The driving transistor 62 is covered by the passivation film 14. Therefore, the passivation film 14 covers both the switch transistor 52 and the driving transistor 62.

In the driving transistor 62, the second insulating film 12 and the protective insulating film 6d function as a gate insulating film, and a channel (channel region) is formed in the region of the second semiconductor film 62b covered by the protective insulating film 6d and acted on by the electric field of the second gate electrode 6a. The channel is formed in a second region 622 of the second semiconductor film 62b which is the second gate electrode 6a side of the second semiconductor film 62b, and the second region 622 constitutes the electric current path between the source electrode 6i and the drain electrode 6h.

The second region 622 of the second semiconductor film 62b is a semiconductor layer including more crystalline silicon than the first region 621. Therefore, the driving transistor 62 which uses the second region 622 as the electric current path of the channel corresponds to a thin film transistor including a semiconductor film made from crystalline silicon (or a semiconductor film including crystalline silicon as the main component). In other words, the microcrystalline silicon in the second region 622 of the driving transistor 62 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore the driving transistor 62 suitably functions as a driving transistor which flows electric current in the EL element 8 by control of the switch transistor 52.

In the driving transistor 62 with a top gate structure, the electric current path of the channel in the second region 622 of the second semiconductor film 62b is not on the interface side between the first region 621 but is on the interface side between the protective insulating film 6d nearer to the second gate electrode 6a. Since the interface side between the protective insulating film 6d has a higher degree of crystallization of silicon than the interface side between the first region 621 in the second region 622 of the second semiconductor film 62b, the region is suitable for the electric current path of the driving transistor 62.

This is because, since in the beginning of growth of the second region 622 including crystalline silicon, the crystallization of silicon is not stable, and the degree of crystallization of silicon on the interface side between the first region 621 in the second region 622 causes a relatively bad incubation layer, and in the second region 622 on the interface side between the protective insulating film 6d, a semiconductor film in which the crystallization of silicon is stable can be formed.

The second region 622 on the interface side between the protective insulating film 6d formed with stable crystallization of silicon is more suitable as an electric current path. Therefore, by forming the top gate structure of the driving transistor 62 with the second region 622 as the electric current path, the driving transistor 62 functions more suitably as a driving transistor.

In the driving transistor 62, with respect to the channel region of the second semiconductor film 62b, a second light blocking film 6e is provided below facing the channel region of the second semiconductor film 62b and a second gate electrode 6a is provided above facing the channel region of the second semiconductor film 62b. With this, the second light blocking film 6e and the second gate electrode 6a can block propagating light such as light which enters from outside of the EL panel 1 and light emitted from the EL element 8 from reaching the channel region of the second semiconductor film 62b. As a result, a leak current hardly occurs in the driving transistor 62 and the transistor characteristic becomes stable. Therefore, the driving transistor 62 can function preferably.

Moreover, the second light blocking film 6e is connected to the ground line 33 and is grounded and the second light blocking film 6e and the second gate electrode 6a can block an unnecessary electric field which occurs toward the channel region of the second semiconductor film 62b by an element outside the driving transistor 62. Therefore, the driving transistor 62 can operate normally with a suitable voltage between the second gate electrode 6a and the source electrode 6i and a voltage between the drain electrode 6h and the source electrode 6i.

The capacitor 7 is connected between the second gate electrode 6a and the source electrode 6i of the driving transistor 62. Specifically, the electrode 7a of the capacitor 7 is connected to the second gate electrode 6a of the driving transistor 62, and the electrode 7b of the capacitor 7 is connected to the source electrode 6i of the driving transistor 62.

Then, as shown in FIG. 18 and FIG. 20, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the ground line 33, the electrode 7a of the capacitor 7, the first gate electrode 5a of the switch transistor 52, and the second light blocking film 6e of the driving transistor 62 are collectively formed by processing the shape of a conducting film formed from conductive material formed on an entire surface of the substrate 10 by photolithography, etching, etc.

The scanning line 2, the voltage supplying line 4, the electrode 7b of the capacitor 7, the drain electrode 5h and the source electrode 5i of the switch transistor 52, and the drain electrode 6h and the source electrode 6i of the driving transistor 62 are collectively formed by processing the shape of a conducting film formed from conductive material formed on an entire surface of the first insulating film 11 by photolithography, etching, etc.

The first light blocking film 5e of the switch transistor 52, the second gate electrode 6a of the driving transistor 62, the conducting layer 4a layered on the voltage supplying line 4 and the conducting layer 2a layered on the scanning line 2 are collectively formed by processing the shape of a conducting film formed on an entire surface of the second insulating film 12 by photolithography, etching, etc.

On the first insulating film 11, a contact hole 11a is formed on a region where the first gate electrode 5a and the scanning line 2 overlaps, a contact hole 11b is formed on a region where the drain electrode 5h and the signal line 3 overlaps and a contact hole 11c is formed on a region where the second gate electrode 6a and the source electrode 5i overlaps.

The contact hole 11c is formed connected with the second insulating film 12 also. Contact plugs 20a to 20c are each implanted in the contact holes 11a to 11c.

The first gate electrode 5a of the switch transistor 52 and the scanning line 2 are electrically conducted by the contact plug 20a, the drain electrode 5h of the switch transistor 52 and the signal line 3 are electrically conducted by the contact plug 20b. The source electrode 5i of the switch transistor 52 and the electrode 7a of the capacitor 7 as well as the source electrode 5i of the switch transistor 52 and the second gate electrode 6a of the driving transistor 62 are electrically conducted by the contact plug 20c. The scanning line 2 can be conducted with the first gate electrode 5a by direct contact, the drain electrode 5h can be conducted with the signal line 3 by direct contact and the source electrode 5i can be conducted with the second gate electrode 6a by direct contact without using the contact plugs 20a to 20c.

In the first insulating film 11 and the second insulating film 12, a contact hole 11d is formed in a region where the first light blocking film 5e overlaps with the ground line 33, and a contact plug 20d is implanted in the contact hole 11d. The first light blocking film 5e and the ground line 33 are conducted by the contact plug 20d and the first light blocking film 5e is grounded.

The drain electrode 6h of the driving transistor 62 is connected as one with the voltage supplying line 4, and the source electrode 6i of the driving transistor 62 is connected as one with the electrode 7b of the capacitor 7.

As described above, the emission of light of the EL element 8 is controlled by driving and control of the transistor structure 562 including the switch transistor 52 and the driving transistor 62, and the emission of light of the EL panel 1 including the transistor structure 562 is controlled.

Next, the manufacturing method of the switch transistor 52 and the driving transistor 62 composing the transistor structure 562 in the EL panel 1 of the second embodiment of the present invention is described using FIG. 21A and FIG. 21B to FIG. 31A and FIG. 31B showing each process.

Regarding the switch transistor 52 and the driving transistor 62 shown in the diagram explaining each step, a portion of the shape, dimension and the like is different from the actual embodiment, such as in FIG. 18, however, to simplify explanation, each thin film transistor is shown to be the same size and the main section of each thin film transistor is schematically illustrated and explained. FIG. A of each figure shows the driving transistor 62 and FIG. B of each figure shows the switch transistor 52.

First, as shown in FIG. 21A and FIG. 21B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 5a of the switch transistor 52 and the second light blocking film 6e of the driving transistor 62. Moreover, together with the first gate electrode 5a and the second light blocking film 6e, the signal line 3, the ground line 33 and the electrode 7a of the capacitor 7 are formed on the substrate 10 (see FIG. 18 to FIG. 20).

Figure 22A:
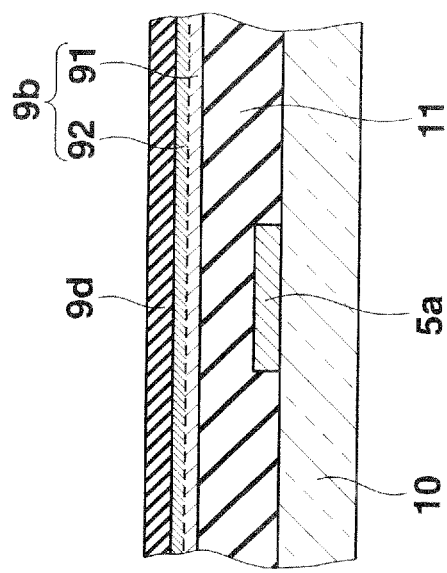
FIG. 22A is an explanatory diagram showing a manufacturing step of a thin film transistor of the second embodiment.
Figure 22B:
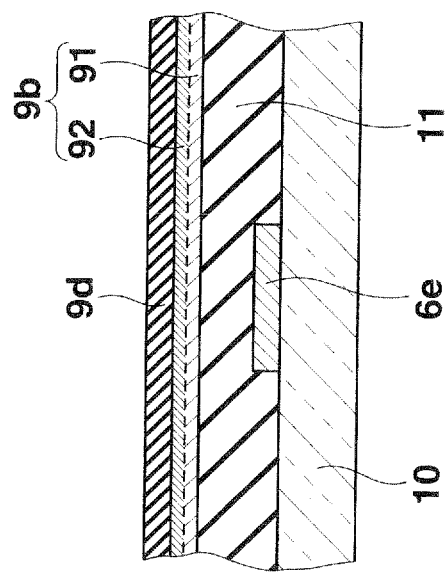
FIG. 22B is an explanatory diagram showing a manufacturing step of a thin film transistor of the second embodiment.

Next, as shown in FIG. 22A and FIG. 22B, the first insulating film 11 such as silicon nitride, etc. is formed by plasma CVD (PE-CVD).

Moreover, as shown in FIG. 22A and FIG. 22B, the semiconductor layer 9b including crystalline silicon is formed on the first insulating film 11 by plasma CVD. Here, when the semiconductor layer 9b which is to be the semiconductor film (52b, 62b) is formed, the first silicon layer 91 with a relatively low degree of crystallization of silicon is formed first, and then a second silicon layer 92 with a relatively high degree of crystallization of silicon is formed.

Specifically, by setting the ratio of the $H_2$ gas overwhelmingly lower compared to the $SiH_4$ gas and by making the plasma power and the pressure low, the first silicon layer 91 which is an amorphous silicon thin film is formed. Then, by setting the ratio of the $H_2$ gas overwhelmingly larger compared to the $SiH_4$ gas and by making the plasma power and the pressure large to raise the degree of crystallization, the second silicon layer 92 which is a microcrystalline silicon thin film is formed.

In the present embodiment, the second silicon layer 92 is formed under conditions of using argon as a carrier gas, setting the gas flow rate to $SiH_4/H_2=50/10500$ [SCCM], setting power density at 0.134 [W/cm$^2$] and setting the pressure at 300 [Pa].

The degree of crystallization of silicon of the first silicon layer 91 and the second silicon layer 92 in the semiconductor layer 9b (the first region and the second region in the semiconductor film) can be determined based on the degree of crystallization calculated by raman spectrophotometry as described above. For example, when the degree of crystallization is 20% or more, it is defined to be a microcrystalline silicon thin film, and when the degree of crystallization is less than 20%, it is defined to be an amorphous silicon thin film (see FIG. 61).

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using $H_2$ gas, setting the gas flow rate to 1000 [SCCM], setting the power density to 0.178 [W/cm$^2$] and setting the pressure to 80 [Pa].

Moreover, as shown in FIG. 22A and FIG. 22B, the protective insulating layer 9d such as silicon nitride is formed on the semiconductor layer 9b (second silicon layer 92) by the CVD method, etc.

Next, as shown in FIG. 23A and FIG. 23B, the protective insulating layer 9d is patterned by photolithography, etching, etc. and the protective insulating film 6d of the driving transistor 62 and the protective insulating film 5d of the switch transistor 52, which cover the region which is to be the channel on the semiconductor layer 9b, are formed.

Next, as shown in FIG. 24A and FIG. 24B, the impurity semiconductor layer 9f which is to be the impurity semiconductor film is formed by sputtering or CVD method on the semiconductor layer 9b on which the protective insulating films 6d and 5d are formed.

The material used as the impurity semiconductor layer 9f is different according to whether the switch transistor 52 and the driving transistor 62 are p-type or n-type.

In a p-type transistor (p$^+$Si), the layer is formed by forming a film of plasma mixing an acceptor type impurity such as diborane, etc. in $SiH_4$ gas.

In an n-type transistor (n$^+$Si), the layer is formed by forming a film of plasma by mixing a donor type impurity such as arsine, phosphine, etc. in the $SiH_4$ gas.

Figure 25A:
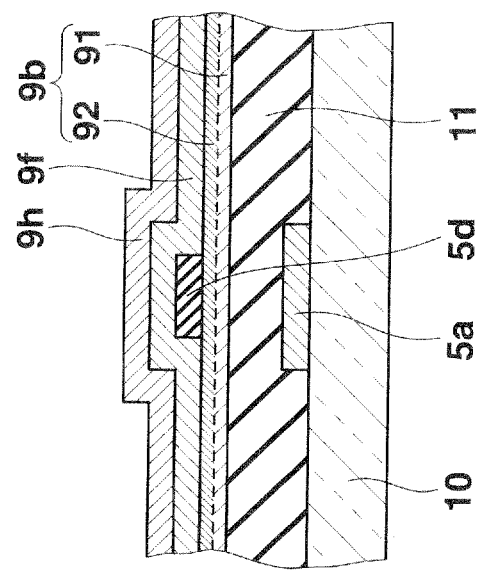
FIG. 25A is an explanatory diagram showing a manufacturing step of a thin film transistor of the second embodiment.
Figure 25B:
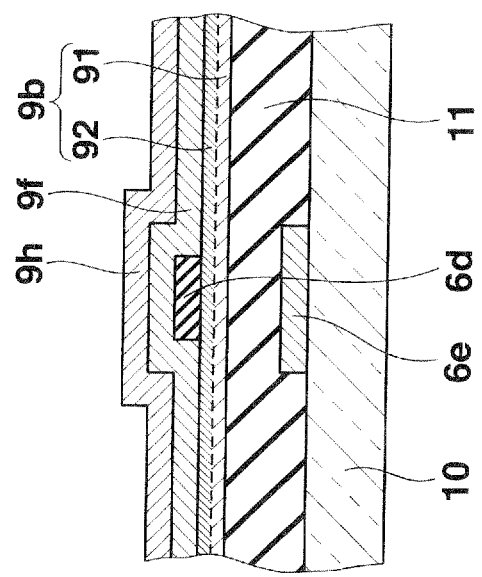
FIG. 25B is an explanatory diagram showing a manufacturing step of a thin film transistor of the second embodiment.

Next, as shown in FIG. 25A and FIG. 25B, the conducting film 9h which is to be the source electrode and the drain electrode is formed by, for example, sputtering on the impurity semiconductor layer 9f.

Figure 26A:
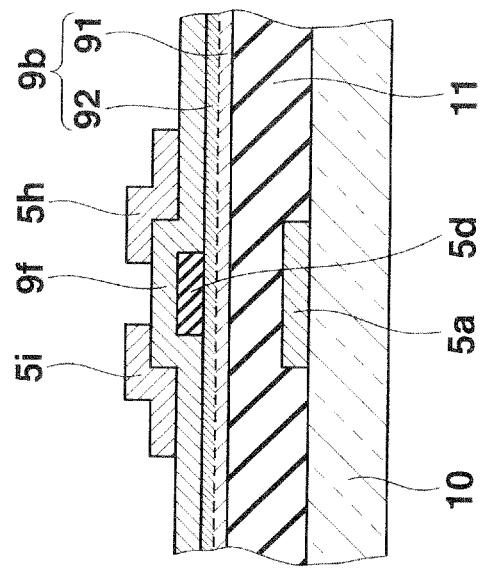
FIG. 26A is an explanatory diagram showing a manufacturing step of a thin film transistor of the second embodiment.
Figure 26B:
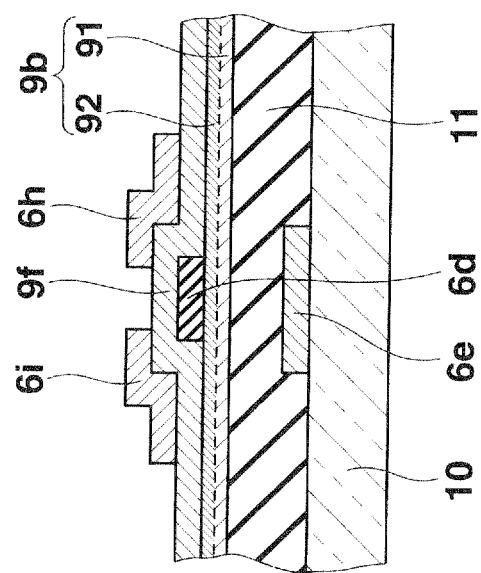
FIG. 26B is an explanatory diagram showing a manufacturing step of a thin film transistor of the second embodiment.

Next, as shown in FIG. 26A and FIG. 26B, the conducting film 9h is patterned by photolithography, etching, etc. and the source electrode 6i and the drain electrode 6h of the driving transistor 62, the source electrode 5i and the drain electrode 5h of the switch transistor 52 are formed, and moreover, the scanning line 2, the voltage supplying line 4, and the electrode 7b of the capacitor 7 are also formed. (see FIG. 18 to FIG. 20).

Figure 27A:
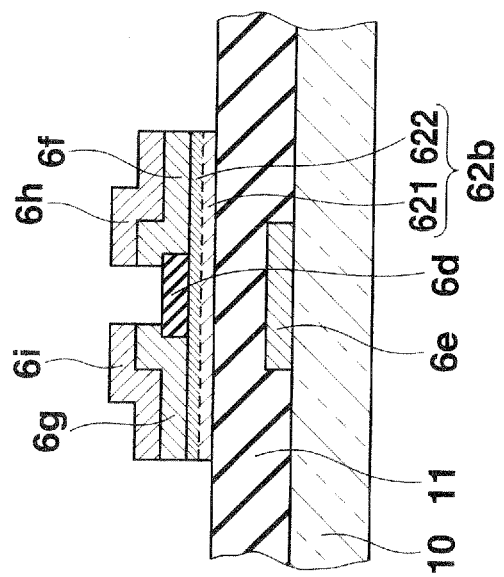
FIG. 27A is an explanatory diagram showing a manufacturing step of a thin film transistor of the second embodiment.
Figure 27B:
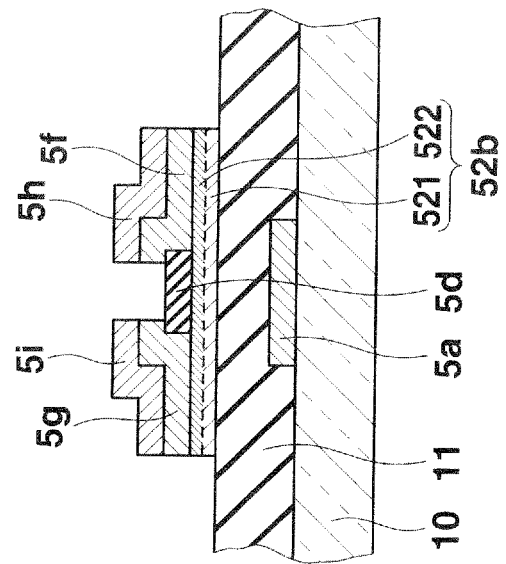
FIG. 27B is an explanatory diagram showing a manufacturing step of a thin film transistor of the second embodiment.

Next, as shown in FIG. 27A and FIG. 27B, the source electrode 6i and the drain electrode 6h and the source electrode 5i and the drain electrode 5h are used as a mask and the impurity semiconductor layer 9f and the semiconductor layer 9b are patterned by dry etching and the impurity semiconductor films 6f and 6g and the second semiconductor film 62b, and the impurity semiconductor films 5f and 5g and the first semiconductor film 52b are formed.

The second semiconductor film 62b includes the first region 621 and the second region 622 and the first semiconductor film 52b includes the first region 521 and the second region 522.

Figure 28B:
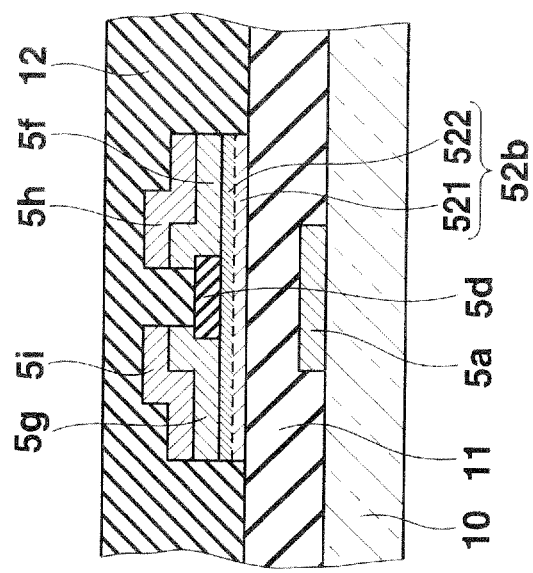
FIG. 28B is an explanatory diagram showing a manufacturing step of a thin film transistor of the second embodiment.
Figure 28A:
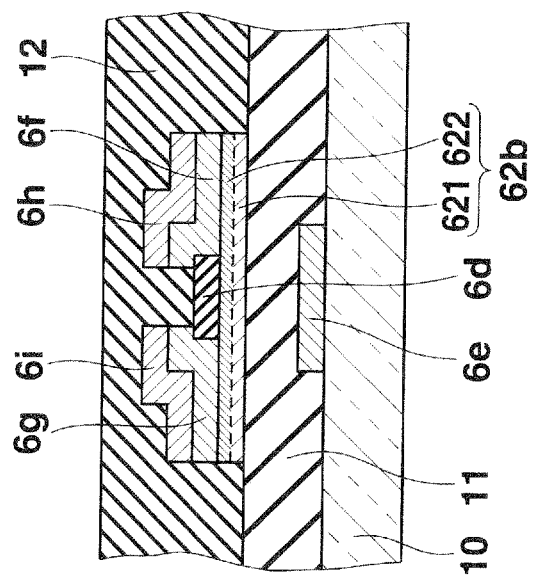
FIG. 28A is an explanatory diagram showing a manufacturing step of a thin film transistor of the second embodiment.

Next, as shown in FIG. 28A and FIG. 28B, the second insulating film 12 which covers the source electrode 6i and the drain electrode 6h of the driving transistor 62 and the source electrode 5i and the drain electrode 5h of the switch transistor 52 is formed.

Before forming the second insulating film 12, the pixel electrode 8a conducted with the source electrode 6i of the driving transistor 62 is formed (see FIG. 19).

Alternatively, a contact hole can be formed in the second insulating film 12 after the second insulating film 12 is formed, and the pixel electrode 8a can be formed on the second insulating film 12 and in the contact hole so that the pixel electrode 8a is conducted with the source electrode 6i of the driving transistor 62 through the contact hole.

Figure 29B:
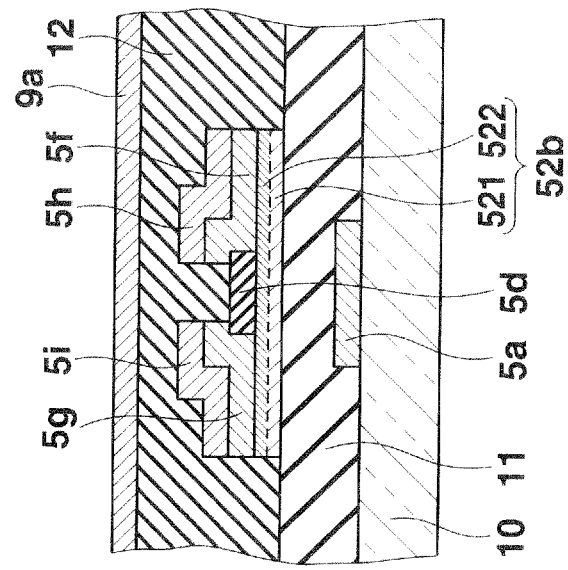
FIG. 29B is an explanatory diagram showing a manufacturing step of a thin film transistor of the second embodiment.
Figure 29A:
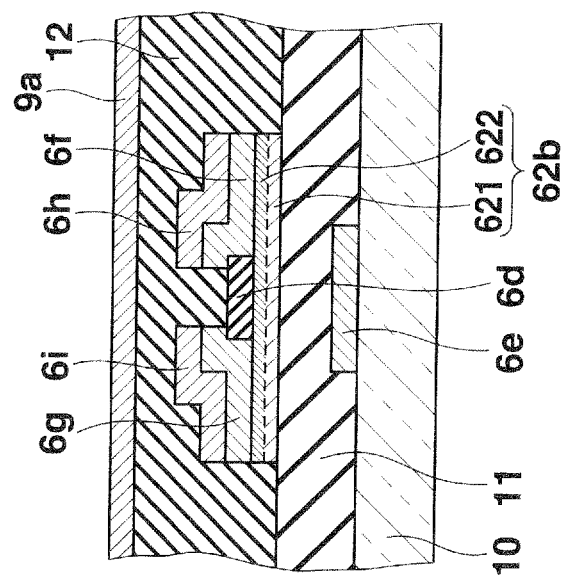
FIG. 29A is an explanatory diagram showing a manufacturing step of a thin film transistor of the second embodiment.

Next, as shown in FIG. 29A and FIG. 29B, a gate metal layer 9a of, for example, a Cr film, an Al film, a Cr/Al laminated film, an AlTi alloy film or an AlTiNd alloy film, etc. is formed by sputtering, etc. on the second insulating film 12.

Next, as shown in FIG. 30A and FIG. 30B, the gate metal layer 9a is patterned using photolithography, etching, etc. and the second gate electrode 6a of the driving transistor 62 and the first light blocking film 5e of the switch transistor 52 are formed. The conducting layer 2a and the conducting layer 4a are formed with the second gate electrode 6a and the first light blocking film 5e (see FIG. 18).

Next, as shown in FIG. 31A and FIG. 31B, the passivation film 14 such as silicon nitride covering the second gate electrode 6a and the first light blocking film 5e is formed on the second insulating film 12.

With this, the driving transistor 62 and the switch transistor 52 are manufactured.

Moreover, an opening section 12a which exposes the center section of the pixel electrode 8a is formed by patterning the passivation film 14 and the second insulating film 12 using photolithography (see FIG. 19).

Next, after accumulating photosensitive resin such as polyimide, a bank 13 in a shape such as a grid like shape which includes an opening section 13a to expose the pixel electrode 8a is formed by exposing light (see FIG. 19).

Next, a liquid body in which material which is to be the hole injecting layer 8b is dissolved or dispersed in a solvent is applied in the opening section 13a of the bank 13, and the liquid body is dried to form the hole injecting layer 8b which is a carrier transport layer. Then, a liquid body in which material which is to be the light emitting layer 8c is dissolved or dispersed in a solvent is applied in the opening section 13a of the bank 13 on the hole injecting layer 8b, and the liquid body is dried to form the light emitting layer 8c (see FIG. 19).

Next, the counter electrode 8d is formed on an entire surface of the bank 13 and the light emitting layer 8c to manufacture the EL element 8 (see FIG. 19) and the EL panel 1 is manufactured.

As described above, when the switch transistor 52 which is the first thin film transistor of the bottom gate structure, and the driving transistor 62 which is the second thin film transistor of the top gate structure are formed, the step to form the first gate electrode 5a of the switch transistor 52 and the second light blocking film 6e of the driving transistor 62 between the substrate 10 and the first insulating film 11 is a different step from the step to form the second gate electrode 6a of the driving transistor 62 and the first light blocking film 5e of the switch transistor 52 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 5a and the first light blocking film 5e of the switch transistor 52 and the step to form the second gate electrode 6a and the second light blocking film 6e of the driving transistor 62, the driving transistor 62 and the switch transistor 52 can be formed differently.

According to the manufacturing method of the transistor structure 562 which forms the transistor structure 562 with common manufacturing steps other than the first gate electrode 5a of the switch transistor 52 and the second gate electrode 6a of the driving transistor 62, the driving transistor 62 and the switch transistor 52 can be formed differently suppressing the number of manufacturing steps and reducing the number of steps than conventional methods.

The first light blocking film 5e of the switch transistor 52 is formed with the second gate electrode 6a of the driving transistor 62 and the second light blocking film 6e of the driving transistor 62 is formed with the first gate electrode 5a of the switch transistor 52. Therefore, the switch transistor 52 including the first light blocking film 5e and the driving transistor 62 including the second light blocking film 6e can be formed differently without increasing the number of steps for manufacturing.

In the first semiconductor film 52b of the switch transistor 52, since the first region 521 is positioned on the first gate electrode 5a side, the first region 521 which is the region in the first semiconductor film 52b including more amorphous silicon is to be the electric current path of the channel, and the switch transistor 52 includes the function corresponding to the thin film transistor including the semiconductor film including amorphous silicon. The switch transistor 52 suitably functions as the thin film transistor which controls the on/off of the driving transistor 62.

In the second semiconductor film 62b of the driving transistor 62, since the second region 622 is positioned on the second gate electrode 6a side, the second region 622 which is the region in the second semiconductor film 62b including more crystalline silicon is to be the electric current path of the channel, and the driving transistor 62 includes the function corresponding to the thin film transistor including the semiconductor film including crystalline silicon. The driving transistor 62 suitably functions as the thin film transistor to flow electric current in the EL element 8 by control of the switch transistor 52.

As described above, the driving transistor 62 and the switch transistor 52 include different transistor characteristics, and each transistor exhibit each function so that the EL panel 1 can emit light favorably.

The first light blocking film 5e provided in the switch transistor 52 is formed in a position corresponding to the channel region of the first semiconductor film 52b. Therefore, the first light blocking film 5e and the first gate electrode 5a can block propagating light such as light entering from outside the EL panel 1 and light emitted by the EL element 8 from reaching the channel region of the first semiconductor film 52b.

As a result, a leak current hardly occurs in the switch transistor 52 and the transistor characteristic becomes stable. Therefore, the switch transistor 52 can function preferably.

Similarly, the second light blocking film 6e provided in the driving transistor 62 is formed in a position corresponding to the channel region of the second semiconductor film 62b. Therefore, the second light blocking film 6e and the second gate electrode 6a can block propagating light such as light entering from outside the EL panel 1 and light emitted by the EL element 8 from reaching the channel region of the second semiconductor film 62b.

As a result, a leak current hardly occurs in the driving transistor 62 and the transistor characteristic becomes stable. Therefore, the driving transistor 62 can function preferably.

Moreover, the first light blocking film 5e is connected to the ground line 33 and set to the ground potential and the first light blocking film 5e and the first gate electrode 5a can block an unnecessary electric field which occurs toward the channel region of the first semiconductor film 52b by an element outside the switch transistor 52. Therefore, the switch transistor 52 can operate normally with a suitable voltage between the first gate electrode 5a and the source electrode 5i and a voltage between the drain electrode 5h and the source electrode 5i.

Similarly, the second light blocking film 6e is connected to the ground line 33 and is set to ground potential and the second light blocking film 6e and the second gate electrode 6a can block an unnecessary electric field which occurs toward the channel region of the second semiconductor film 62b by an element outside the driving transistor 62. Therefore, the driving transistor 62 can operate normally with a suitable voltage between the second gate electrode 6a and the source electrode 6i and a voltage between the drain electrode 6h and the source electrode 6i.

In the above configuration, the configuration includes a ground line 33 set at ground potential and the first light blocking film 5e and the second light blocking film 6e are connected to the ground line 33 and set at ground potential, however, the configuration is not limited to the above. The configuration can be without the ground line 33 and the first light blocking film 5e and the second light blocking film 6e do not have to be connected to any component. In this case, the above function of shielding the electric field cannot be obtained, however, the above light blocking effect can be similarly obtained.

Moreover, the top gate structure of the driving transistor 62 is formed including the electric current path in the second region 622 on the interface side between the protective insulating film 6d where the crystallization of silicon is stable in the second semiconductor film 62b. Therefore, the driving transistor 62 favorably functions as the driving transistor.

Third Embodiment

Next, the EL panel and the transistor structure of the third embodiment of the present invention are described. The same reference numerals are applied to the components which are similar to the above embodiment and the description is omitted or simplified.

Figure 32:
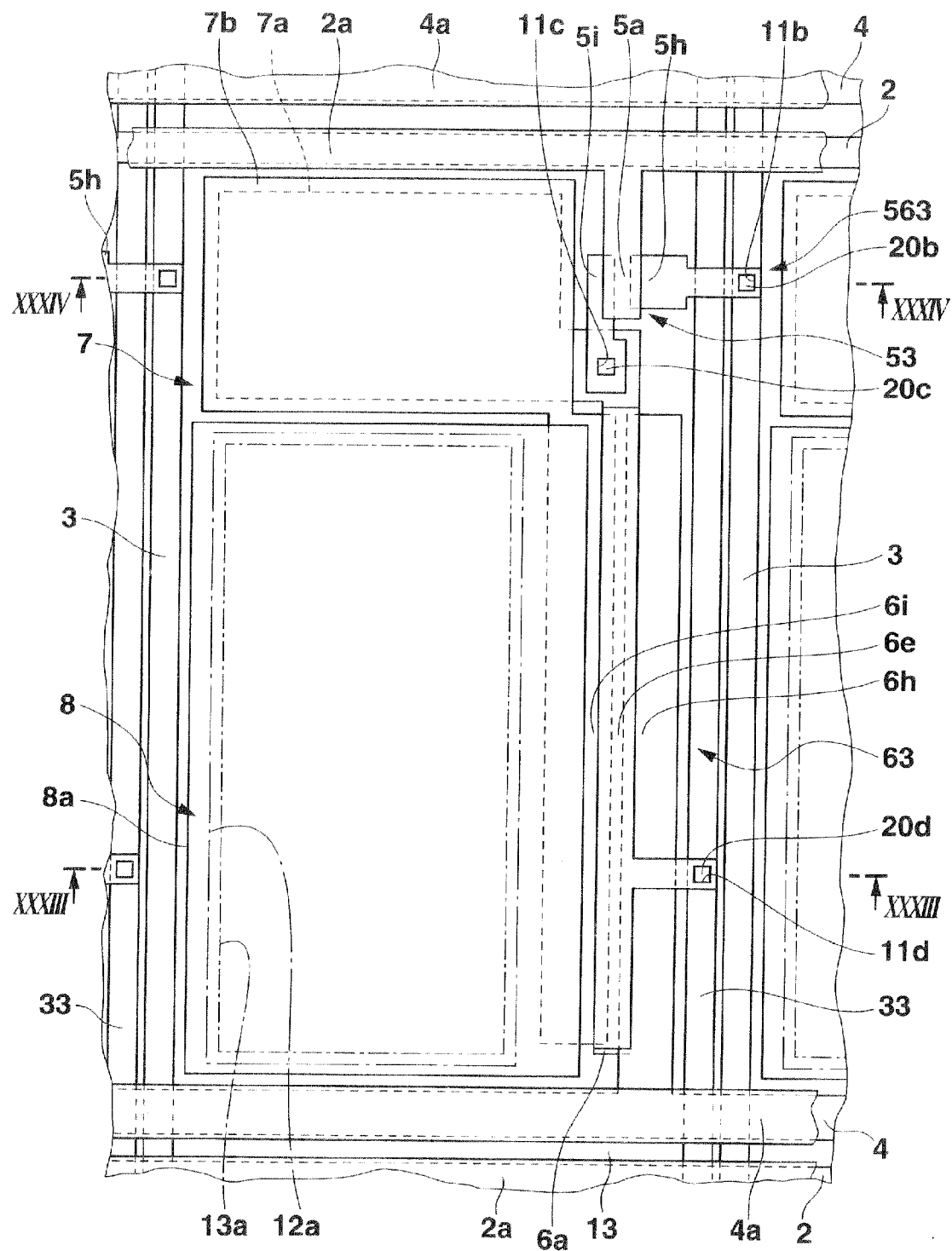
FIG. 32 is a planar view showing one pixel of an EL panel of the third embodiment.
Figure 33:
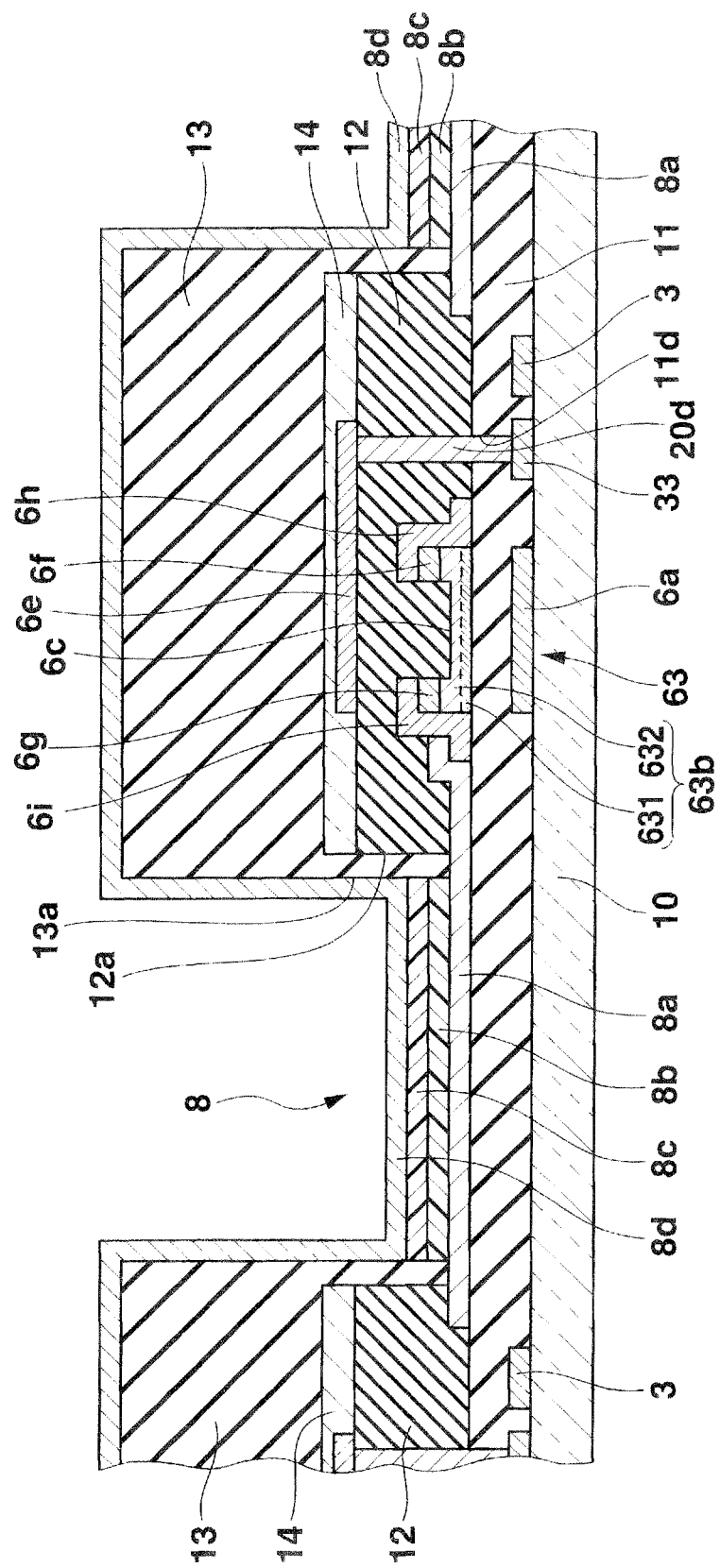
FIG. 33 is a cross sectional view of a plane along arrows XXXIII-XXXIII shown in FIG. 32.
Figure 34:
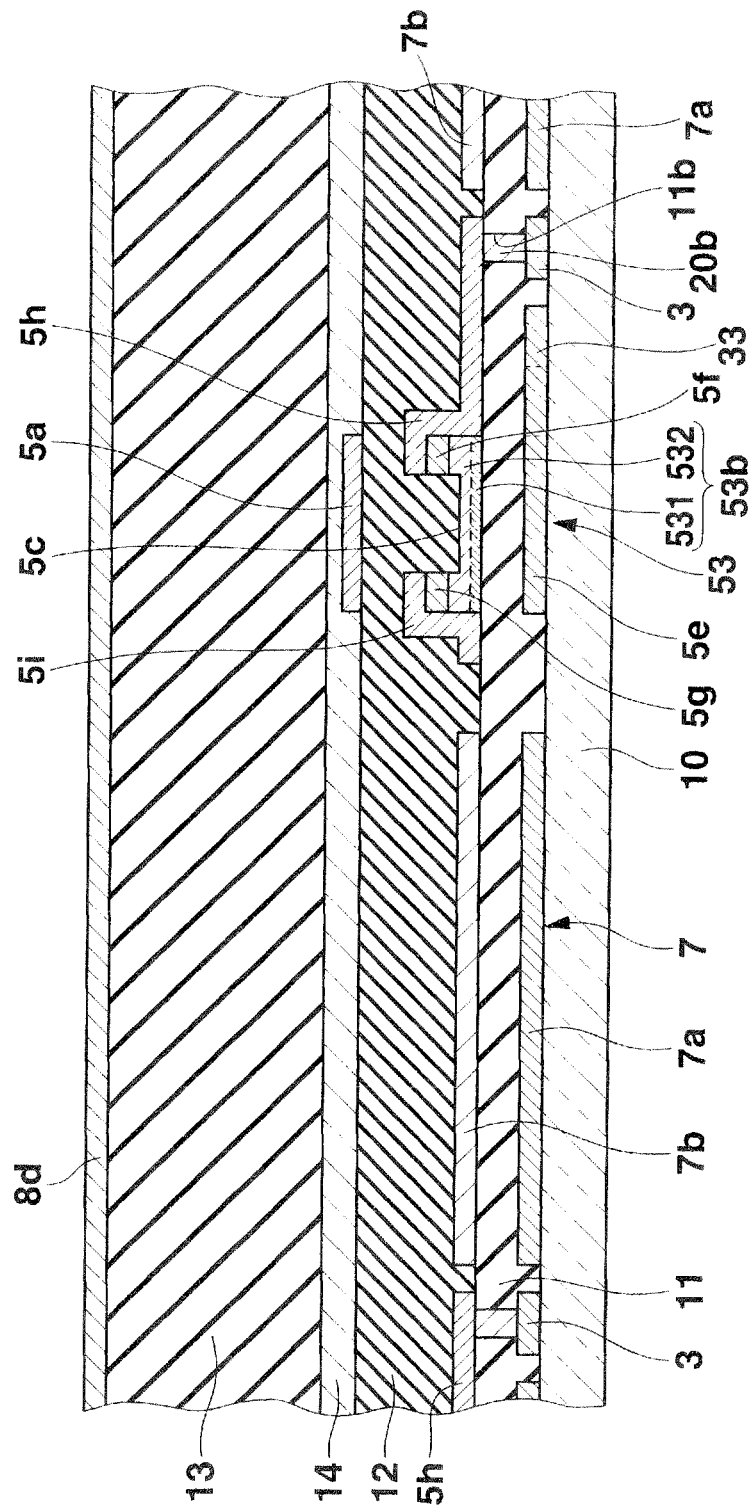
FIG. 34 is a cross sectional view of a plane along arrows XXXIV-XXXIV shown in FIG. 32.

The configuration of the EL panel 1 of the third embodiment and the pixel P is described using FIG. 32 to FIG. 34.

FIG. 32 is a planar view corresponding to one pixel P of the EL panel 1 of the third embodiment.

FIG. 33 is a cross sectional view of a plane along arrows XXXIII-XXXIII shown in FIG. 32.

FIG. 34 is a cross sectional view of a plane along arrows XXXIV-XXXIV shown in FIG. 32.

FIG. 32 mainly shows electrodes and lines.

As shown in FIG. 32, each pixel P includes a transistor structure 563 including a switch transistor 53 and a driving transistor 63.

The switch transistor 53 and the driving transistor 63 each correspond to the switch transistor 5 and the driving transistor 6 shown in FIG. 3.

The switch transistor 53 and the driving transistor 63 are arranged along the signal line 3, the capacitor 7 is positioned near the switch transistor 53 and the EL element 8 is positioned near the driving transistor 63.

In each pixel P, the switch transistor 53, the driving transistor 63, the capacitor 7 and the EL element 8 are positioned between the scanning line 2 and the voltage supplying line 4.

As shown in FIG. 32 to FIG. 34, a first gate electrode 6a is provided on the substrate 10, and a first insulating film 11 is formed on an upper surface of the substrate 10 so as to cover the first gate electrode 6a.

On the first insulating film 11, a second semiconductor film 53b and a first semiconductor film 63b, a pair of impurity semiconductor films 5f and 5g, a pair of impurity semiconductor films 6f and 6g, and drain electrodes 5h and 6h and source electrodes 5i and 6i are each formed on a predetermined position.

A second insulating film 12 is formed so as to cover the drain electrodes 5h and 6h and the source electrodes 5i and 6i.

A second gate electrode 5a is provided on the second insulating film 12 and a passivation film 14 is formed on the upper surface of the second insulating film 12 so as to cover the second gate electrode 5a.

A first light blocking film 6e is provided in the region corresponding to the first semiconductor film 63b on the second insulating film 12 and the first semiconductor film 63b is positioned between the first gate electrode 6a and the first light blocking film 6e.

A second light blocking film 5e is provided on the substrate 10 in the region corresponding to the second semiconductor film 53b below the first insulating film 11 and the second semiconductor film 53b is positioned between the second gate electrode 5a and the second light blocking film 5e.

The drain electrode 6h and the source electrode 6i of the driving transistor 63 are connected to an edge section of the first semiconductor film 63b through a pair of impurity semiconductor films 6f and 6g each provided on each of a pair of edge sections with a recessed section 6c of the first semiconductor film 63b in between.

The drain electrode 5h and the source electrode 5i of the switch transistor 53 are connected to an edge section of the second semiconductor film 53b through a pair of impurity semiconductor films 5f and 5g each provided on each of a pair of edge sections with a recessed section 5c of the second semiconductor film 53b in between.

The signal line 3 is formed between the substrate 10 and the first insulating film 11.

A ground line 33 set at ground potential is formed along the signal line 3 between the substrate 10 and the first insulating film 11.

The scanning line 2 is formed on the first insulating film 11. On the second insulating film 12 covering above the scanning line 2, a groove is formed along the scanning line 2. In the groove, a conducting layer 2a is provided covering the scanning line 2 so as to be in contact with the scanning line 2 and the scanning line 2 and the conducting layer 2a are conducted to aim for low resistance of the scanning line 2. The groove and the conducting layer 2a do not have to be included.

The voltage supplying line 4 is formed on the first insulating film 11. On the second insulating film 12 covering above the voltage supplying line 4, a groove is formed along the voltage supplying line 4. In the groove, a conducting layer 4a is provided covering the voltage supplying line 4 so as to be in contact with the voltage supplying line 4 and the voltage supplying line 4 and the conducting layer 4a are conducted. With this, there is an aim for low resistance of the voltage supplying line 4 and to stabilize the amount of electric current supplied to the EL element 8 through the driving transistor 63. The groove and the conducting layer 4a do not have to be included.

As shown in FIG. 32 and FIG. 34, the switch transistor 53 is a second thin film transistor with a top gate structure of an inversely staggered structured channel edging type. The switch transistor 53 includes a second gate electrode 5a, a second semiconductor film 53b, impurity semiconductor films 5f and 5g, a second drain electrode 5h, a second source electrode 5i, a second light blocking film 5e and the like.

The second light blocking film 5e is formed in a position between the substrate 10 and the first insulating film 11. The second light blocking film 5e is formed in the same process when the first gate electrode 6a of the driving transistor 63 is formed. The first gate electrode 6a and the second light blocking film 5e are formed from a material selected from a Cr film, an Al film, a Cr/Al laminated film, an AlTi alloy film, or an AlTiNd alloy film. A portion of the second light blocking film 5e is connected to the ground line 33.

The first insulating film 11 formed on the upper surface of the substrate 10 includes, for example, light permeability and includes silicon nitride or silicon oxide.

An intrinsic second semiconductor film 53b is formed in a position on the first insulating film 11 which corresponds with the second gate electrode 5a.

The second semiconductor film 53b includes, for example, crystalline silicon, specifically microcrystalline silicon and includes a first region 531 positioned on the first insulating film 11 side and a second region 532 positioned on the second insulating film 12 side of the opposite surface side. Here, degree of crystallization of silicon of the first region 531 is formed higher than the second region 532. In other words, in the first region 531 of the second semiconductor film 53b, the degree of crystallization of silicon is relatively higher compared to the second region 532, and the rate of the crystalline silicon region is higher compared to the second region 532. In the second region 532 of the second semiconductor film 53b, the rate of the amorphous silicon region is high compared to the first region 531, and preferably, the second region 532 of the second semiconductor film 53b is a region with substantially only amorphous silicon.

The recessed section 5c is formed on an upper surface of the second semiconductor film 53b on a substantially center side including at least a portion of a region corresponding to the second gate electrode 5a. The recessed section 5c is formed in the second region 532 of the second semiconductor film 53b and does not reach the first region 531. A portion corresponding to the recessed section 5c on the second semiconductor film 53b is to be the channel region where a channel is formed.

Both edge sections of the second semiconductor film 53b with the recessed section 5c in between are one step higher than the recessed section 5c.

On one edge section of the second semiconductor film 53b, an impurity semiconductor film 5f is formed, and on the other edge section of the second semiconductor film 53b, an impurity semiconductor film 5g is formed.

The impurity semiconductor films 5f and 5g are formed apart from each other on each edge side of the second semiconductor film 53b.

The impurity semiconductor films 5f and 5g are n-type semiconductors, however, it is not limited to the above, and when the switch transistor 53 is a p-type transistor, a p-type semiconductor can be used.

The drain electrode 5h is formed on the impurity semiconductor film 5f.

The source electrode 5i is formed on the impurity semiconductor film 5g.

It is preferable that the drain electrode 5h and the source electrode 5i are formed from material selected from, for example, a Cr film, an Al film, a Cr/Al laminated film, an AlTi alloy film, and an AlTiNd alloy film.

On the drain electrode 5h and the source electrode 5i, a second insulating film 12 is formed, and the drain electrode 5h and the source electrode 5i, etc. are covered by the second insulating film 12. The second insulating film 12 includes, for example, silicon nitride or silicon oxide.

The second gate electrode 5a is formed on the second insulating film 12 in a position corresponding to the recessed section 5c of the second semiconductor film 53b. The second gate electrode 5a is formed from, for example, a Cr film, an Al film, a Cr/Al laminated film, an AlTi alloy film or an AlTiNd alloy film.

The second gate electrode 5a on the second insulating film 12 is covered by the passivation film 14.

The passivation film 14 includes, for example, silicon nitride or silicon oxide.

The switch transistor 53 is covered by the first insulating film 11, the second insulating film 12 and the passivation film 14.

In the switch transistor 53, the second insulating film 12 functions as a gate insulating film, and the recessed section 5c portion which is a region one step lower than the second semiconductor film 53 acted on by the electric field of the second gate electrode 5a is to be a channel region in which the channel is formed. The channel is formed in a second region 532 of the second semiconductor film 53b which is the second gate electrode 5a side of the second semiconductor film 53b, and the second region 532 constitutes the electric current path between the source electrode 5i and the drain electrode 5h.

The second region 532 of the second semiconductor film 53b is a semiconductor layer including more amorphous silicon and the switch transistor 53 which uses the second region 532 as the electric current path of the channel corresponds to a thin film transistor including a semiconductor film made from amorphous silicon (or a semiconductor film including amorphous silicon as a main component). In other words, the leak current is smaller in the amorphous silicon of the second region 532 of the switch transistor 53 compared to the crystalline silicon such as microcrystalline silicon and the on/off ratio of the electric current which flows in the semiconductor layer, in other words, the value of (electric current which flows in the semiconductor layer when on)/(electric current which flows in the semiconductor layer when off) is high. Therefore, the switch transistor 53 suitably functions as the switch transistor which controls the on/off of the driving transistor 63.

In the switch transistor 53, the second light blocking film 5e is provided so that the channel region (recessed section 5c) of the second semiconductor film 53b is positioned between the second light blocking film 5e and the second gate electrode 5a. Therefore, light such as the emitted light of the EL element 8 can be blocked with the second light blocking film 5e and the second gate electrode 5a, and it is difficult for such light to reach the channel region of the second semiconductor film 53b. As a result, a leak current hardly occurs in the switch transistor 53 and the transistor characteristic becomes stable. Therefore, the switch transistor 53 can function preferably.

Moreover, the second light blocking film 5e is connected to the ground line 33 and grounded and the second light blocking film 5e can block an unnecessary electric field which acts on the channel region of the second semiconductor film 53b. Therefore, the voltage change between the source and the drain by such unnecessary electric field can be prevented, and the function of the switch transistor 53 can be preferably maintained.

As shown in FIG. 32 and FIG. 33, the driving transistor 63 is a first thin film transistor with a bottom gate structure of an inversely staggered structured channel etching type. The driving transistor 63 includes a first gate electrode 6a, a first semiconductor film 63b, impurity semiconductor films 6f and 6g, a first drain electrode 6h, a first source electrode 6i, a first light blocking film 6e and the like.

The first gate electrode 6a is formed between the substrate 10 and the first insulating film 11. It is preferable that the first gate electrode 6a is formed from material selected from, for example, a Cr film, an Al film, a Cr/Al laminated film, an AlTi alloy film and an AlTiNd alloy film. The first insulating film 11 is formed on the first gate electrode 6a and the first gate electrode 6a is covered by the first insulating film 11. The intrinsic first semiconductor film 63b is formed in a position on the first insulating film 11 corresponding to the first gate electrode 6a. The first semiconductor film 63b faces the first gate electrode 6a with the first insulating film 11 in between.

The first semiconductor film 63b includes, for example, crystalline silicon, specifically, microcrystalline silicon and includes a first region 631 positioned on the first insulating film 11 side and a second region 632 positioned on the second insulating film 12 side of the opposite surface side. Here, degree of crystallization of silicon of the first region 631 is formed higher compared to the second region 632. In other words, in the first region 631 of the first semiconductor film 63b, degree of crystallization of silicon is relatively higher compared to the second region 632, and the rate of the crystalline silicon region is higher compared to the second region 632. In the second region 632 of the first semiconductor film 63b, the rate of the amorphous silicon region is higher compared to the first region 631, and preferably the second region 632 of the first semiconductor film 63b is a region with substantially only amorphous silicon. The first region 631 of the first semiconductor film 63b and the first region 531 of the second semiconductor film 53b have the same composition and have the same thickness. The second region 632 of the first semiconductor film 63b and the second region 532 of the second semiconductor film 53b have the same composition and have the same thickness. Therefore, as described later, the first semiconductor film 63b and the second semiconductor film 53b can be manufactured collectively with the same process using the semiconductor layer 9 which is a layer with the same material.

The recessed section 6c is formed on an upper surface of the first semiconductor film 63b on a substantially center side including at least a portion of a region corresponding to the first gate electrode 6a. The recessed section 6c is formed in the second region 632 of the first semiconductor film 63b and does not reach the first region 631. A portion corresponding to the recessed section 6c on the first semiconductor film 63b is to be the channel region where a channel is formed.

Both edge sections of the first semiconductor film 63b with the recessed section 6c in between are one step higher than the recessed section 6c. On one edge section of the first semiconductor film 63b, an impurity semiconductor film 6f is formed, and on the other edge section of the second semiconductor film 63b, an impurity semiconductor film 6g is formed.

The impurity semiconductor films 6f and 6g are formed apart from each other on each edge side of the first semiconductor film 63b. The impurity semiconductor films 6f and 6g are n-type semiconductors, however, it is not limited to the above, and when the driving transistor 63 is a p-type transistor, a p-type semiconductor can be used. The impurity semiconductor films 6f and 6g and the impurity semiconductor films 5f and 5g are composed of the same material and have the same thickness. Therefore, as described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film, and an AlTiNd alloy film. The drain electrode 6h and the source electrode 6i and the drain electrode 5h and the source electrode 5i are composed of the same material and have the same thickness. Therefore, as described later, the drain electrode 6h and the source electrode 6i and the drain electrode 5h and the source electrode 5i can be manufactured collectively with the same process using the conducting layer 9h which is a layer with the same material.

On the drain electrode 6h and the source electrode 6i, a second insulating film 12 is formed, and the drain electrode 6h and the source electrode 6i, etc. are covered by the second insulating film 12.

The first light blocking film 6e is formed in a position on the second insulating film 12 corresponding to the first semiconductor film 63b (recessed section 6c). The first light blocking film 6e is formed in the same process when the second gate electrode 5a of the switch transistor 53 is formed. The first light blocking film 6e is formed from a material selected from a Cr film, an Al film, a Cr/Al laminated film, an AlTi alloy film, or an AlTiNd alloy film. A portion of the first light blocking film 6e is connected to the ground line 33 through the contact plug 20d. The first light blocking film 6e on the second insulating film 12 is covered by the passivation film 14.

The driving transistor 63 is covered by the first insulating film 11, the second insulating film 12 and the passivation film 14.

In the driving transistor 63, the first insulating film 11 functions as a gate insulating film, and the recessed section 6c portion which is a region one step lower than the first semiconductor film 63 acted on by the electric field of the first gate electrode 6a is to be where the channel (channel region) is formed. The channel is formed in a first region 631 of the first semiconductor film 63b which is the first gate electrode 6a side of the first semiconductor film 63b, and the first region 631 constitutes the electric current path between the source electrode 6i and the drain electrode 6h.

The first region 631 of the first semiconductor film 63b is a semiconductor layer including more crystalline silicon than the second region 632. Therefore, the driving transistor 63 which uses the first region 631 as the electric current path of the channel corresponds to a thin film transistor including a semiconductor film made from crystalline silicon (or a semiconductor film including crystalline silicon as the main component). In other words, the microcrystalline silicon in the first region 631 of the driving transistor 63 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore the driving transistor 63 suitably functions as a driving transistor which flows electric current in the EL element 8 by control of the switch transistor 53.

In the driving transistor 63, the first light blocking film 6e is provided so that the channel region (recessed section 6c) of the first semiconductor film 63b is positioned between the first light blocking film 6e and the first gate electrode 6a. Therefore, light such as the emitted light of the EL element 8 can be blocked with the first light blocking film 6e and the first gate electrode 6a, and it is difficult for such light to reach the channel region of the first semiconductor film 63b. As a result, a leak current hardly occurs in the driving transistor 63 and the transistor characteristic becomes stable. Therefore, the driving transistor 63 can function preferably.

Moreover, the first light blocking film 6e is connected to the ground line 33 and grounded and the first light blocking film 6e can block an unnecessary electric field which acts on the channel region of the first semiconductor film 63b. Therefore, the voltage change between the source and the drain by such unnecessary electric field can be prevented and the change of the driving electric current of the driving transistor 63 can be suppressed. Consequently, the function of the driving transistor 63 can be preferably maintained.

The capacitor 7 is connected between the first gate electrode 6a and the source electrode 6i of the driving transistor 63. Specifically, the electrode 7a of the capacitor 7 is connected to the first gate electrode 6a of the driving transistor 63, and the electrode 7b of the capacitor 7 is connected to the source electrode 6i of the driving transistor 63.

Then, as shown in FIG. 32 and FIG. 34, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the ground line 33, the electrode 7a of the capacitor 7, the first gate electrode 6a of the driving transistor 63, and the second light blocking film 5e of the switch transistor 53 are collectively formed by processing the shape of a conducting film formed on an entire surface of the substrate 10 by photolithography, etching, etc.

The scanning line 2, the voltage supplying line 4, the electrode 7b of the capacitor 7, the drain electrode 5h and the source electrode 5i of the switch transistor 53, and the drain electrode 6h and the source electrode 6i of the driving transistor 63 are collectively formed by processing the shape of a conducting film formed on an entire surface of the first insulating film 11 by photolithography, etching, etc.

The first light blocking film 6e of the driving transistor 63, the second gate electrode 5a of the switch transistor 53, and the conducting layer 2a and the conducting layer 4a are collectively formed by processing the shape of a conducting film formed on an entire surface of the second insulating film 12 by photolithography, etching, etc.

On the first insulating film 11, a contact hole 11b is formed on a region where the drain electrode 5h and the signal line 3 overlaps, a contact hole 11c is formed on a region where the first gate electrode 6a and the source electrode 5i overlaps, and contact plugs 20b and 20c are each implanted in the contact holes 11b and 11c.

The drain electrode 5h of the switch transistor 53 and the signal line 3 are electrically conducted by the contact plug 20b. The source electrode 5i of the switch transistor 53 and the electrode 7a of the capacitor 7 as well as the source electrode 5i of the switch transistor 53 and the first gate electrode 6a of the driving transistor 63 are electrically conducted by the contact plug 20c.

The drain electrode 5h can be conducted with the signal line 3 by direct contact and the source electrode 5i can be conducted with the first gate electrode 6a by direct contact without using the contact plugs 20b and 20c.

In the first insulating film 11 and the second insulating film 12, a contact hole 11d is formed in a region where the first light blocking film 6e overlaps with the ground line 33, and a contact plug 20d is implanted in the contact hole 11d. The first light blocking film 6e and the ground line 33 are conducted by the contact plug 20d and the first light blocking film 6e is grounded.

The first gate electrode 6a of the driving transistor 63 is connected as one with the electrode 7a of the capacitor 7, the drain electrode 6h of the driving transistor 63 is connected as one with the voltage supplying line 4, and the source electrode 6i of the driving transistor 63 is connected as one with the electrode 7b of the capacitor 7.

The emission of light of the EL element 8 is controlled by driving and control of the transistor structure 563 including the switch transistor 53 and the driving transistor 63, and the emission of light of the EL panel 1 including the transistor structure 563 is controlled.

Next, the manufacturing method of the switch transistor 53 and the driving transistor 63 composing the transistor structure 563 in the EL panel 1 of the third embodiment of the present invention is described using FIG. 35A and FIG. 35B to FIG. 44A and FIG. 44B showing each process.

Regarding the switch transistor 53 and the driving transistor 63 shown in the diagram explaining each step, a portion of the shape, dimensions and the like is different from the actual embodiment, such as in FIG. 32, however, to simplify explanation, each thin film transistor is shown to be the same size and the main section of each thin film transistor is schematically illustrated and explained. FIG. A of each figure shows the driving transistor 63 and FIG. B of each figure shows the switch transistor 53.

Figure 35A:
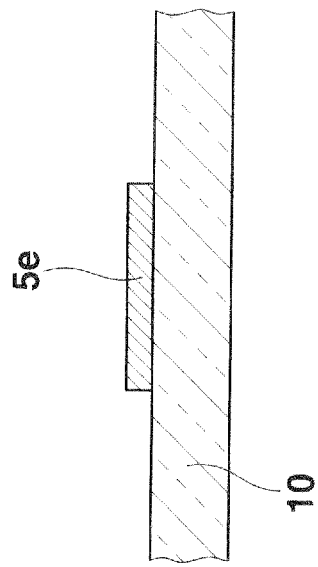
FIG. 35A is an explanatory diagram showing a manufacturing step of a thin film transistor of the third embodiment.
Figure 35B:
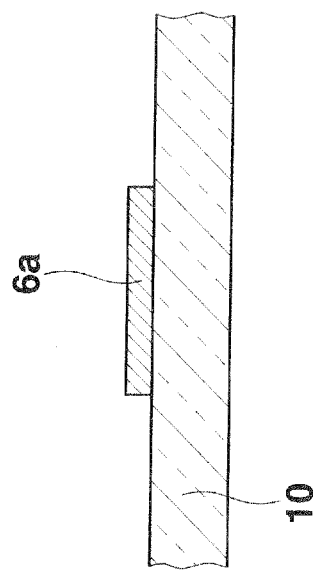
FIG. 35B is an explanatory diagram showing a manufacturing step of a thin film transistor of the third embodiment.

First, as shown in FIG. 35A and FIG. 35B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 6a of the driving transistor 63 and the second light blocking film 5e of the switch transistor 53. Together with the first gate electrode 6a and the second light blocking film 5e, the signal line 3, the ground line 33 and the electrode 7a of the capacitor 7 are formed on the substrate 10 (see FIG. 32 to FIG. 34).

Figure 36A:
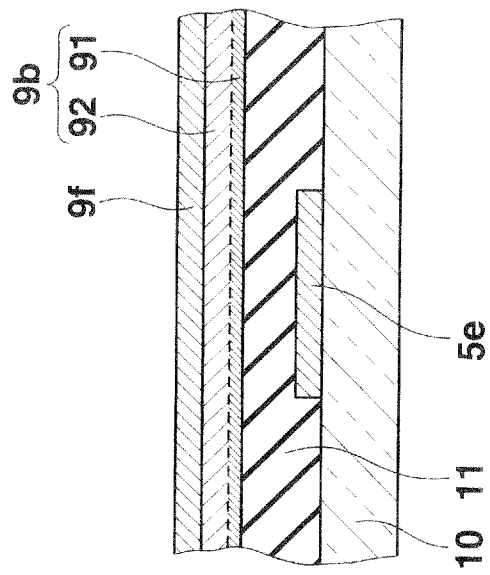
FIG. 36A is an explanatory diagram showing a manufacturing step of a thin film transistor of the third embodiment.
Figure 36B:
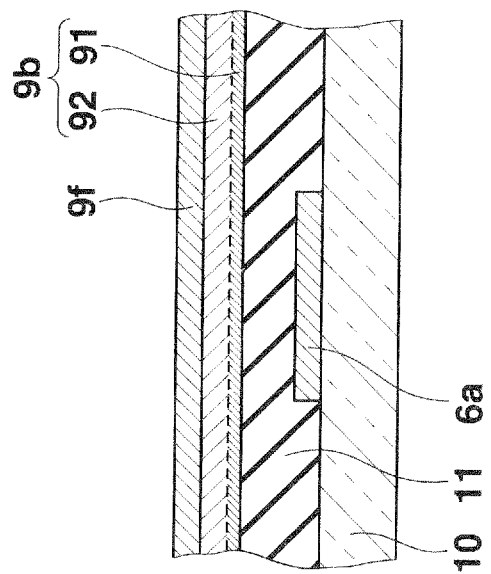
FIG. 36B is an explanatory diagram showing a manufacturing step of a thin film transistor of the third embodiment.

Next, as shown in FIG. 36A and FIG. 36B, the first insulating film 11 such as silicon nitride, etc. is formed by plasma CVD (PE-CVD).

Moreover, as shown in FIG. 36A and FIG. 36B, the semiconductor layer 9b including crystalline silicon is formed on the first insulating film 11 by plasma CVD. Here, when the semiconductor layer 9b which is to be the semiconductor film (53b, 63b) is formed, the first silicon layer 91 with a relatively high degree of crystallization of silicon is formed first, and then a second silicon layer 92 with a relatively low degree of crystallization of silicon is formed. Preferably, the second silicon layer 92 is substantially only amorphous silicon.

Specifically, the first silicon layer 91 is formed after plasma degradation of $SiH_4$ gas and $H_2$ gas, and by setting the ratio of the $H_2$ gas overwhelmingly larger compared to the $SiH_4$ gas and by making the plasma power and the pressure large to raise the degree of crystallization, the first silicon layer 91 which is a microcrystalline silicon thin film is formed.

In the present embodiment, the first silicon layer 91 is formed under conditions of using argon as a carrier gas, setting the gas flow rate to $SiH_4/H_2$=50/10500 [SCCM], setting power density at 0.134 [W/cm$^2$] and setting the pressure at 300 [Pa].

Then, the ratio of the H$_2$ gas compared to SiH$_4$ gas is decreased, and the plasma power and the pressure is decreased to form the second silicon layer 92 which is an amorphous silicon thin film.

The surface of the first silicon layer 91 which is the microcrystalline silicon thin film tends to be uneven. However, since the second silicon layer 92 which is the amorphous silicon thin film is layered on the first silicon layer 91, the unevenness of the surface of the first silicon layer 91 is covered and moderated by the second silicon layer 92.

Instead of forming the first silicon layer 91 by plasma CVD, the first silicon layer 91 can be formed by a method of emitting laser light to the amorphous silicon thin film to be reformed to the microcrystalline silicon thin film. In this case, after forming the amorphous silicon thin film on the first insulating film 11, the substrate is taken out of the chamber of the CVD apparatus and laser light emitting processing is performed to form the first silicon layer 91, and then the substrate is put in the chamber of the CVD apparatus again to layer the second silicon layer 92 on the first silicon layer 91.

The degree of crystallization of silicon of the first silicon layer 91 and the second silicon layer 92 in the semiconductor layer 9b (the first region and the second region in the semiconductor film) can be determined based on the degree of crystallization calculated by, for example, raman spectrophotometry as described above. For example, when the degree of crystallization is 20% or more, it is defined to be a microcrystalline silicon thin film, and when the degree of crystallization is less than 20%, it is defined to be an amorphous silicon thin film (see FIG. 61).

As preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using N$_2$O gas, setting the gas flow rate to 2000 [SCCM], setting the power density to 0.356 [W/cm$^2$] and setting the pressure to 80 [Pa].

In the plasma processing, N$_2$O gas is used, however, instead of N$_2$O gas, oxygen gas or hydrogen gas can be used under suitable conditions.

Next, as shown in FIG. 36A and FIG. 36B, the impurity semiconductor layer 9f which is to be the impurity semiconductor film is formed by sputtering or CVD method on the semiconductor layer 9b (second silicon layer 92).

The material used as the impurity semiconductor layer 9f is different according to whether the thin film transistor is a p-type or n-type.

In a p-type transistor (p$^+$Si), the layer is formed by forming a film of plasma mixing an acceptor type impurity such as diborane, etc. in SiH$_4$ gas.

In an n-type transistor (n$^+$Si), the layer is formed by forming a film of plasma by mixing a donor type impurity such as arsine, phosphine, etc. in the SiH$_4$ gas.

Figure 37B:
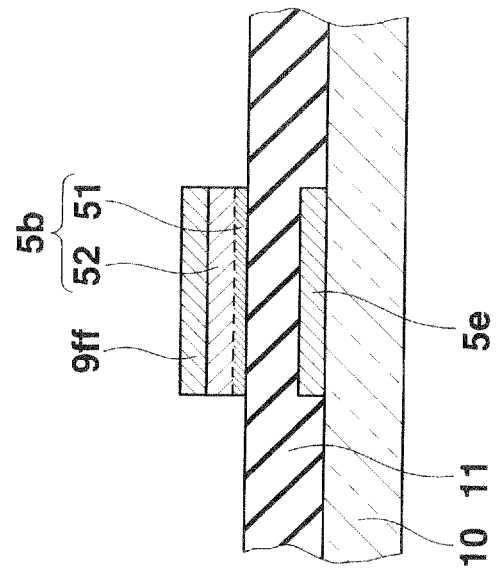
FIG. 37B is an explanatory diagram showing a manufacturing step of a thin film transistor of the third embodiment.
Figure 37A:
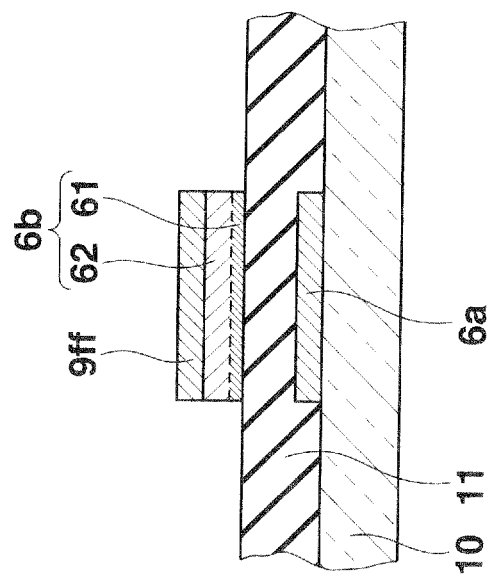
FIG. 37A is an explanatory diagram showing a manufacturing step of a thin film transistor of the third embodiment.

Next, as shown in FIG. 37A and FIG. 37B, the semiconductor layer 9b and the impurity semiconductor layer 9f are patterned by photography, etching etc. to form a first semiconductor film 63b including a first region 631 and a second region 632 and an impurity semiconductor layer section 9ff provided on the first semiconductor film 63b, and a second semiconductor film 53b including a first region 531 and a second region 532 and an impurity semiconductor layer section 9ff provided on the second semiconductor film 53b.

Figure 38B:
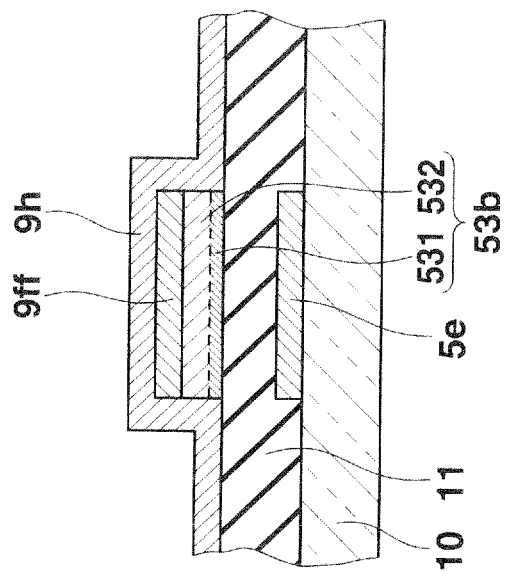
FIG. 38B is an explanatory diagram showing a manufacturing step of a thin film transistor of the third embodiment.
Figure 38A:
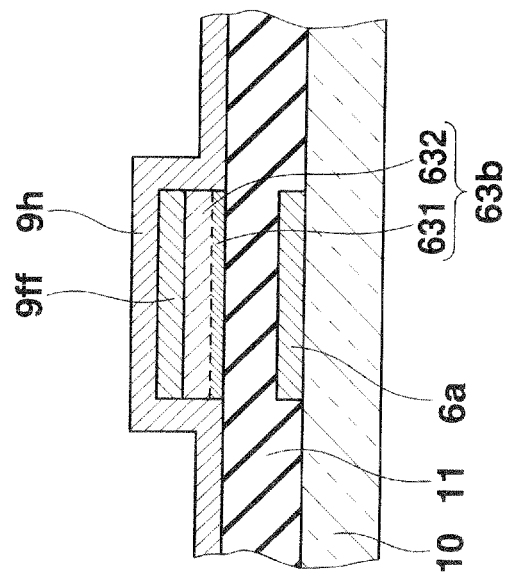
FIG. 38A is an explanatory diagram showing a manufacturing step of a thin film transistor of the third embodiment.

Next, as shown in FIG. 38A and FIG. 38B, a conducting film 9h which is to be the source electrode and the drain electrode is formed on the first insulating film 11 so as to cover the impurity semiconductor layer section 9ff by, for example sputtering.

Figure 39B:
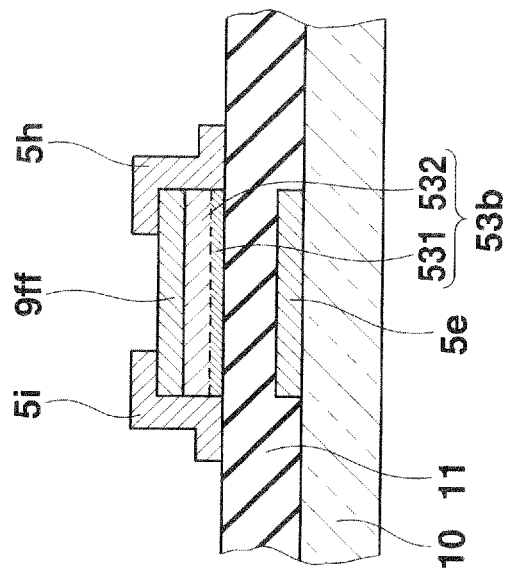
FIG. 39B is an explanatory diagram showing a manufacturing step of a thin film transistor of the third embodiment.
Figure 39A:
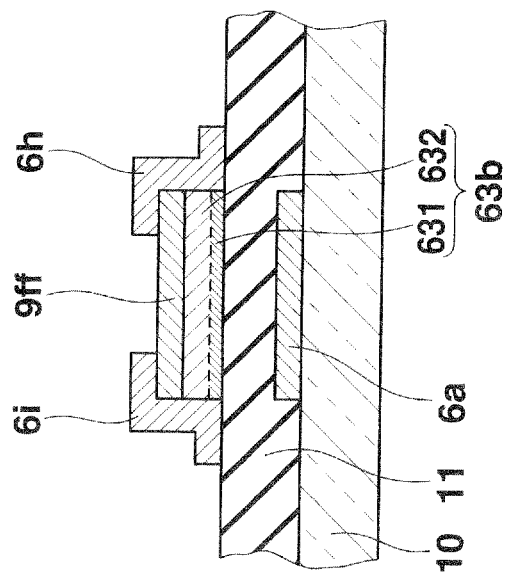
FIG. 39A is an explanatory diagram showing a manufacturing step of a thin film transistor of the third embodiment.

Next, as shown in FIG. 39A and FIG. 39B, the conducting film 9h is patterned by photolithography, etching, etc. and the source electrode 6i and the drain electrode 6h of the driving transistor 63, the source electrode 5i and the drain electrode 5h of the switch transistor 53 are formed, and moreover, together with the source electrode and the drain electrode, the scanning line 2, the voltage supplying line 4, and the electrode 7b of the capacitor 7 are also formed. (see FIG. 33 and FIG. 34).

Figure 40B:
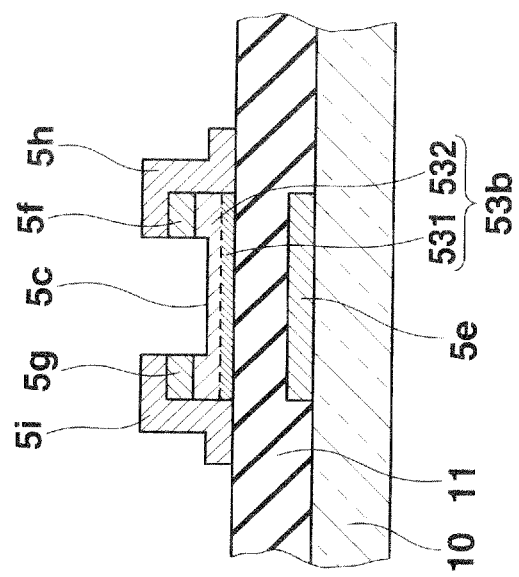
FIG. 40B is an explanatory diagram showing a manufacturing step of a thin film transistor of the third embodiment.
Figure 40A:
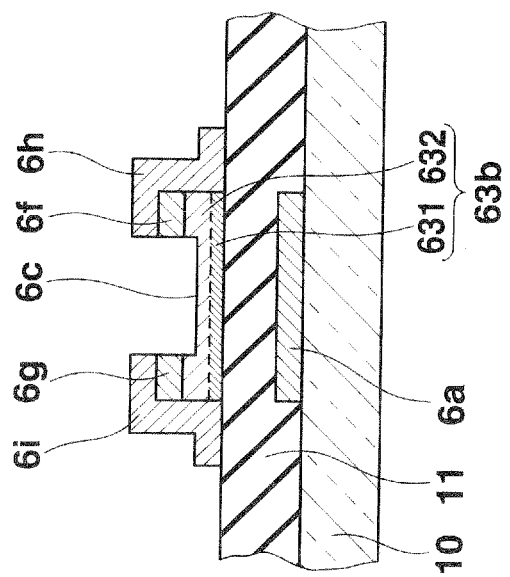
FIG. 40A is an explanatory diagram showing a manufacturing step of a thin film transistor of the third embodiment.

Next, as shown in FIG. 40A and FIG. 40B, the drain electrode 6h and the source electrode 6i are used as a mask and the impurity semiconductor layer section 9ff is patterned by dry etching to form a pair of impurity semiconductor films 6f and 6g. The upper surface of the first semiconductor film 63b is also etched to form the recessed section 6c in the second region 632 on the upper surface side of the first semiconductor film 63b. Under an etching condition where the recessed section 6c does not reach the first region 631 of the first semiconductor film 63b, a pair of impurity semiconductor films 6f and 6g is formed together with the recessed section 6c.

Similarly, the drain electrode 5h and the source electrode 5i are used as a mask and the impurity semiconductor layer section 9ff is patterned by dry etching to form a pair of impurity semiconductor films 5f and 5g. The upper surface of the second semiconductor film 53b is also etched to form the recessed section 5c in the second region 532 on the upper surface side of the second semiconductor film 53b. Under an etching condition where the recessed section 5c does not reach the first region 531 of the second semiconductor film 53b, a pair of impurity semiconductor films 5f and 5g is formed together with the recessed section 5c.

Figure 41B:
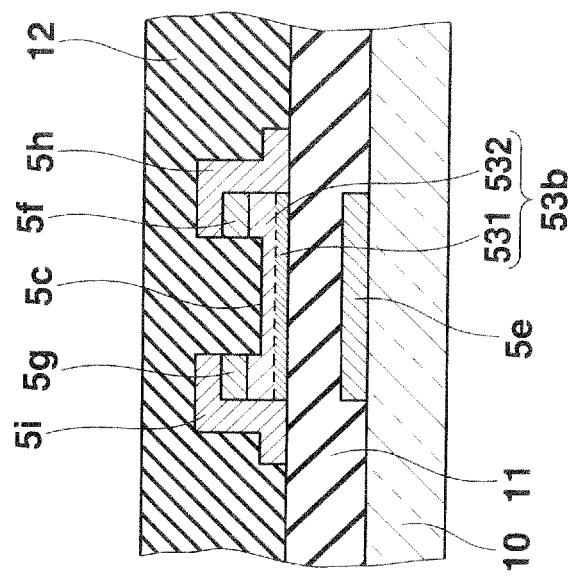
FIG. 41B is an explanatory diagram showing a manufacturing step of a thin film transistor of the third embodiment.
Figure 41A:
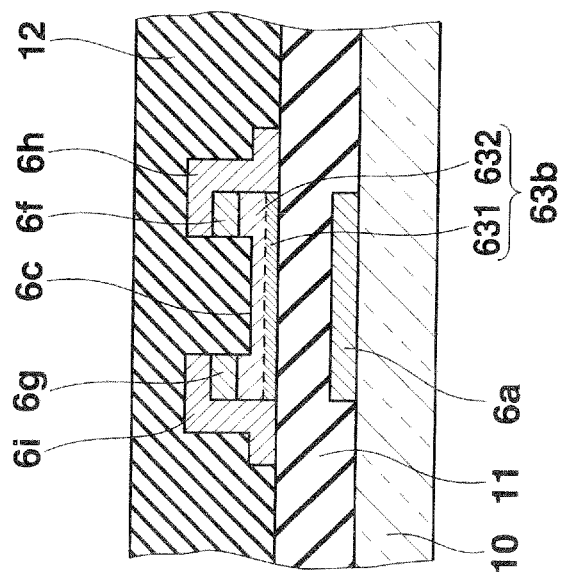
FIG. 41A is an explanatory diagram showing a manufacturing step of a thin film transistor of the third embodiment.

Next, as shown in FIG. 41A and FIG. 41B, the second insulating film 12 which covers the source electrode 6i and the drain electrode 6h of the driving transistor 63 and the source electrode 5i and the drain electrode 5h of the switch transistor 53 is formed. On the second insulating film 12, a groove to expose the scanning line 2 and the voltage supplying line 4 is formed.

Before forming the second insulating film 12, the pixel electrode 8a conducted with the source electrode 6i of the driving transistor 63 is formed (see FIG. 33).

Figure 42B:
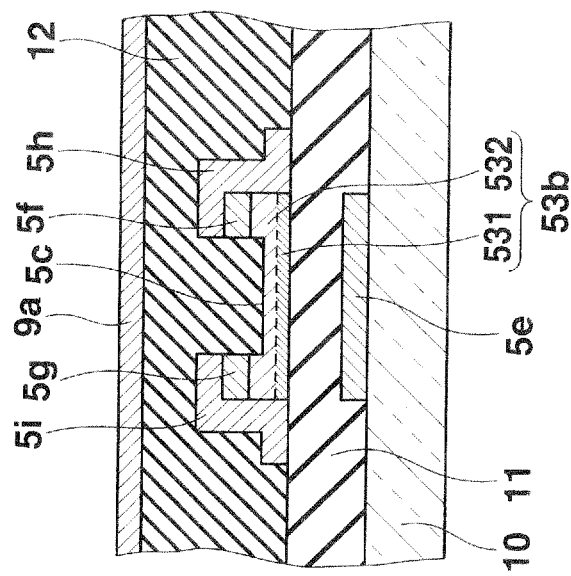
FIG. 42B is an explanatory diagram showing a manufacturing step of a thin film transistor of the third embodiment.
Figure 42A:
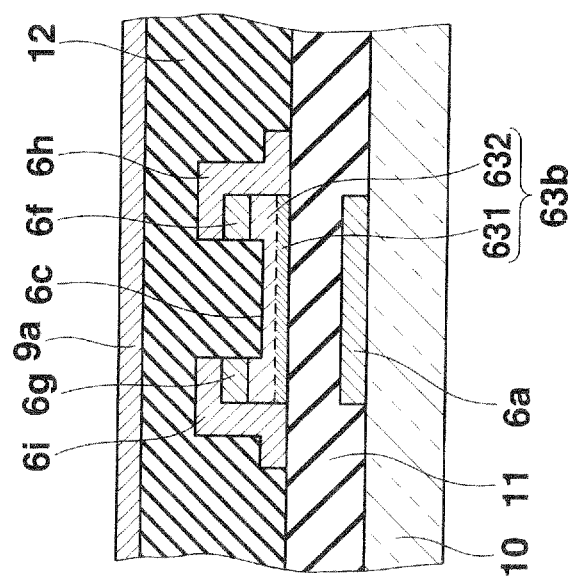
FIG. 42A is an explanatory diagram showing a manufacturing step of a thin film transistor of the third embodiment.

Next, as shown in FIG. 42A and FIG. 42B, a gate metal layer 9a of, for example, a Cr film, an Al film, a Cr/Al laminated film, an AlTi alloy film or an AlTiNd alloy film, etc. is formed by sputtering, etc. on the second insulating film 12 and in the groove where the scanning line 2 and the voltage supplying line 4 are exposed.

Figure 43B:
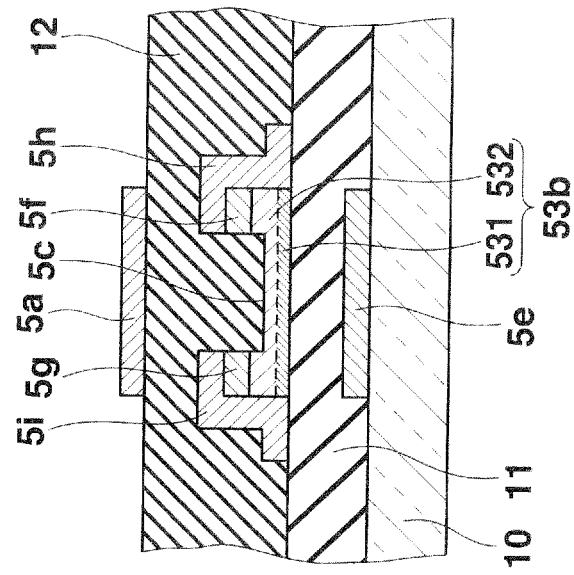
FIG. 43B is an explanatory diagram showing a manufacturing step of a thin film transistor of the third embodiment.
Figure 43A:
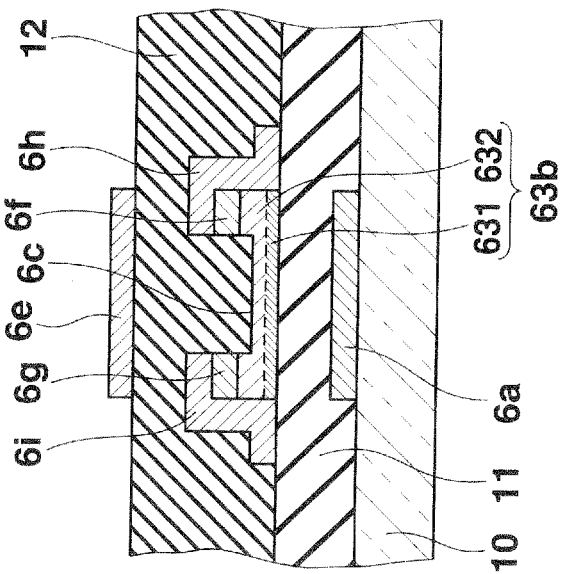
FIG. 43A is an explanatory diagram showing a manufacturing step of a thin film transistor of the third embodiment.

Next, as shown in FIG. 43A and FIG. 43B, the gate metal layer 9a is patterned using photolithography, etching, etc. and the second gate electrode 5a of the switch transistor 53 and the first light blocking film 6e of the driving transistor 63 are formed. The conducting layer 2a and the conducting layer 4a are formed with the second gate electrode 5a and the first light blocking film 6e (see FIG. 32).

Figure 44B:
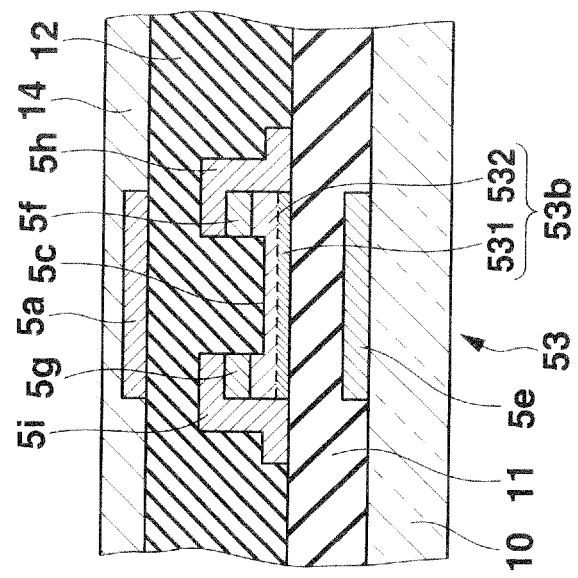
FIG. 44B is an explanatory diagram showing a manufacturing step of a thin film transistor of the third embodiment.
Figure 44A:
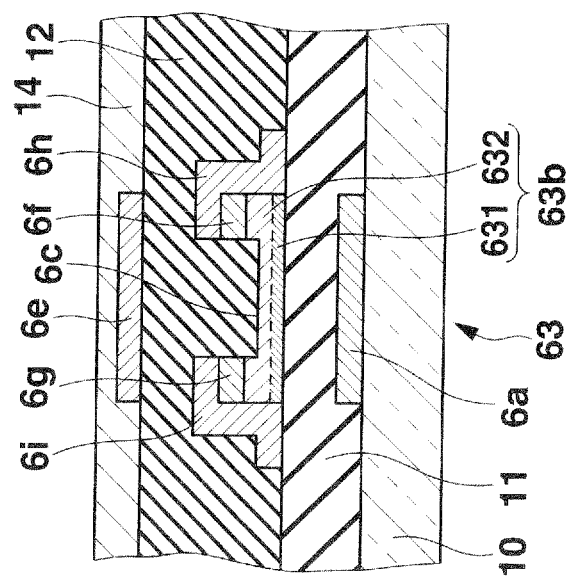
FIG. 44A is an explanatory diagram showing a manufacturing step of a thin film transistor of the third embodiment.

Next, as shown in FIG. 44A and FIG. 44B, the passivation film 14 covering the second gate electrode 5a and the first light blocking film 6e is formed on the second insulating film 12.

With this, the driving transistor 63 and the switch transistor 53 are manufactured.

Moreover, an opening section 12a which exposes the center section of the pixel electrode 8a is formed by patterning the passivation film 14 and the second insulating film 12 using photolithography (see FIG. 33).

Next, after accumulating photosensitive resin such as polyimide, a bank 13 in a shape such as a grid like shape which includes an opening section 13a to expose the pixel electrode 8a is formed by exposing light (see FIG. 33).

Next, a liquid body in which material which is to be the hole injecting layer 8b is dissolved or dispersed in a solvent is applied in the opening section 13a of the bank 13, and the liquid body is dried to successively form the hole injecting layer 8b which is the carrier transporting layer and the light emitting layer 8c (see FIG. 33).

Next, the counter electrode 8d is formed on an entire surface of the bank 13 and the light emitting layer 8c to manufacture the EL element 8 (see FIG. 33) and the EL panel 1 is manufactured.

As described above, when the driving transistor 63 which is the first thin film transistor of the bottom gate structure, and the switch transistor 53 which is the second thin film transistor of the top gate structure are formed, the step to form the first gate electrode 6a of the driving transistor 63 and the second light blocking film 5e of the switch transistor 53 between the substrate 10 and the first insulating film 11 is a different step from the step to form the second gate electrode 5a of the switch transistor 53 and the first light blocking film 6e of the driving transistor 63 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 6a and the first light blocking film 6e of the driving transistor 63 and the step to form the second gate electrode 5a and the second light blocking film 5e of the switch transistor 53, the driving transistor 63 and the switch transistor 53 can be formed differently.

The first light blocking film 6e of the driving transistor 63 is formed with the second gate electrode 5a of the switch transistor 53 and the second light blocking film 5e of the switch transistor 53 is formed with the first gate electrode 6a of the driving transistor 63. Therefore, the driving transistor 63 including the first light blocking film 6e and the switch transistor 53 including the second light blocking film 5e can be formed differently without increasing the number of steps for manufacturing.

In the second semiconductor film 53b of the switch transistor 53, since the second region 532 is positioned on the second gate electrode 5a side, the second region 532 which is the region in the second semiconductor film 53b including more amorphous silicon is to be the electric current path of the channel, and the switch transistor 53 includes the function corresponding to the thin film transistor including the semiconductor film including amorphous silicon. The switch transistor 53 suitably functions as the thin film transistor which controls the on/off of the driving transistor 63.

In the first semiconductor film 63b of the driving transistor 63, since the first region 631 is positioned on the first gate electrode 6a side, the first region 631 which is the region in the first semiconductor film 63b including more crystalline silicon is to be the electric current path of the channel, and the driving transistor 63 includes the function corresponding to the thin film transistor including the semiconductor film including crystalline silicon. The driving transistor 61 suitably functions as the thin film transistor to flow electric current in the EL element 8 by control of the switch transistor 53.

As described above, the driving transistor 63 and the switch transistor 53 include different transistor characteristics, and each transistor exhibit each function so that the EL panel 1 can emit light favorably.

The second light blocking film 5e provided in the switch transistor 53 is positioned so that the channel region of the second semiconductor film 53b is between the second light blocking film 5e and the second gate electrode 5a. Therefore, the second light blocking film 5e and the second gate electrode 5a can block light such as emitted light of the EL element 8, and it is difficult for the light to reach the channel region of the second semiconductor film 53b.

Similarly, the first light blocking film 6e provided in the driving transistor 63 is positioned so that the channel region of the first semiconductor film 63b is positioned between the first light blocking film 6e and the first gate electrode 6a. Therefore, the first light blocking film 6e and the first gate electrode 6a can block light such as emitted light of the EL element 8, and it is difficult for the light to reach the channel region of the first semiconductor film 63b.

As a result, a leak current hardly occurs in the switch transistor 53 and the driving transistor 63 and the transistor characteristic becomes stable. Therefore, the switch transistor 53 and the driving transistor 63 can function preferably.

Moreover, the second light blocking film 5e is connected to the ground line 33 and set to the ground potential and the second light blocking film 5e and the second gate electrode 5a can block an unnecessary electric field which occurs toward the channel region of the second semiconductor film 53b by an element outside the switch transistor 53 so that an electric field shield effect can be obtained. Therefore, the switch transistor 53 can operate normally with a suitable voltage between the second gate electrode 5a and the source electrode 5i and a voltage between the drain electrode 5h and the source electrode 5i.

Similarly, the first light blocking film 6e is connected to the ground line 33 and is set to the ground potential and the first light blocking film 6e and the first gate electrode 6a can block an unnecessary electric field which occurs toward the channel region of the first semiconductor film 63b by an element outside the driving transistor 63 so that an electric field shield effect can be obtained. Therefore, the driving transistor 63 can operate normally with a suitable voltage between the first gate electrode 6a and the source electrode 6i and a voltage between the drain electrode 6h and the source electrode 6i.

In the above configuration, the configuration includes a ground line 33 set at ground potential and the first light blocking film 6e and the second light blocking film 5e are connected to the ground line 33 and set at ground potential, however, the configuration is not limited to the above. The configuration can be without the ground line 33 and the first light blocking film 6e and the second light blocking film 5e do not have to be connected to any component. In this case, the above effect of shielding the electric field cannot be obtained, however, the above light blocking effect can be similarly obtained.

The switch transistor 53 and the driving transistor 63 are thin film transistors of the channel etching type including the inversely staggered structure, and the transistors include a structure which does not include a channel protecting film to protect the channels of the second semiconductor film 53b and the first semiconductor film 63b. Therefore, compared to the thin film transistor which is a type including the channel protecting film, the step to form the channel protecting film can be omitted. Consequently, the number of steps of manufacturing is reduced and the manufacturing cost can be reduced.

Since the switch transistor 53 is a top gate structure, and is a structure in which the source electrode 5*i* and the drain electrode 5*h* are below the second gate electrode 5*a*, the electric field from the second gate electrode 5*a* may be cut by the source electrode 5*i* and the drain electrode 5*h*. However, since the switch transistor 53 of the third embodiment is a thin film transistor of the channel etching type, the electric current path between the source electrode 5*i* and the drain electrode 5*h* is the second region 532 corresponding to the recessed section 5*c* of the second semiconductor film 53*b* and is on the interface side between the second insulating film 12 of the second region 532 and does not flow below the source electrode 5*i* and the drain electrode 5*h*. In other words, the electric field from the second gate electrode 5*a* is cut by the source electrode 5*i* and the drain electrode 5*h* and the channel does not occur below the source electrode 5*i* and the drain electrode 5*h*. Even if the channel does not occur below the source electrode 5*i* and the drain electrode 5*h*, the electric current path between the source electrode 5*i* and the drain electrode 5*h* is stable at the recessed section 5*c* portion of the second semiconductor film 53*b*. Therefore, the switch transistor 53 functions suitably and the on/off switching of the driving transistor 63 can be preferably performed.

Fourth Embodiment

Next, the EL panel and the transistor structure of the fourth embodiment of the present invention are described. The same reference numerals are applied to the components which are similar to the above embodiment and the description is omitted or simplified.

Figure 45:
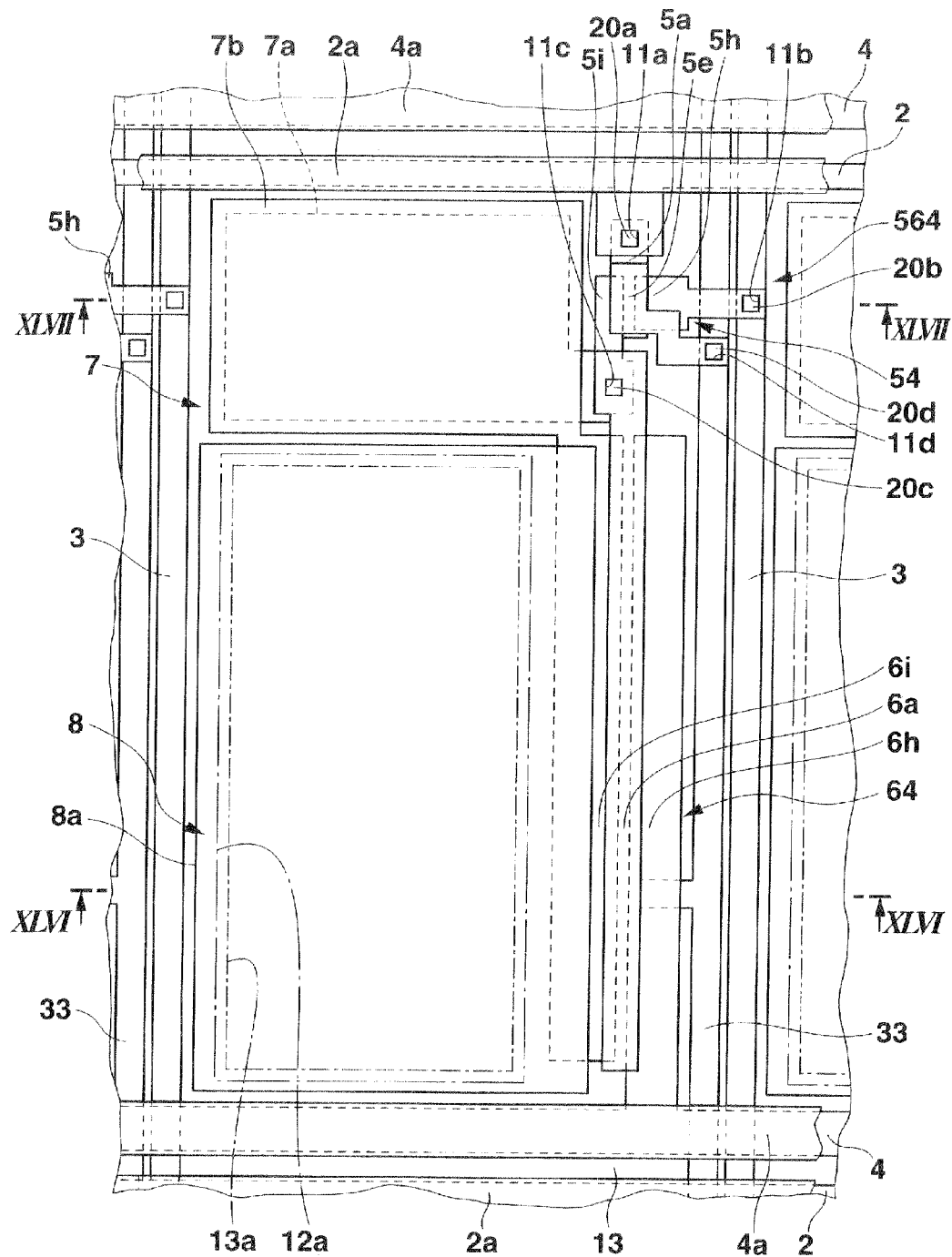
FIG. 45 is a planar view showing one pixel of an EL panel of the fourth embodiment.
Figure 46:
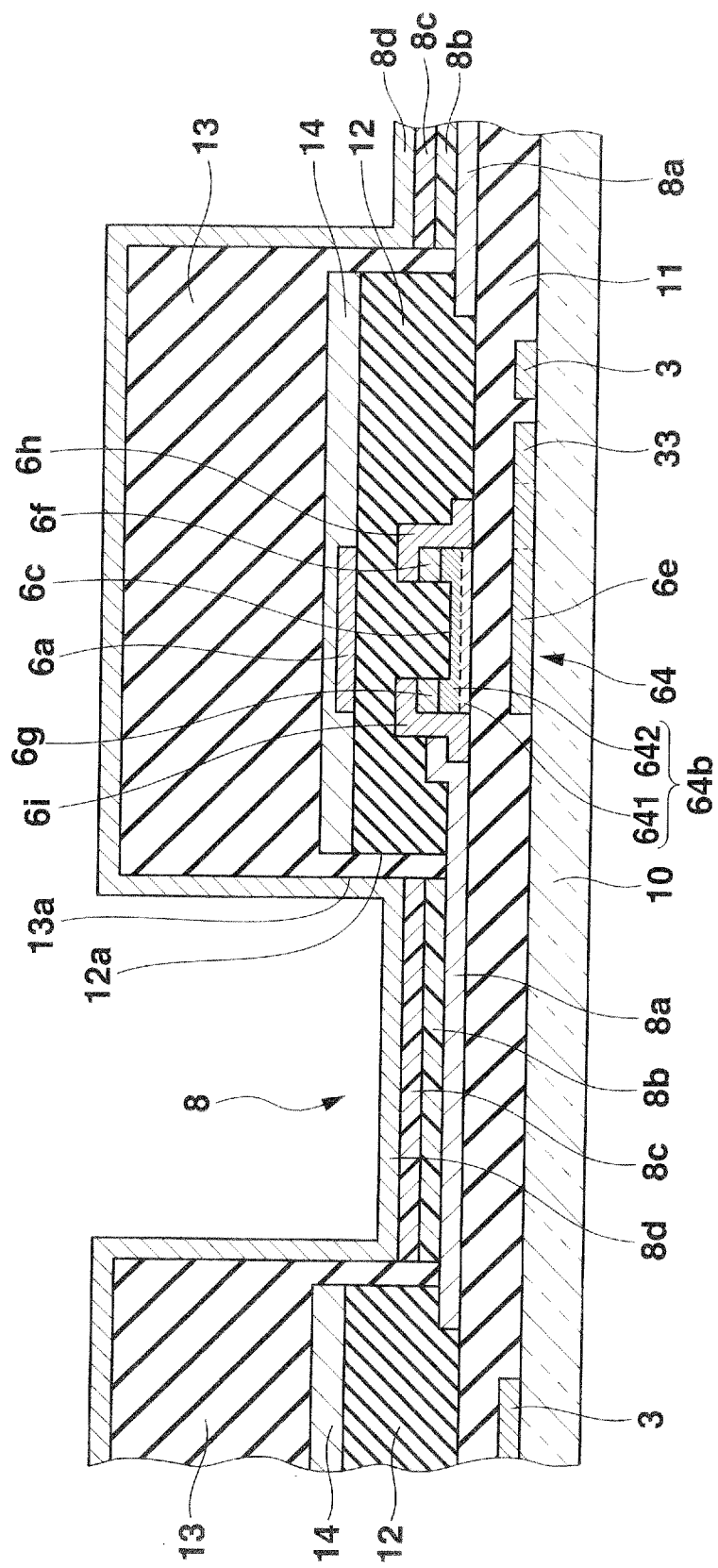
FIG. 46 is a cross sectional view of a plane along arrows XLVI-XLVI shown in FIG. 45.
Figure 47:
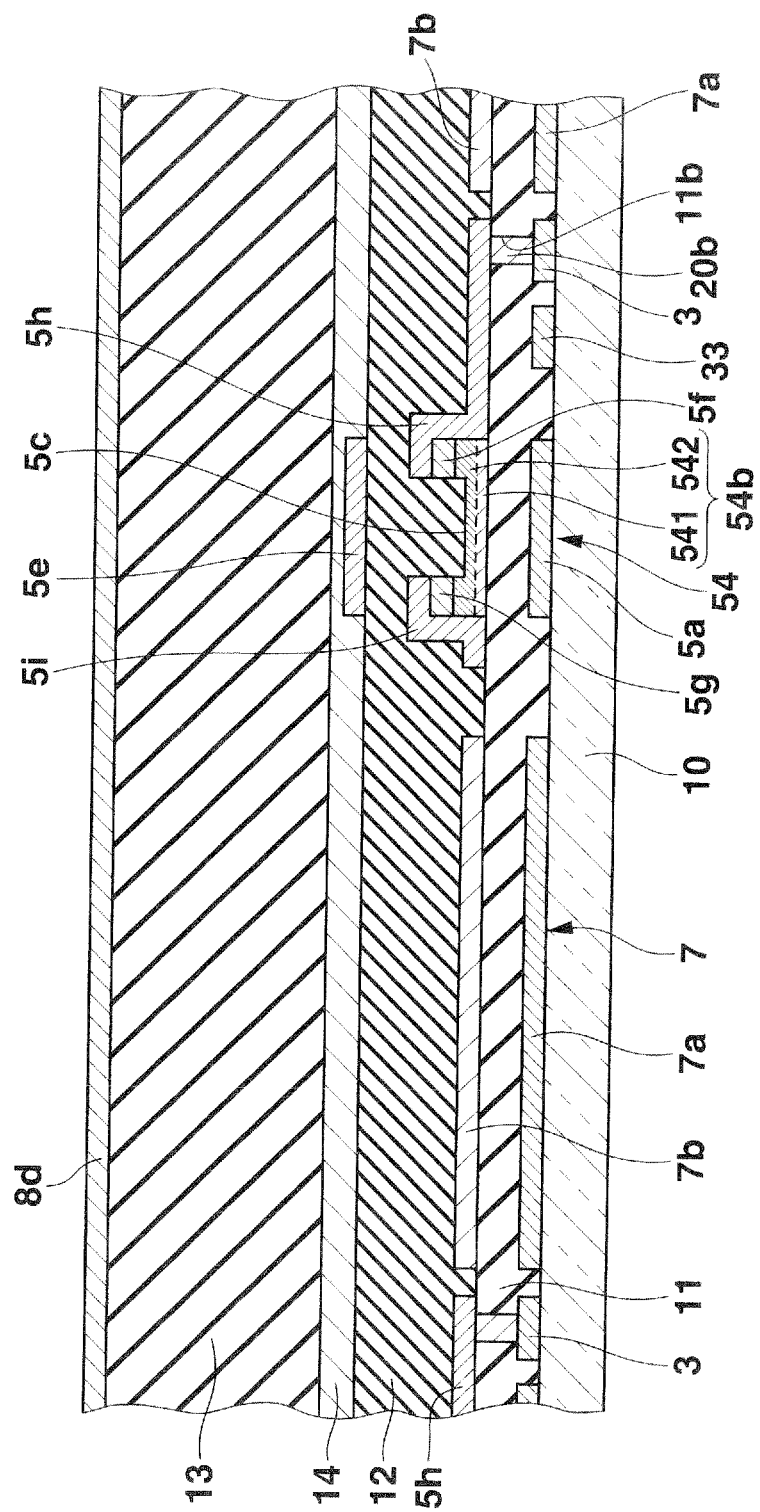
FIG. 47 is a cross sectional view of a plane along arrows XLVII-XLVII shown in FIG. 45.

The configuration of the EL panel 1 of the fourth embodiment and the pixel P is described using FIG. 45 to FIG. 47.

FIG. 45 is a planar view corresponding to one pixel P of the EL panel 1 of the fourth embodiment.

FIG. 46 is a cross sectional view of a plane along arrows XLVI-XLVI shown in FIG. 45.

FIG. 47 is a cross sectional view of a plane along arrows XLVII-XLVII shown in FIG. 45.

FIG. 45 mainly shows electrodes and lines.

As shown in FIG. 45, each pixel P includes a transistor structure 564 including a switch transistor 54 and a driving transistor 64.

The switch transistor 54 and the driving transistor 64 each correspond to the switch transistor 5 and the driving transistor 6 shown in FIG. 3.

The switch transistor 54 and the driving transistor 64 are arranged along the signal line 3, the capacitor 7 is positioned near the switch transistor 54 and the EL element 8 is positioned near the driving transistor 64.

In each pixel P, the switch transistor 54, the driving transistor 64, the capacitor 7 and the EL element 8 are positioned between the scanning line 2 and the voltage supplying line 4.

As shown in FIG. 45 to FIG. 47, a first gate electrode 5*a* is provided on the substrate 10, and a first insulating film 11 is formed on an upper surface of the substrate 10 so as to cover the first gate electrode 5*a*.

On the first insulating film 11, a first semiconductor film 54*b* and a second semiconductor film 64*b*, a pair of impurity semiconductor films 5*f* and 5*g*, a pair of impurity semiconductor films 6*f* and 6*g*, and drain electrodes 5*h* and 6*h* and source electrodes 5*i* and 6*i* are each formed on a predetermined position.

A second insulating film 12 is formed so as to cover the drain electrodes 5*h* and 6*h* and the source electrodes 5*i* and 6*i*.

A second gate electrode 6*a* is provided on the second insulating film 12 and a passivation film 14 is formed on the upper surface of the second insulating film 12 so as to cover the second gate electrode 6*a*.

A first light blocking film 5*e* is provided in the region corresponding to the first semiconductor film 54*b* on the second insulating film 12 and the first semiconductor film 54*b* is positioned between the first gate electrode 5*a* and the first light blocking film 5*e*.

A second light blocking film 6*e* is provided on the substrate 10 in the region corresponding to the second semiconductor film 64*b* below the first insulating film 11 and the second semiconductor film 64*b* is positioned between the second gate electrode 6*a* and the second light blocking film 6*e*.

The drain electrode 6*h* and the source electrode 6*i* of the driving transistor 64 are connected to an edge section of the second semiconductor film 64*b* through a pair of impurity semiconductor films 6*f* and 6*g* each provided on each of a pair of edge sections with a recessed section 6*c* of the second semiconductor film 64*b* in between.

The drain electrode 5*h* and the source electrode 5*i* of the switch transistor 54 are connected to an edge section of the first semiconductor film 54*b* through a pair of impurity semiconductor films 5*f* and 5*g* each provided on each of a pair of edge sections with a recessed section 5*c* of the first semiconductor film 54*b* in between.

The signal line 3 is formed between the substrate 10 and the first insulating film 11.

A ground line 33 set at ground potential is formed along the signal line 3 between the substrate 10 and the first insulating film 11.

The scanning line 2 is formed on the first insulating film 11. On the second insulating film 12 covering above the scanning line 2, a groove is formed along the scanning line 2. In the groove, a conducting layer 2*a* is provided covering the scanning line 2 so as to be in contact with the scanning line 2 and the scanning line 2 and the conducting layer 2*a* are conducted to aim for low resistance of the scanning line 2. The groove and the conducting layer 2*a* do not have to be included.

The voltage supplying line 4 is formed on the first insulating film 11. On the second insulating film 12 covering above the voltage supplying line 4, a groove is formed along the voltage supplying line 4. In the groove, a conducting layer 4*a* is provided covering the voltage supplying line 4 so as to be in contact with the voltage supplying line 4 and the voltage supplying line 4 and the conducting layer 4*a* are conducted. With this, there is an aim for low resistance of the voltage supplying line 4 and to stabilize the amount of electric current supplied to the EL element 8 through the driving transistor 64. The groove and the conducting layer 4*a* do not have to be included.

As shown in FIG. 45 and FIG. 47, the switch transistor 54 is a first thin film transistor with a bottom gate structure of an inversely staggered structured channel etching type. The switch transistor 54 includes a first gate electrode 5*a*, a first semiconductor film 54*b*, impurity semiconductor films 5*f* and 5*g*, a first drain electrode 5*h*, a first source electrode 5*i*, a first light blocking film 5*e* and the like.

The first gate electrode 5*a* is formed between the substrate 10 and the first insulating film 11. It is preferable that this first gate electrode 5*a* is formed from material selected from, for example, a Cr film, an Al film, a Cr/Al laminated film, an AlTi alloy film and an AlTiNd alloy film.

The first insulating film 11 is formed on the first gate electrode 5*a* and the first gate electrode 5*a* is covered by the first insulating film 11. The first insulating film 11 includes, for example, light permeability and includes silicon nitride or silicon oxide.

An intrinsic first semiconductor film 54b is formed in a position on the first insulating film 11 which corresponds with the first gate electrode 5a and the first semiconductor film 54b faces the first gate electrode 5a with the first insulating film 11 in between.

The first semiconductor film 54b includes, for example, crystalline silicon, specifically microcrystalline silicon and includes a first region 541 positioned on the first insulating film 11 side and a second region 542 positioned on the second insulating film 12 side of the opposite surface side. Here, degree of crystallization of silicon of the second region 542 is formed higher than the first region 541. In other words, in the second region 542 of the first semiconductor film 54b, the degree of crystallization of silicon is relatively higher compared to the first region 541, and the rate of the crystalline silicon region is higher compared to the first region 541. In the first region 541 of the first semiconductor film 54b, the rate of the amorphous silicon region is high compared to the second region 542, and preferably, the first region 541 of the first semiconductor film 54b is a region with substantially only amorphous silicon.

The recessed section 5c is formed on an upper surface of the first semiconductor film 54b on a substantially center side including at least a portion of a region corresponding to the first gate electrode 5a. The recessed section 5c is formed in the second region 542 of the first semiconductor film 54b and does not reach the first region 541. A portion corresponding to the recessed section 5c on the first semiconductor film 54b is to be the channel region where a channel is formed.

Both edge sections of the first semiconductor film 54b with the recessed section 5c in between are one step higher than the recessed section 5c.

On one edge section of the first semiconductor film 54b, an impurity semiconductor film 5f is formed and on the other edge section of the first semiconductor film 54b, an impurity semiconductor film 5g is formed.

The impurity semiconductor films 5f and 5g are formed apart from each other on each edge side of the first semiconductor film 54b. The impurity semiconductor films 5f and 5g are n-type semiconductors, however, it is not limited to the above, and when the switch transistor 54 is a p-type transistor, a p-type semiconductor can be used.

The drain electrode 5h is formed on the impurity semiconductor film 5f.

The source electrode 5i is formed on the impurity semiconductor film 5g.

It is preferable that the drain electrode 5h and the source electrode 5i are formed from material selected from, for example, a Cr film, an Al film, a Cr/Al laminated film, an AlTi alloy film, and an AlTiNd alloy film.

On the drain electrode 5h and the source electrode 5i, a second insulating film 12 is formed, and the drain electrode 5h and the source electrode 5i, etc. are covered by the second insulating film 12. The second insulating film 12 includes, for example, silicon nitride or silicon oxide.

The first light blocking film 5e is formed in a position on the second insulating film 12 corresponding to the first semiconductor film 54b (recessed section 5c). The first light blocking film 5e is formed in the same process when the second gate electrode 6a of the driving transistor 64 is formed, and is formed from a material selected from a Cr film, an Al film, a Cr/Al laminated film, an AlTi alloy film, or an AlTiNd alloy film. A portion of the first light blocking film 5e is connected to the ground line 33 through a contact plug 20d.

The first light blocking film 5e on the second insulating film 12 is covered by the passivation film 14.

The passivation film 14 includes, for example, silicon nitride or silicon oxide.

With this, the switch transistor 54 is covered by the first insulating film 11, the second insulating film 12 and the passivation film 14.

In the switch transistor 54, the first insulating film 11 functions as a gate insulating film, and the recessed section 5c portion which is a region one step lower than the first semiconductor film 54b acted on by the electric field of the first gate electrode 5a is to be a channel region in which the channel is formed. The channel is formed in the first region 541 of the first semiconductor film 54b which is the first gate electrode 5a side of the first semiconductor film 54b, and the first region 541 constitutes the electric current path between the source electrode 5i and the drain electrode 5h.

The first region 541 of the first semiconductor film 54b is a semiconductor layer including more amorphous silicon and the switch transistor 54 which uses the first region 541 as the electric current path of the channel corresponds to a thin film transistor including a semiconductor film made from amorphous silicon (or a semiconductor film including amorphous silicon as a main component). In other words, the leak current is smaller in the amorphous silicon of the first region 541 of the switch transistor 54 compared to the crystalline silicon such as microcrystalline silicon and the on/off ratio of the electric current which flows in the semiconductor layer, in other words, the value of (electric current which flows in the semiconductor layer when on)/(electric current which flows in the semiconductor layer when off) is high. Therefore, the switch transistor 54 suitably functions as the switch transistor which controls the on/off of the driving transistor 64.

In the switch transistor 54, the first light blocking film 5e is provided so that the channel region (recessed section 5c) of the first semiconductor film 54b is positioned between the first light blocking film 5e and the first gate electrode 5a. Therefore, light such as the emitted light of the EL element 8 can be blocked with the first light blocking film 5e and the first gate electrode 5a, and it is difficult for such light to reach the channel region of the first semiconductor film 54b. As a result, a leak current hardly occurs in the switch transistor 54 and the transistor characteristic becomes stable. Therefore, the switch transistor 54 can function preferably.

Moreover, the first light blocking film 5e is connected to the ground line 33 and grounded and the first light blocking film 5e can block an unnecessary electric field which acts on the channel region of the first semiconductor film 54b. Therefore, the voltage change between the source and the drain by such unnecessary electric field can be prevented, and the function of the switch transistor 54 can be preferably maintained.

As shown in FIG. 45 and FIG. 46, the driving transistor 64 is a second thin film transistor with a top gate structure of an inversely staggered structured channel etching type. The driving transistor 64 includes a second gate electrode 6a, a second semiconductor film 64b, impurity semiconductor films 6f and 6g, a second drain electrode 6h, a second source electrode 6i, a second light blocking film 6e and the like.

The second light blocking film 6e is formed between the substrate 10 and the first insulating film 11. The second light blocking film 6e is formed in the same process when the first gate electrode 5a of the switch transistor 54 is formed. The first gate electrode 5a and the second light blocking film 6e are formed from a material selected from a Cr film, an Al film, a Cr/Al laminated film, an AlTi alloy film, or an AlTiNd alloy film. A portion of the second light blocking film 6e is connected to the ground line 33.

The first insulating film 11 formed on the upper surface of the substrate 10 includes, for example, light permeability and includes silicon nitride or silicon oxide. The intrinsic second semiconductor film 64b is formed in a position on the first insulating film 11 corresponding to the second gate electrode 6a.

The second semiconductor film 64b includes, for example, crystalline silicon, specifically, microcrystalline silicon and includes a first region 641 positioned on the first insulating film 11 side and a second region 642 positioned on the second insulating film 12 side of the opposite surface side. Here, degree of crystallization of silicon of the second region 642 is formed higher compared to the first region 641. In other words, in the second region 642 of the second semiconductor film 64b, degree of crystallization of silicon is relatively higher compared to the first region 641, and the rate of the crystalline silicon region is higher compared to the first region 641. In the first region 641 of the second semiconductor film 64b, the rate of the amorphous silicon region is higher compared to the second region 642, and preferably the first region 641 of the first semiconductor film 64b is a region with substantially only amorphous silicon. The first region 641 of the second semiconductor film 64b and the first region 541 of the first semiconductor film 54b have the same composition and have the same thickness. The second region 642 of the second semiconductor film 64b and the second region 542 of the first semiconductor film 54b have the same composition and have the same thickness. Therefore, as described later, the second semiconductor film 64b and the first semiconductor film 54b can be manufactured collectively with the same process using the semiconductor layer 9 which is a layer with the same material.

The recessed section 6c is formed on an upper surface of the second semiconductor film 64b on a substantially center side including at least a portion of a region corresponding to the second gate electrode 6a. The recessed section 6c is formed in the second region 642 of the second semiconductor film 64b and does not reach the first region 641. A portion corresponding to the recessed section 6c on the second semiconductor film 64b is to be the channel region where a channel is formed.

Both edge sections of the second semiconductor film 64b with the recessed section 5c in between are one step higher than the recessed section 5c. On one edge section of the second semiconductor film 64b, an impurity semiconductor film 6f is formed, and on the other edge section of the second semiconductor film 64b, an impurity semiconductor film 6g is formed. The impurity semiconductor films 6f and 6g are formed apart from each other on each edge side of the second semiconductor film 64b. The impurity semiconductor films 6f and 6g are n-type semiconductors, however, it is not limited to the above, and when the driving transistor 64 is a p-type transistor, a p-type semiconductor can be used. The impurity semiconductor films 6f and 6g and the impurity semiconductor films 5f and 5g are composed of the same material and have the same thickness. As described later, the impurity semiconductor films 6f and 6g and the impurity semiconductor films 5f and 5g can be manufactured collectively with the same process using the impurity semiconductor layer 9f which is a layer with the same material.

The drain electrode 6h is formed on the impurity semiconductor film 6f. The source electrode 6i is formed on the impurity semiconductor film 6g. It is preferable that the drain electrode 6h and the source electrode 6i are formed from material selected from, for example, a Cr film, an Al film, a Cr/Al laminated film, an AlTi alloy film and an AlTiNd alloy film. The drain electrode 5h and the source electrode 5i, and the drain electrode 6h and the source electrode 6i are composed of the same material and have the same thickness. As described later, the drain electrode 5h and the source electrode 5i and the drain electrode 6h and the source electrode 6i can be manufactured collectively with the same process using the conducting film 9h which is a layer with the same material.

A second insulating film 12 is formed on the drain electrode 6h and the source electrode 6i, and the drain electrode 6h, the source electrode 6i, etc. are covered by the second insulating film 12.

The second gate electrode 6a is formed in a position on the second insulating film 12 corresponding to the recessed section 6c of the second semiconductor film 64b. It is preferable that the second gate electrode 6a is formed from material selected from, for example, a Cr film, an Al film, a Cr/Al laminated film, an AlTi alloy film and an AlTiNd alloy film. The second gate electrode 6a on the second insulating film 12 is covered by the passivation film 14.

The driving transistor 64 is covered by the first insulating film 11, the second insulating film 12 and the passivation film 14.

In the driving transistor 64, the second insulating film 12 functions as a gate insulating film, and the recessed section 6c portion which is a region one step lower than the second semiconductor film 64 acted on by the electric field of the second gate electrode 6a is to be where the channel (channel region) is formed. The channel is formed in a second region 642 of the second semiconductor film 64b which is the second gate electrode 6a side of the second semiconductor film 64b, and the second region 642 constitutes the electric current path between the source electrode 6i and the drain electrode 6h.

The second region 642 of the second semiconductor film 64b is a semiconductor layer including more crystalline silicon than the first region 641. Therefore, the driving transistor 64 which uses the second region 642 as the electric current path of the channel corresponds to a thin film transistor including a semiconductor film made from crystalline silicon (or a semiconductor film including crystalline silicon as the main component). In other words, the microcrystalline silicon in the second region 642 of the driving transistor 64 is crystalline silicon with a grain diameter of about 50 to 100 nm. Therefore, the shift of threshold voltage by the driving of the transistor is small compared to the amorphous silicon and the deterioration of the transistor can be suppressed. Moreover, the degree of carrier mobility is high, and therefore the driving transistor 64 suitably functions as a driving transistor which flows electric current in the EL element 8 by control of the switch transistor 54.

In the driving transistor 64 with a top gate structure, the electric current path of the channel in the second region 642 of the second semiconductor film 64b is not on the interface side between the first region 641 but is on the interface side between the second insulating film 12 nearer to the second gate electrode 6a. Since the interface side between the second insulating film 12 has a higher degree of crystallization of silicon than the interface side between the first region 641 in the second region 642 of the second semiconductor film 64b, the region is suitable for the electric current path of the driving transistor 64.

This is because, since in the beginning of growth of the second region 642 including crystalline silicon, the crystallization of silicon is not stable, and the degree of crystallization of silicon on the interface side between the first region 641 in the second region 642 causes a relatively bad incubation layer, and in the second region 642 on the interface side between the second insulating film 12, a semiconductor film in which the crystallization of silicon is stable can be formed.

The second region 642 on the interface side between the second insulating film 12 formed with stable crystallization of silicon is more suitable as an electric current path. Therefore, by forming the top gate structure of the driving transistor 64 with the second region 642 as the electric current path, the driving transistor 64 functions more suitably as a driving transistor.

In the driving transistor 64, the second light blocking film 6e is provided so that the channel region (recessed section 6c) of the second semiconductor film 64b is positioned between the second light blocking film 6e and the second gate electrode 6a. Therefore, light such as the emitted light of the EL element 8 can be blocked with the second light blocking film 6e and the second gate electrode 6a, and it is difficult for such light to reach the channel region of the second semiconductor film 64b. As a result, a leak current hardly occurs in the driving transistor 64 and the transistor characteristic becomes stable. Therefore, the driving transistor 64 can function preferably.

Moreover, the second light blocking film 6e is connected to the ground line 33 and grounded and the second light blocking film 6e can block an unnecessary electric field which acts on the channel region of the second semiconductor film 64b. Therefore, the voltage change between the source and the drain by such unnecessary electric field can be prevented and the change of the driving electric current of the driving transistor 64 can be suppressed. Consequently, the function of the driving transistor 64 can be preferably maintained.

The capacitor 7 is connected between the second gate electrode 6a and the source electrode 6i of the driving transistor 64. Specifically, the electrode 7a of the capacitor 7 is connected to the second gate electrode 6a of the driving transistor 64, and the electrode 7b of the capacitor 7 is connected to the source electrode 6i of the driving transistor 64. Then, as shown in FIG. 45 and FIG. 47, one electrode 7a of the capacitor 7 is formed between the substrate 10 and the first insulating film 11, and the other electrode 7b of the capacitor 7 is formed between the first insulating film 11 and the second insulating film 12. The electrode 7a and the electrode 7b face each other with the first insulating film 11, which is a dielectric material, in between.

The signal line 3, the ground line 33, the electrode 7a of the capacitor 7, the first gate electrode 5a of the switch transistor 54, and the second light blocking film 6e of the driving transistor 64 are collectively formed by processing the shape of a conducting film formed on an entire surface of the substrate 10 by photolithography, etching, etc.

The scanning line 2, the voltage supplying line 4, the electrode 7b of the capacitor 7, the drain electrode 5h and the source electrode 5i of the switch transistor 54, and the drain electrode 6h and the source electrode 6i of the driving transistor 64 are collectively formed by processing the shape of a conducting film formed from conductive material formed on an entire surface of the first insulating film 11 by photolithography, etching, etc.

The first light blocking film 5e of the switch transistor 54, the second gate electrode 6a of the driving transistor 64, are collectively formed by processing the shape of a conducting film formed on an entire surface of the second insulating film 12 by photolithography, etching, etc. The conducting layer 4a layered on the voltage supplying line 4 and the conducting layer 2a layered on the scanning line 2 are formed together with the second gate electrode 6a and the first light blocking film 5e.

On the first insulating film 11, a contact hole 11a is formed on a region where the first gate electrode 5a and the scanning line 2 overlaps, a contact hole 11b is formed on a region where the drain electrode 5h and the signal line 3 overlaps and a contact hole 11c is formed on a region where the second gate electrode 6a and the source electrode 5i overlaps. The contact hole 11c is formed connected with the second insulating film 12 also. Contact plugs 20a to 20c are each implanted in the contact holes 11a to 11c. The first gate electrode 5a of the switch transistor 54 and the scanning line 2 are electrically conducted by the contact plug 20a, the drain electrode 5h of the switch transistor 54 and the signal line 3 are electrically conducted by the contact plug 20b. The source electrode 5i of the switch transistor 54 and the electrode 7a of the capacitor 7 as well as the source electrode 5i of the switch transistor 54 and the second gate electrode 6a of the driving transistor 64 are electrically conducted by the contact plug 20c. The scanning line 2 can be conducted with the first gate electrode 5a by direct contact, the drain electrode 5h can be conducted with the signal line 3 by direct contact and the source electrode 5i can be conducted with the second gate electrode 6a by direct contact without using the contact plugs 20a to 20c.

In the first insulating film 11 and the second insulating film 12, a contact hole 11d is formed in a region where the first light blocking film 5e overlaps with the ground line 33, and a contact plug 20d is implanted in the contact hole 11d. The first light blocking film 5e and the ground line 33 are conducted by the contact plug 20d and the first light blocking film 5e is grounded.

The drain electrode 6h of the driving transistor 64 is connected as one with the voltage supplying line 4, and the source electrode 6i of the driving transistor 64 is connected as one with the electrode 7b of the capacitor 7.

The EL element 8 emits light by driving and control of the transistor structure 564 including the switch transistor 54 and the driving transistor 64, and the EL panel 1 including the transistor structure 564 similarly emits light.

Next, the manufacturing method of the switch transistor 54 and the driving transistor 64 composing the transistor structure 564 in the EL panel 1 of the present invention is described using FIG. 48A and FIG. 48B to FIG. 57A and FIG. 57B showing each process.

Regarding the switch transistor 54 and the driving transistor 64 shown in the diagram explaining each step, a portion of the shape, dimension and the like is different from the actual embodiment, such as in FIG. 45, however, to simplify explanation, each thin film transistor is shown to be the same size and the main section of each thin film transistor is schematically illustrated and explained. FIG. A of each figure shows the driving transistor 64 and FIG. B of each figure shows the switch transistor 54.

Figure 48B:
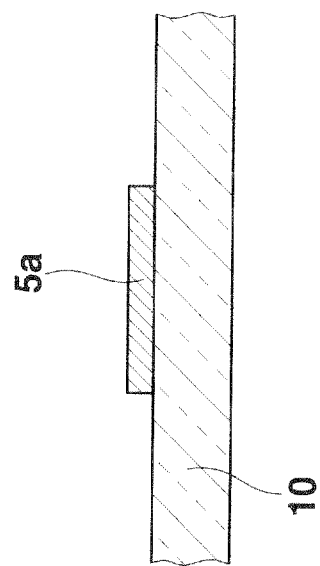
FIG. 48B is an explanatory diagram showing a manufacturing step of a thin film transistor of the fourth embodiment.
Figure 48A:
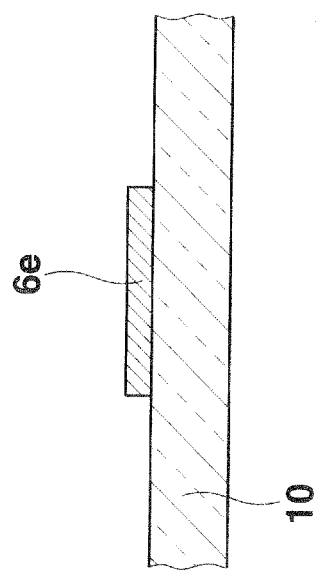
FIG. 48A is an explanatory diagram showing a manufacturing step of a thin film transistor of the fourth embodiment.

First, as shown in FIG. 48A and FIG. 48B, a gate metal layer including, for example, a Cr film, an Al film, a Cr/Al laminated film, an AlTi alloy film or an AlTiNd alloy film, etc. is accumulated on the substrate 10 by sputtering and patterned by photolithography, etching, etc. to form the first gate electrode 5a of the switch transistor 54 and the second light blocking film 6e of the driving transistor 64. Moreover, together with the first gate electrode 5a and the second light blocking film 6e, the signal line 3, the ground line 33 and the electrode 7a of the capacitor 7 are formed on the substrate 10 (see FIG. 45 to FIG. 47).

Figure 49B:
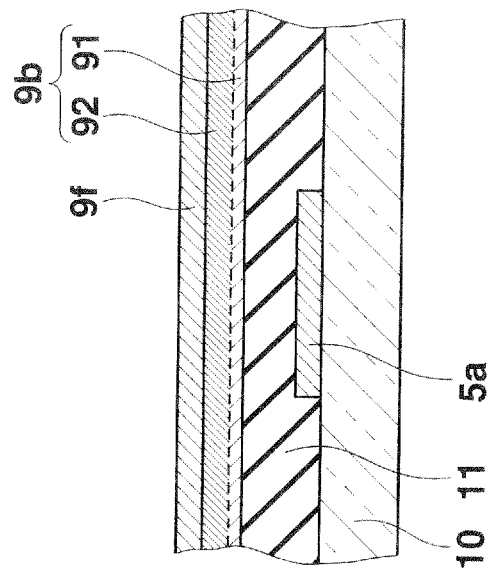
FIG. 49B is an explanatory diagram showing a manufacturing step of a thin film transistor of the fourth embodiment.
Figure 49A:
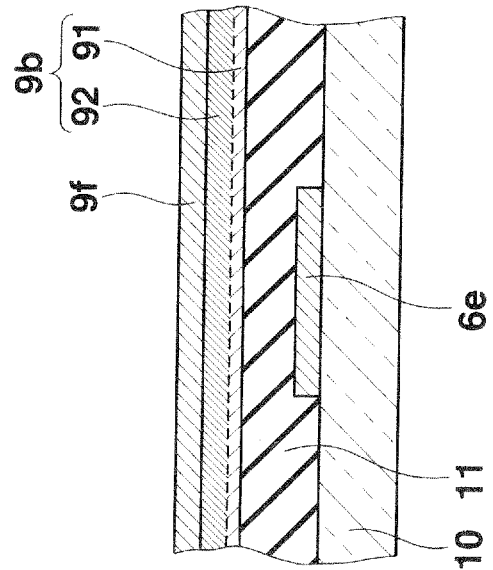
FIG. 49A is an explanatory diagram showing a manufacturing step of a thin film transistor of the fourth embodiment.

Next, as shown in FIG. 49A and FIG. 49B, the first insulating film 11 such as silicon nitride, etc. is formed by plasma CVD (PE-CVD).

Moreover, as shown in FIG. 49A and FIG. 49B, the semiconductor layer 9b including crystalline silicon is formed on the first insulating film 11 by plasma CVD. Here, when the semiconductor layer 9b which is to be the semiconductor film (54b, 64b) is formed, the first silicon layer 91 with a relatively low degree of crystallization of silicon is formed first, and then a second silicon layer 92 with a relatively high degree of crystallization of silicon is formed. Preferably, the first silicon layer 91 is substantially only amorphous silicon.

Specifically, under conditions of setting the ratio of the $H_2$ gas lower compared to the $SiH_4$ gas and by making the plasma power and the pressure low, the first silicon layer 91 which is an amorphous silicon thin film is formed.

Then, by setting the ratio of the $H_2$ gas overwhelmingly larger compared to the $SiH_4$ gas and by making the plasma power and the pressure large to raise the degree of crystallization, the second silicon layer 92 which is a microcrystalline silicon thin film is formed.

In the present embodiment, the second silicon layer 92 is formed under conditions of using argon as a carrier gas, setting the gas flow rate to $SiH_4/H_2$=50/10500 [SCCM], setting power density at 0.134 [W/cm$^2$] and setting the pressure at 300 [Pa].

The degree of crystallization of silicon of the first silicon layer 91 and the second silicon layer 92 in the semiconductor layer 9b (the first region and the second region in the semiconductor film) can be determined based on the degree of crystallization calculated by raman spectrophotometry as described above. For example, when the degree of crystallization is 20% or more, it is defined to be a microcrystalline silicon thin film, and when the degree of crystallization is less than 20%, it is defined to be an amorphous silicon thin film (see FIG. 61).

Moreover, as preprocessing of forming the semiconductor layer 9b on the first insulating film 11, it is preferable to perform plasma processing on the surface of the first insulating film 11. When the plasma processing is performed on the first insulating film 11, the surface of the first insulating film 11 is reformed, and the degree of crystallization of the crystalline silicon formed on the first insulating film 11 can be raised.

The plasma processing of the present embodiment can be performed under conditions such as using $H_2$ gas, setting the gas flow rate to 1000 [SCCM], setting the power density to 0.178 [W/cm$^2$] and setting the pressure to 80 [Pa].

Next, as shown in FIG. 49A and FIG. 49B, the impurity semiconductor layer 9f which is to be the impurity semiconductor film is formed by sputtering or CVD method on the semiconductor layer 9b (second silicon layer 92).

The material used as the impurity semiconductor layer 9f is different according to whether the thin film transistor is p-type or n-type.

In a p-type transistor (p$^+$Si), the layer is formed by forming a film of plasma mixing an acceptor type impurity such as diborane, etc. in $SiH_4$ gas.

In an n-type transistor (n$^+$Si), the layer is formed by forming a film of plasma by mixing a donor type impurity such as arsine, phosphine, etc. in the $SiH_4$ gas.

Figure 50A:
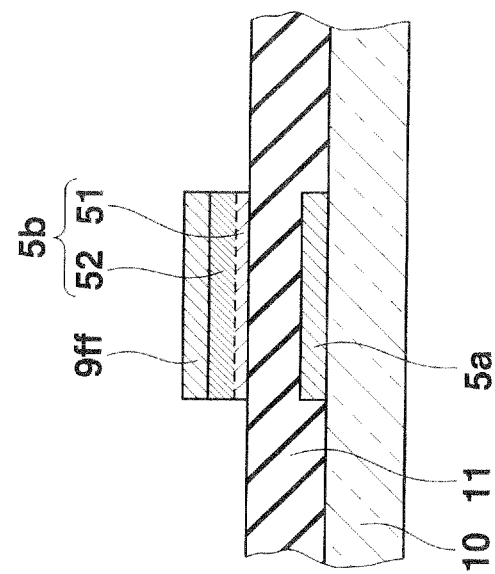
FIG. 50A is an explanatory diagram showing a manufacturing step of a thin film transistor of the fourth embodiment.
Figure 50B:
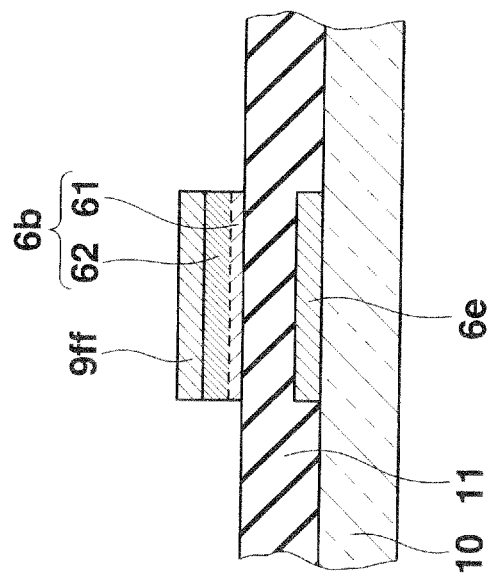
FIG. 50B is an explanatory diagram showing a manufacturing step of a thin film transistor of the fourth embodiment.

Next, as shown in FIG. 50A and FIG. 50B, the semiconductor layer 9b and the impurity semiconductor layer 9f are patterned by photography, etching etc. to form a second semiconductor film 64b including a first region 641 and a second region 642 and an impurity semiconductor layer section 9ff provided on the second semiconductor film 64b, and a first semiconductor film 54b including a first region 541 and a second region 542 and an impurity semiconductor layer section 9ff provided on the first semiconductor film 54b.

Figure 51A:
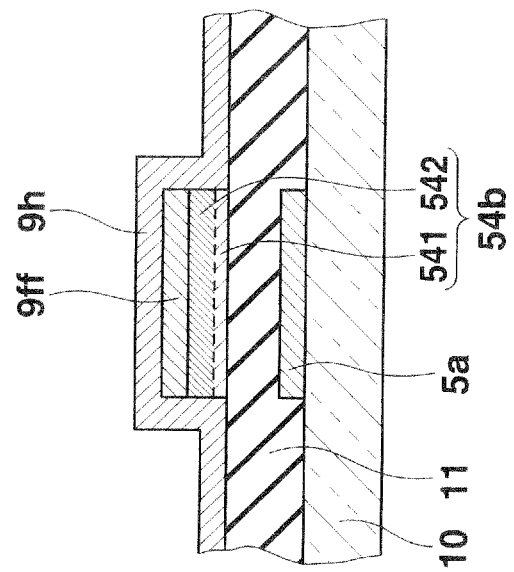
FIG. 51A is an explanatory diagram showing a manufacturing step of a thin film transistor of the fourth embodiment.
Figure 51B:
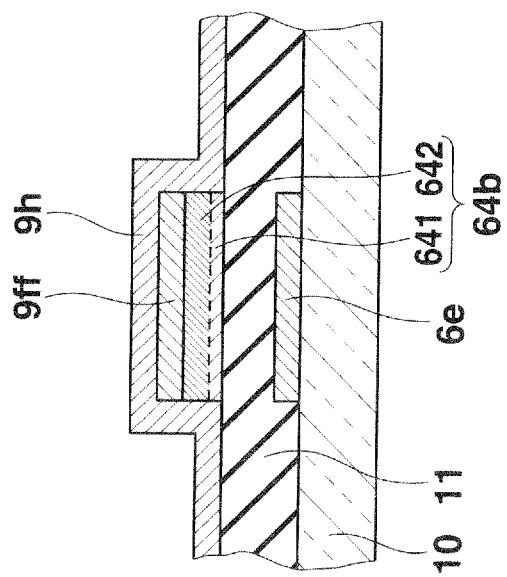
FIG. 51B is an explanatory diagram showing a manufacturing step of a thin film transistor of the fourth embodiment.

Next, as shown in FIG. 51A and FIG. 51B, a conducting film 9h which is to be the source electrode and the drain electrode is formed on the first insulating film 11 so as to cover the impurity semiconductor layer section 9ff by, for example sputtering.

Figure 52A:
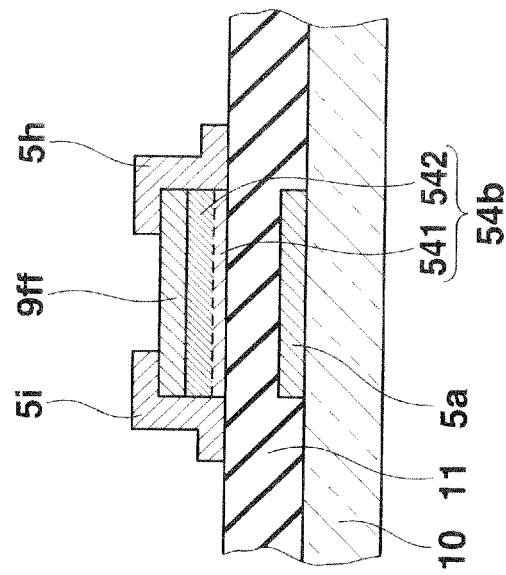
FIG. 52A is an explanatory diagram showing a manufacturing step of a thin film transistor of the fourth embodiment.
Figure 52B:
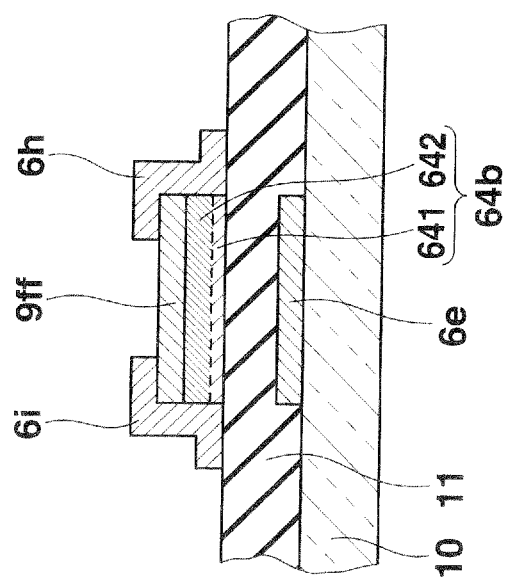
FIG. 52B is an explanatory diagram showing a manufacturing step of a thin film transistor of the fourth embodiment.

Next, as shown in FIG. 52A and FIG. 52B, the conducting film 9h is patterned by photolithography, etching, etc. and the source electrode 6i and the drain electrode 6h of the driving transistor 64, the source electrode 5i and the drain electrode 5h of the switch transistor 54 are formed. Moreover, together with the source electrode and the drain electrode, the scanning line 2, the voltage supplying line 4, and the electrode 7b of the capacitor 7 are also formed. (see FIG. 45 to FIG. 47).

Figure 53A:
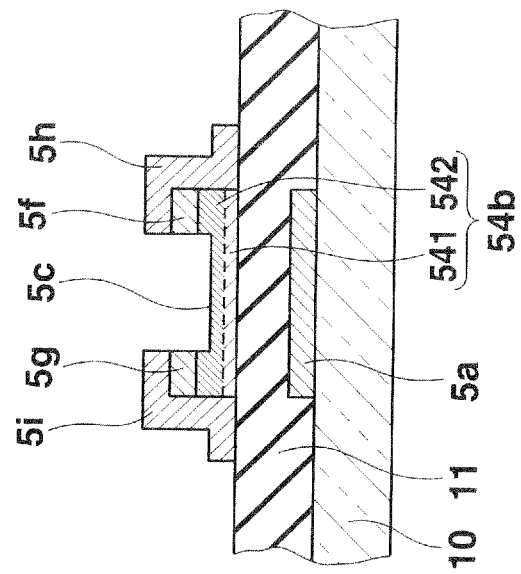
FIG. 53A is an explanatory diagram showing a manufacturing step of a thin film transistor of the fourth embodiment.
Figure 53B:
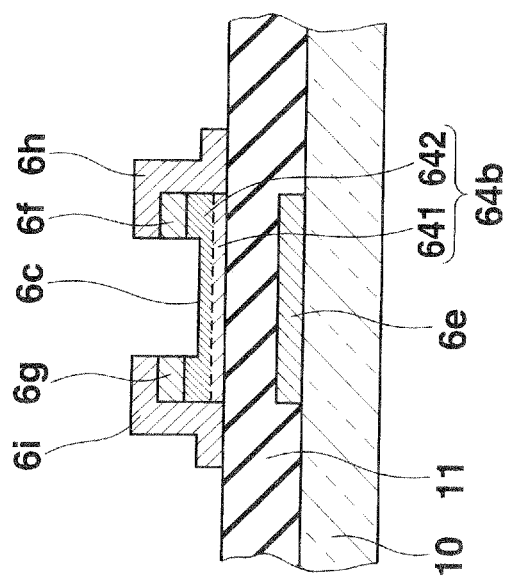
FIG. 53B is an explanatory diagram showing a manufacturing step of a thin film transistor of the fourth embodiment.

Next, as shown in FIG. 53A and FIG. 53B, the drain electrode 6h and the source electrode 6i are used as a mask and the impurity semiconductor layer section 9ff is patterned by dry etching to form a pair of impurity semiconductor films 6f and 6g. The upper surface of the second semiconductor film 64b is also etched to form the recessed section 6c in the second region 642 on the upper surface side of the second semiconductor film 64b. Under an etching condition where the recessed section 6c does not reach the first region 641 of the second semiconductor film 64b, a pair of impurity semiconductor films 6f and 6g is formed together with the recessed section 6c.

Similarly, the drain electrode 5h and the source electrode 5i are used as a mask and the impurity semiconductor layer section 9ff is patterned by dry etching to form a pair of impurity semiconductor films 5f and 5g. The upper surface of the first semiconductor film 54b is also etched to form the recessed section 5c in the second region 542 on the upper surface side of the first semiconductor film 54b. Under an etching condition where the recessed section 5c does not reach the first region 541 of the first semiconductor film 54b, a pair of impurity semiconductor films 5f and 5g is formed together with the recessed section 5c.

Here, in performing dry etching on the impurity semiconductor layer section 9ff when the recessed section 6c is formed in the second semiconductor film 64b of the driving transistor 64 with a top gate structure, it is preferable to perform etching so as not to exceed half of the thickness of the second region 642 from the upper surface of the second region 642 of the second semiconductor film 64b. Even more preferably, the etching is performed to form a recessed section 6c with a depth of one third of the thickness of the second region 642.

This is because, when etching is performed exceeding half of the thickness of the second region 642 from the upper surface of the second region 642 of the second semiconductor film 6b, the recessed section 6c may reach the incubation layer of the second region 642 or the incubation layer may be included in the electric current path in the second region 642, and a problem occurs which prevents the rise of the on electric current of the transistor.

Therefore, in order to use the portion (upper surface side of the second region 642) with stable crystallization of silicon in the second region 642 as the electric current path, it is preferable to not etch the second region 642 of the second insulating film 64b too deep, and to stop the depth of the recessed section 6c at about half of the thickness of the second region 642.

Figure 54B:
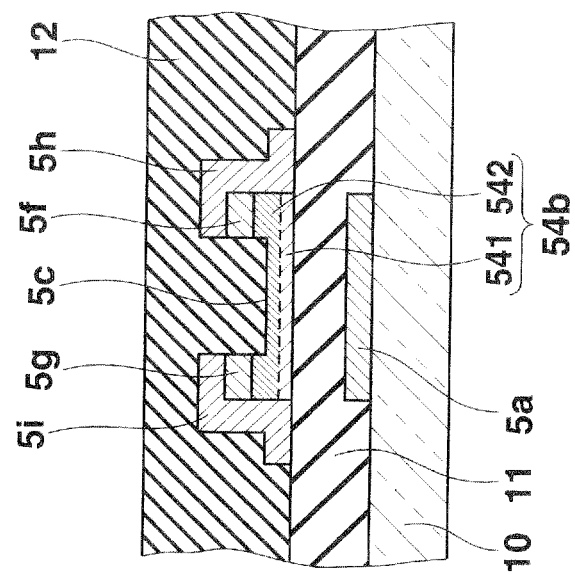
FIG. 54B is an explanatory diagram showing a manufacturing step of a thin film transistor of the fourth embodiment.
Figure 54A:
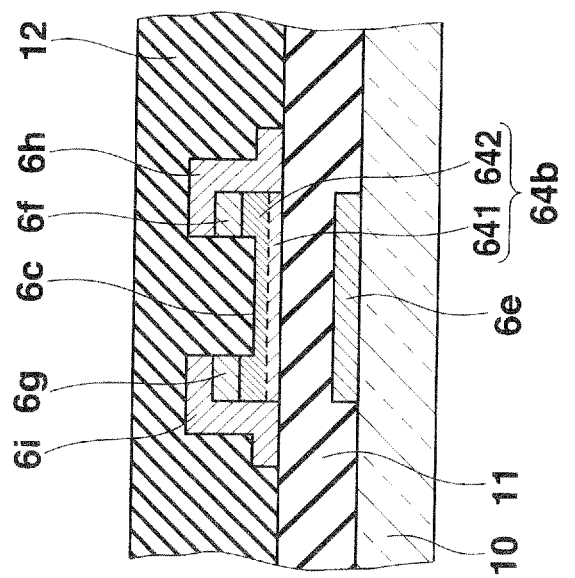
FIG. 54A is an explanatory diagram showing a manufacturing step of a thin film transistor of the fourth embodiment.

Next, as shown in FIG. 54A and FIG. 54B, the second insulating film 12 which covers the source electrode 6i and the drain electrode 6h of the driving transistor 64 and the source electrode 5i and the drain electrode 5h of the switch transistor 54 is formed.

A groove to expose the scanning line 2 and the voltage supplying line 4 is formed in the second insulating film 12.

Before forming the second insulating film 12, the pixel electrode 8a conducted with the source electrode 6i of the driving transistor 64 is formed (see FIG. 46).

Figure 55B:
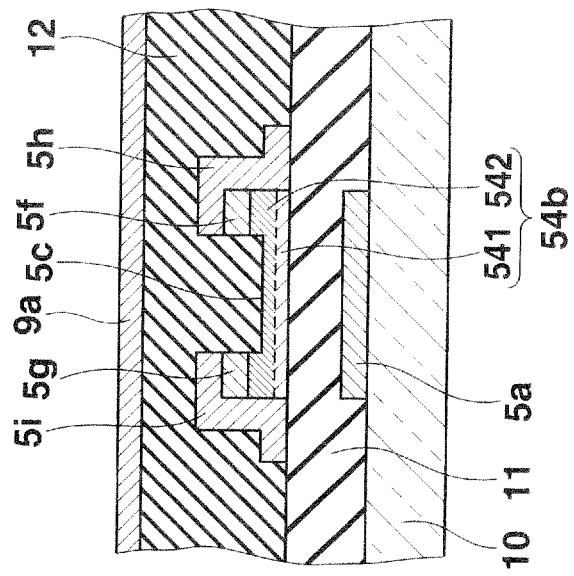
FIG. 55B is an explanatory diagram showing a manufacturing step of a thin film transistor of the fourth embodiment.
Figure 55A:
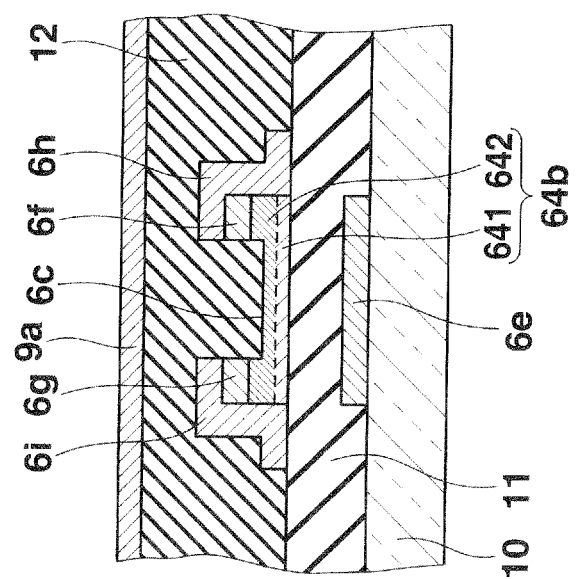
FIG. 55A is an explanatory diagram showing a manufacturing step of a thin film transistor of the fourth embodiment.

Next, as shown in FIG. 55A and FIG. 55B, a gate metal layer 9a of, for example, a Cr film, an Al film, a Cr/Al laminated film, an AlTi alloy film or an AlTiNd alloy film, etc. is formed by sputtering, etc. on the second insulating film 12 and in the groove exposing the scanning line 2 and the voltage supplying line 4.

Figure 56A:
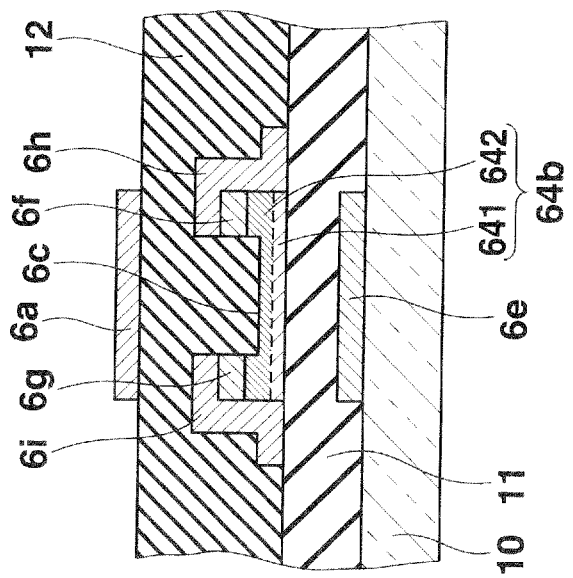
FIG. 56A is an explanatory diagram showing a manufacturing step of a thin film transistor of the fourth embodiment.
Figure 56B:
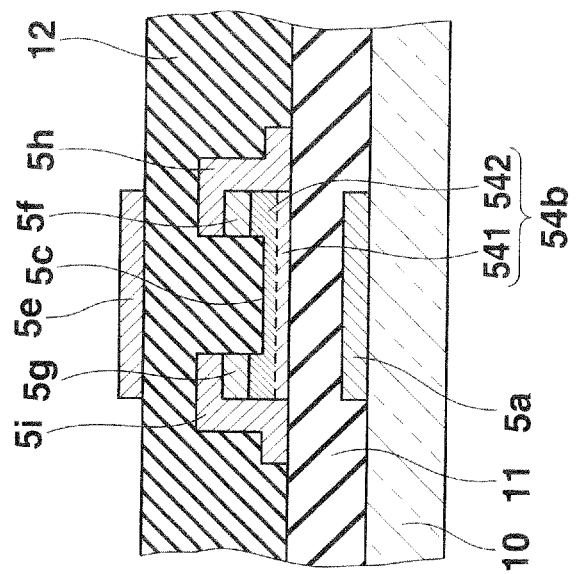
FIG. 56B is an explanatory diagram showing a manufacturing step of a thin film transistor of the fourth embodiment.

Next, as shown in FIG. 56A and FIG. 56B, the gate metal layer 9a is patterned using photolithography, etching, etc. and the second gate electrode 6a of the driving transistor 64 and the first light blocking film 5e of the switch transistor 54 are formed. The conducting layer 2a and the conducting layer 4a are formed with the second gate electrode 6a and the first light blocking film 5e (see FIG. 45).

Figure 57B:
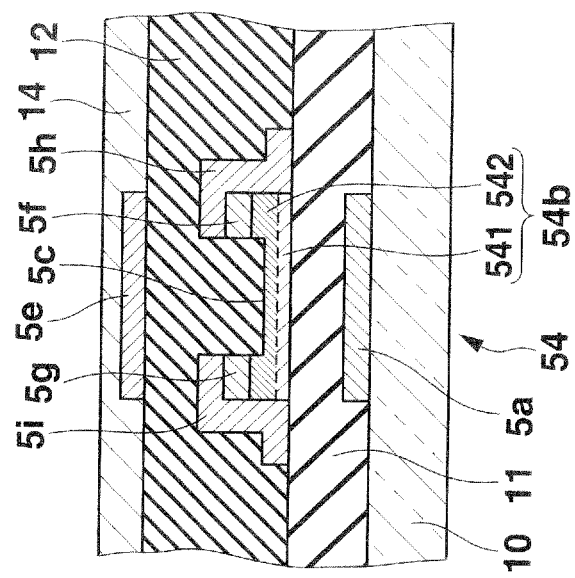
FIG. 57B is an explanatory diagram showing a manufacturing step of a thin film transistor of the fourth embodiment.
Figure 57A:
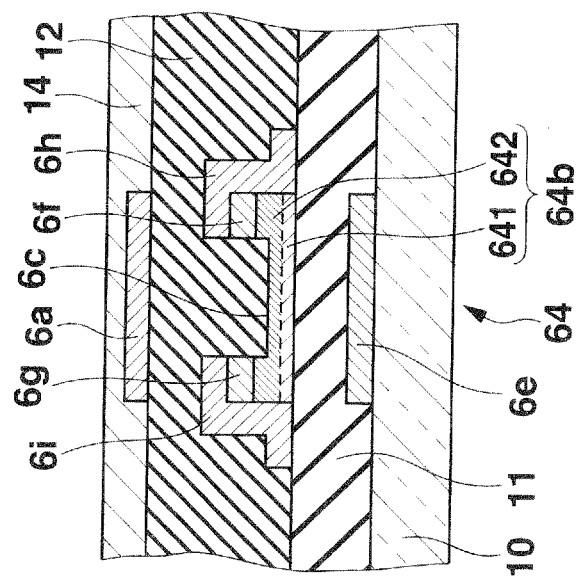
FIG. 57A is an explanatory diagram showing a manufacturing step of a thin film transistor of the fourth embodiment.

Next, as shown in FIG. 57A and FIG. 57B, the passivation film 14 covering the second gate electrode 6a and the first light blocking film 5e is formed on the second insulating film 12.

With this, the driving transistor 64 and the switch transistor 54 are manufactured.

Moreover, an opening section 12a which exposes the center section of the pixel electrode 8a is formed by patterning the passivation film 14 and the second insulating film 12 using photolithography (see FIG. 46).

Next, after accumulating photosensitive resin such as polyimide, a bank 13 in a shape such as a grid like shape which includes an opening section 13a to expose the pixel electrode 8a is formed by exposing light (see FIG. 46).

Next, a liquid body in which material which is to be the hole injecting layer 8b and the light emitting layer 8c is dissolved or dispersed in a solvent is applied in the opening section 13a of the bank 13, and the liquid body is dried to successively form the hole injecting layer 8b which is a carrier transport layer and the light emitting layer 8c (see FIG. 46).

Next, the counter electrode 8d is formed on an entire surface of the bank 13 and the light emitting layer 8c to manufacture the EL element 8 (see FIG. 46) and the EL panel 1 is manufactured.

As described above, when the switch transistor 54 which is the first thin film transistor of the bottom gate structure, and the driving transistor 64 which is the second thin film transistor of the top gate structure are formed, the step to form the first gate electrode 5a of the switch transistor 54 and the second light blocking film 6e of the driving transistor 64 between the substrate 10 and the first insulating film 11 is a different step from the step to form the second gate electrode 6a of the driving transistor 64 and the first light blocking film 5e of the switch transistor 54 between the second insulating film 12 and the passivation film 14, and the other configuration of the thin film transistor can be formed by common steps.

In other words, according to the manufacturing method of manufacturing by common manufacturing steps in the steps other than the step to form the first gate electrode 5a and the first light blocking film 5e of the switch transistor 54 and the step to form the second gate electrode 6a and the second light blocking film 6e of the driving transistor 64, the driving transistor 64 and the switch transistor 54 can be formed differently.

The first light blocking film 5e of the switch transistor 54 is formed with the second gate electrode 6a of the driving transistor 64 and the second light blocking film 6e of the driving transistor 64 is formed with the first gate electrode 5a of the switch transistor 54. Therefore, the switch transistor 54 including the first light blocking film 5e and the driving transistor 64 including the second light blocking film 6e can be formed differently without increasing the number of steps for manufacturing.

In the first semiconductor film 54b of the switch transistor 54, since the first region 541 is positioned on the first gate electrode 5a side, the first region 541 which is the region in the first semiconductor film 54b including more amorphous silicon is to be the electric current path of the channel, and the switch transistor 54 includes the function corresponding to the thin film transistor including the semiconductor film including amorphous silicon. The switch transistor 54 suitably functions as the thin film transistor which controls the on/off of the driving transistor 64.

In the second semiconductor film 64b of the driving transistor 64, since the second region 642 is positioned on the second gate electrode 6a side, the second region 642 which is the region in the second semiconductor film 64b including more crystalline silicon is to be the electric current path of the channel, and the driving transistor 64 includes the function corresponding to the thin film transistor including the semiconductor film including crystalline silicon. The driving transistor 64 suitably functions as the thin film transistor to flow electric current in the EL element 8 by control of the switch transistor 54.

As described above, the driving transistor 64 and the switch transistor 54 include different transistor characteristics, and each transistor exhibit each function so that the EL panel 1 can emit light favorably.

The first light blocking film 5e provided in the switch transistor 54 is provided so that the channel region of the first semiconductor film 54b is positioned between the first light blocking film 5e and the first gate electrode 5a. Therefore, the first light blocking film 5e and the first gate electrode 5a can block light such as emitted light of the EL element 8 and it is difficult for such light to reach the channel region of the first semiconductor film 54b.

Similarly, the second light blocking film 6e provided in the driving transistor 64 is provided so that the channel region of the second semiconductor film 64b is positioned between the second light blocking film 6e and the second gate electrode 6a. Therefore, the second light blocking film 6e and the second gate electrode 6a can block light such as emitted light of the EL element 8 and it is difficult for such light to reach the channel region of the second semiconductor film 64b.

As a result, a leak current hardly occurs in the switch transistor 54 and the driving transistor 64, and the transistor characteristic becomes stable. Therefore, the switch transistor 54 and the driving transistor 64 can function preferably.

Moreover, the first light blocking film 5e is connected to the ground line 33 and set to the ground potential and the first light blocking film 5e and the first gate electrode 5a can block an unnecessary electric field which occurs toward the channel region of the first semiconductor film 54b by an element outside the switch transistor 54 so that an electric field shield effect can be obtained. Therefore, the switch transistor 54 can operate normally with a suitable voltage between the first gate electrode 5a and the source electrode 5i and a voltage between the drain electrode 5h and the source electrode 5i. Similarly, the second light blocking film 6e is connected to the ground line 33 and is set to ground potential and the second light blocking film 6e and the second gate electrode 6a can block an unnecessary electric field which occurs toward the channel region of the second semiconductor film 64b by an element outside the driving transistor 64 so that an electric field shield effect can be obtained. Therefore, the driving transistor 64 can operate normally with a suitable voltage between the second gate electrode 6a and the source electrode 6i and a voltage between the drain electrode 6h and the source electrode 6i. Specifically, the change of the driving electric current of the driving transistor 64 can be suppressed. Therefore, the function of the driving transistor 64 can be preferably maintained, and the EL element 8 can emit light preferably.

In the above configuration, the configuration includes a ground line 33 set at ground potential and the first light blocking film 5e and the second light blocking film 6e are connected to the ground line 33 and set at ground potential, however, the configuration is not limited to the above. The configuration can be without the ground line 33 and the first light blocking film 5e and the second light blocking film 6e do not have to be connected to any component. In this case, the above electric field shield effect cannot be obtained, however, the above light blocking effect can be similarly obtained.

The switch transistor 54 and the driving transistor 64 are thin film transistors of the inversely staggered structured channel etching type, and the transistors include a structure which does not include a channel protecting film to protect the channels of the first semiconductor film 54b and the second semiconductor film 64b. Therefore, compared to the thin film transistor which is a type including the channel protecting film, the step to form the channel protecting film can be omitted. Consequently, the number of steps of manufacturing is reduced and the manufacturing cost can be reduced.

Since the driving transistor 64 is a top gate structure, and is a structure in which the source electrode 6i and the drain electrode 6h are below the second gate electrode 6a, the electric field from the second gate electrode 6a may be cut by the source electrode 6i and the drain electrode 6h. However, since the driving transistor 64 of the fourth embodiment is a thin film transistor of the channel etching type, the electric current path between the source electrode 6i and the drain electrode 6h is the second region 642 corresponding to the recessed section 6c of the second semiconductor film 64b and is on the interface side between the second insulating film 12 of the second region 642 and does not flow below the source electrode 6i and the drain electrode 6h. In other words, the electric field from the second gate electrode 6a is cut by the source electrode 6i and the drain electrode 6h and the channel does not occur below the source electrode 6i and the drain electrode 6h. Even if the channel does not occur below the source electrode 6i and the drain electrode 6h, the electric current path between the source electrode 6i and the drain electrode 6h is stable at the recessed section 6c portion of the second semiconductor film 64b and the on current does not decrease.

Therefore, the driving current of the driving transistor 64 becomes stable and the driving transistor 64 functions suitably. Consequently, the EL element 8 can be driven to emit light preferably.

The EL panel 1 formed and manufactured as described above is used as a display panel in various electronic devices.

Figure 58:
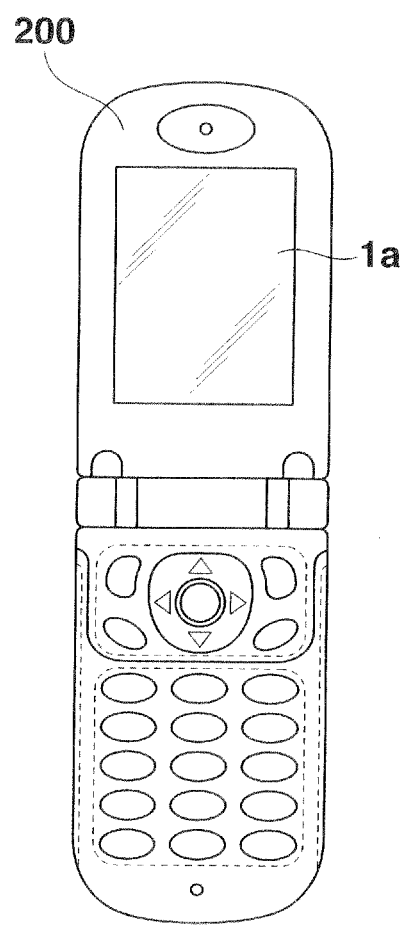
FIG. 58 is a front view showing an example of a cellular phone employing an EL panel as a display panel.
Figure 59A:
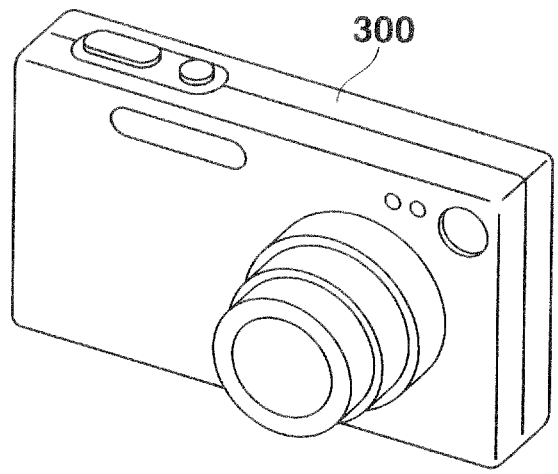
FIG. 59A is a front perspective view showing an example of a digital camera employing an EL panel as a display panel.
Figure 59B:
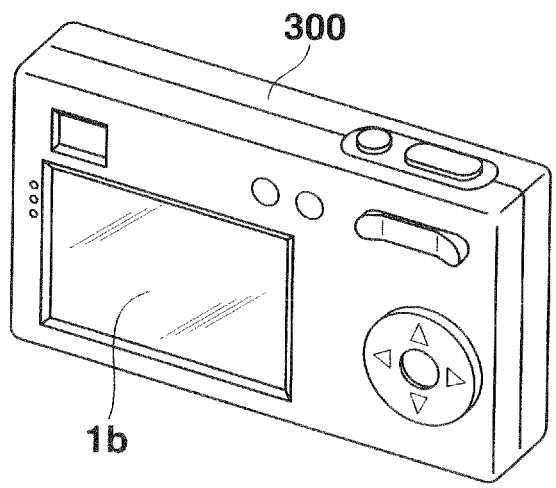
FIG. 59B is a rear perspective view showing an example of a digital camera employing an EL panel as a display panel.
Figure 60:
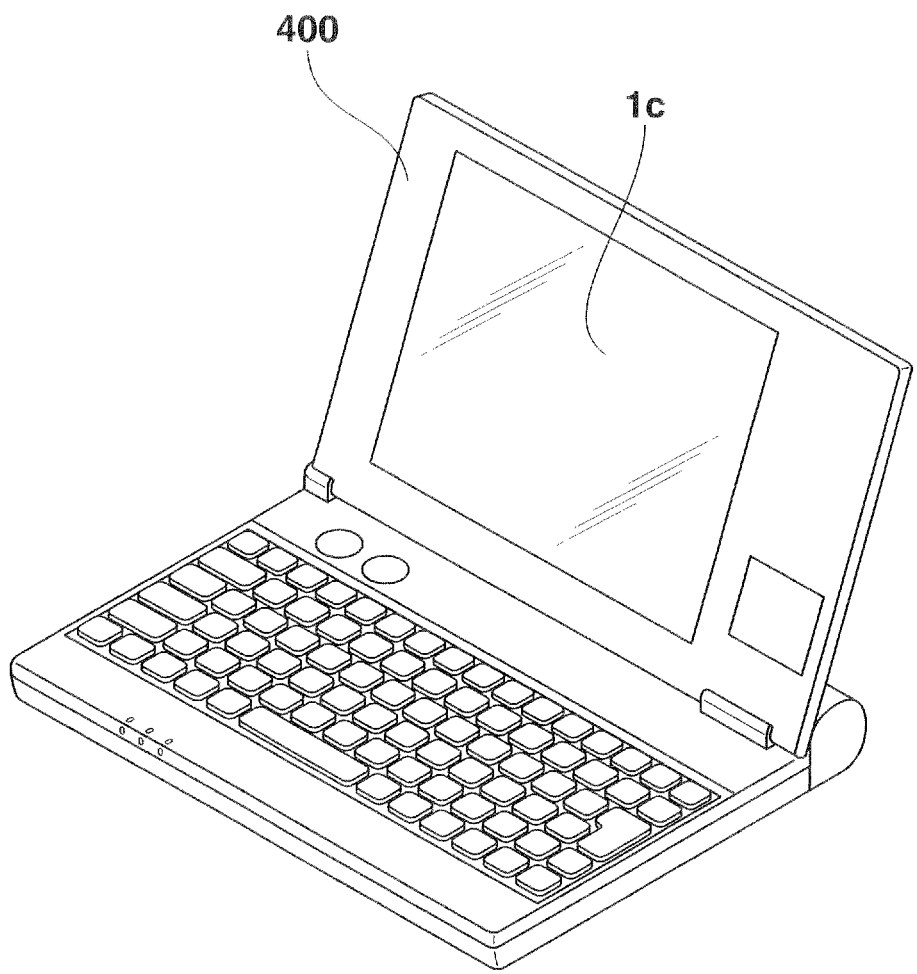
FIG. 60 is a perspective view showing an example of a personal computer employing an EL panel as a display panel.

For example, the EL panel 1 can be used in a display panel 1a of a cellular phone 200 shown in FIG. 58, a display panel 1b of a digital camera 300 shown in FIG. 59A and FIG. 59B and a display panel 1c of a personal computer 400 shown in FIG. 60.

The embodiment of the present invention is not limited to the above and suitable modifications can be made within the scope of the present invention.

Figure 62:
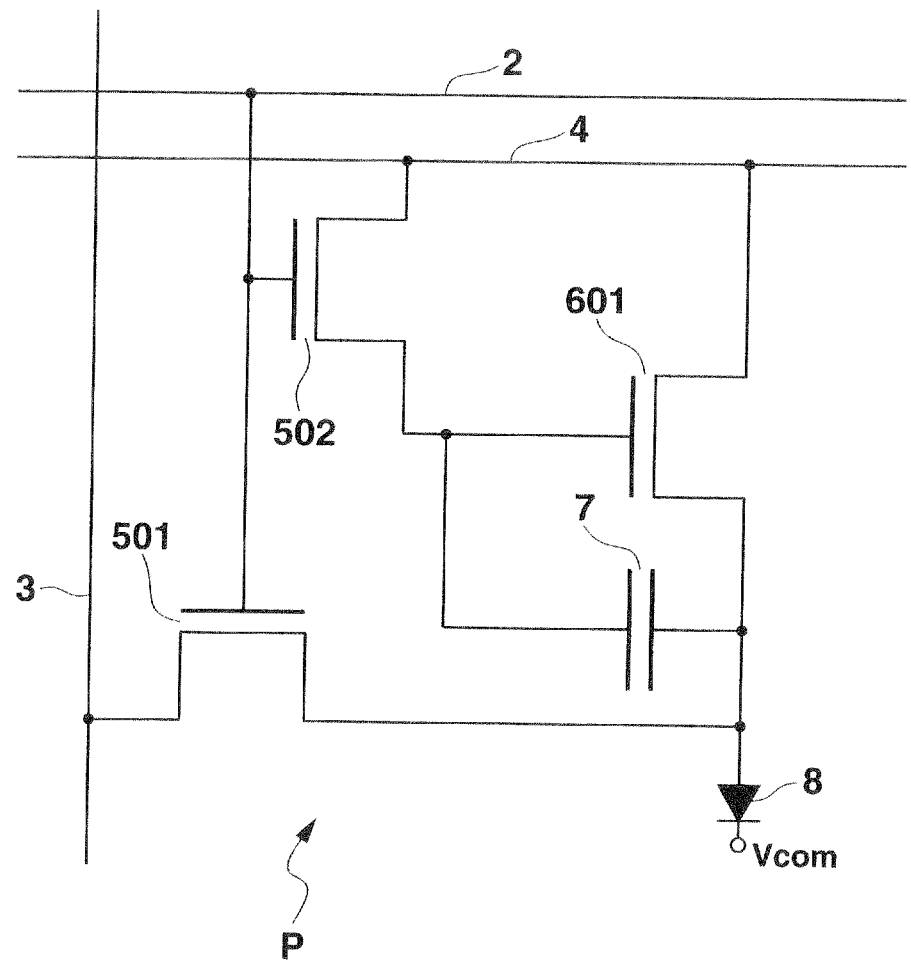
FIG. 62 is a circuit diagram showing another circuit corresponding to one pixel of an EL panel.

In the embodiments described above, each pixel includes two transistors which are the switch transistor and the driving transistor, however, the embodiment is not limited to this, and for example can be a transistor structure as shown in FIG. 62.

In this case, the switch transistor 501 and the switch transistor 502 can be the same structure as the above described switch transistors 51, 52, 53 or 54 and the driving transistor 601 can be the same structure as the above described driving transistors 61, 62, 63 or 64.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transistor structure comprising:
   a first thin film transistor including:
      a first gate electrode;
      a first insulating film which covers the first gate electrode;
      a first semiconductor film which is provided in a position on the first insulating film corresponding to the first gate electrode;
      a second insulating film which covers the first semiconductor film; and
      a first light blocking film which is provided in a position on the second insulating film corresponding to the first semiconductor film, and
   a second thin film transistor including:
      a second semiconductor film which is provided on the first insulating film; the second insulating film which covers the second semiconductor film;
      a second gate electrode which is provided in a position on the second insulating film corresponding to the second semiconductor film; and
      a second light blocking film which is provided in a position below the first insulating film corresponding to the second semiconductor film,
   wherein:
      the first semiconductor film and the second semiconductor film include a first region and a second region along a thickness direction from a side of the first insulating film, and a degree of crystallization of silicon of one of the first region and the second region is higher than a degree of crystallization of silicon of the other of the first region and the second region;
      in the first thin film transistor, the first region in the first semiconductor film constitutes an electric current path of the first semiconductor film; and
      in the second thin film transistor, the second region in the second semiconductor film constitutes an electric current path of the second semiconductor film.

2. The transistor structure according to claim 1, wherein in the first semiconductor film and the second semiconductor film, the other of the first region and the second region has a higher rate of an amorphous silicon region compared to said one of the first region and the second region.

3. The transistor structure according to claim 1, wherein:
   a recessed section is provided in at least a portion of a region on an upper surface of the first semiconductor film corresponding to the first gate electrode;
   a recessed section is provided in at least a portion of a region on an upper surface of the second semiconductor film corresponding to the second gate electrode;

the first thin film transistor includes a first source electrode and a first drain electrode provided in at least a portion of a region except the recessed section of the first semiconductor film through an impurity semiconductor film; and the second thin film transistor includes a second source electrode and a second drain electrode provided in at least a portion of a region except the recessed section of the second semiconductor film through an impurity semiconductor film.

4. The transistor structure according to claim 3, wherein the recessed section is provided in the second region of the first semiconductor film and the second semiconductor film.

5. The transistor structure according to claim 1, wherein the first light blocking film and the second light blocking film are formed from a conductive material and are electrically connected to a ground line set to ground potential.

6. A light emitting apparatus comprising:
a light emitting element; and
a transistor structure including:
  a first thin film transistor including:
    a first gate electrode;
    a first insulating film which covers the first gate electrode;
    a first semiconductor film which is provided in a position on the first insulating film corresponding to the first gate electrode;
    a second insulating film which covers the first semiconductor film; and
    a first light blocking film which is provided in a position on the second insulating film corresponding to the first semiconductor film, and
  a second thin film transistor including:
    a second semiconductor film which is provided on the first insulating film;
    the second insulating film which covers the second semiconductor film;
    a second gate electrode which is provided in a position on the second insulating film corresponding to the second semiconductor film; and
    a second light blocking film which is provided in a position below the first insulating film corresponding to the second semiconductor film,
wherein:
  emission of light of the light emitting element is controlled by the first thin film transistor and the second thin film transistor;
  the first semiconductor film and the second semiconductor film include a first region and a second region along a thickness direction from a side of the first insulating film, and a degree of crystallization of silicon of one of the first region and the second region is higher than a degree of crystallization of silicon of the other of the first region and the second region;
  in the first thin film transistor, the first region in the first semiconductor film constitutes an electric current path of the first semiconductor film; and
  in the second thin film transistor, the second region in the second semiconductor film constitutes an electric current path of the second semiconductor film.

7. The light emitting apparatus according to claim 6, wherein in the first semiconductor film and the second semiconductor film, the other of the first region and the second region has a higher rate of an amorphous silicon region compared to said one of the first region and the second region.

8. The light emitting apparatus according to claim 6, wherein:

the degree of crystallization of silicon in the first region is higher than the degree of crystallization of silicon in the second region;

the second thin film transistor functions as a switch transistor which controls transmission of a signal to the first thin film transistor; and the first thin film transistor functions as a driving transistor which flows an electric current to the light emitting element, the electric current being based on a signal transmitted through the second thin film transistor.

9. The light emitting apparatus according to claim 6, wherein:

the degree of crystallization of silicon in the second region is higher than the degree of crystallization of silicon in the first region;

the first thin film transistor functions as a switch transistor which controls transmission of a signal to the second thin film transistor; and the second thin film transistor functions as a driving transistor which flows an electric current to the light emitting element, the electric current being based on a signal transmitted through the first thin film transistor.

10. The light emitting apparatus according to claim 6, further comprising:
a voltage supplying line connected to at least one of the first thin film transistor and the second thin film transistor; and
a conducting layer provided on the voltage supplying line electrically connected to the voltage supplying line and formed from same material as the second gate electrode.

11. The light emitting apparatus according to claim 6, wherein:
a recessed section is provided in at least a portion of a region on an upper surface of the first semiconductor film corresponding to the first gate electrode;
a recessed section is provided in at least a portion of a region on an upper surface of the second semiconductor film corresponding to the second gate electrode;
the first thin film transistor includes a first source electrode and a first drain electrode provided in at least a portion of a region except the recessed section of the first semiconductor film through an impurity semiconductor film; and
the second thin film transistor includes a second source electrode and a second drain electrode provided in at least a portion of a region except the recessed section of the second semiconductor film through an impurity semiconductor film.

12. The light emitting apparatus according to claim 11, wherein the recessed section is provided in the second region of the first semiconductor film and the second semiconductor film.

13. The light emitting apparatus according to claim 6, wherein the first light blocking film and the second light blocking film are formed from a conductive material and are electrically connected to a ground line set to ground potential.

14. A transistor structure comprising:
a first thin film transistor including:
  a first gate electrode;
  a first insulating film which covers the first gate electrode;
  a first semiconductor film which is provided in a position on the first insulating film corresponding to the first gate electrode;
  a second insulating film which covers the first semiconductor film; and a first light blocking film which is provided in a position on the second insulating film corresponding to the first semiconductor film, and a second thin film transistor including:
- a second semiconductor film which is provided on the first insulating film;
- the second insulating film which covers the second semiconductor film;
- a second gate electrode which is provided in a position on the second insulating film corresponding to the second semiconductor film; and
- a second light blocking film which is provided in a position below the first insulating film corresponding to the second semiconductor film, wherein:
- the first semiconductor film and the second semiconductor film include a first region and a second region along a thickness direction from a side of the first insulating film, and a degree of crystallization of silicon of one of the first region and the second region is higher than a degree of crystallization of silicon of the other of the first region and the second region, and
- the first light blocking film and the second light blocking film are formed from a conductive material and are electrically connected to a ground line set to ground potential.

15. A light emitting apparatus comprising:
a light emitting element; and
a transistor structure including:
- a first thin film transistor including:
  - a first gate electrode;
  - a first insulating film which covers the first gate electrode;
  - a first semiconductor film which is provided in a position on the first insulating film corresponding to the first gate electrode;
  - a second insulating film which covers the first semiconductor film; and
  - a first light blocking film which is provided in a position on the second insulating film corresponding to the first semiconductor film, and
- a second thin film transistor including:
  - a second semiconductor film which is provided on the first insulating film;
  - the second insulating film which covers the second semiconductor film;
  - a second gate electrode which is provided in a position on the second insulating film corresponding to the second semiconductor film; and
  - a second light blocking film which is provided in a position below the first insulating film corresponding to the second semiconductor film, wherein:
- emission of light of the light emitting element is controlled by the first thin film transistor and the second thin film transistor;
- the first semiconductor film and the second semiconductor film include a first region and a second region along a thickness direction from a side of the first insulating film, and a degree of crystallization of silicon of one of the first region and the second region is higher than a degree of crystallization of silicon of the other of the first region and the second region; and
- the first light blocking film and the second light blocking film are formed from a conductive material and are electrically connected to a ground line set to ground potential.

* * * * *